(12) United States Patent
Shiraishi et al.

(10) Patent No.: US 7,659,747 B2
(45) Date of Patent: Feb. 9, 2010

(54) TRANSMISSION DEVICE

(75) Inventors: Hiroshi Shiraishi, Kawasaki (JP);
Tetsuya Hayashi, Kawasaki (JP);
Tomokazu Higuchi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/178,219

(22) Filed: Jul. 23, 2008

(65) Prior Publication Data
US 2009/0033367 A1 Feb. 5, 2009

(30) Foreign Application Priority Data
Jul. 31, 2007 (JP) .............................. 2007-199255

(51) Int. Cl.
*H03K 19/094* (2006.01)
(52) U.S. Cl. .......................................... 326/83; 326/27
(58) Field of Classification Search ................... 326/21, 326/26, 27, 82–87
See application file for complete search history.

(56) References Cited

U.S. PATENT DOCUMENTS 6,294,932 B1 * 9/2001 Watarai .................... 326/83
7,071,739 B1 * 7/2006 Duzevik et al. ............ 327/108
7,227,410 B2 * 6/2007 Nagano et al. ............. 330/251
2007/0279105 A1 * 12/2007 Sunairi ..................... 327/108

FOREIGN PATENT DOCUMENTS

| JP | 2000-022516 A | 1/2000 |
| JP | 2004-253859 A | 9/2004 |
| JP | 2007-036848 A | 2/2007 |

OTHER PUBLICATIONS

LVDS Owner's Manual—3rd Edition, National Semiconductor, <URL: http://www.national.com/appinfo/lvds/0,1798,100,00.html>.

* cited by examiner

*Primary Examiner*—Don P Le
(74) *Attorney, Agent, or Firm*—Arent Fox LLP

(57) ABSTRACT

A transmission device including: a driver unit which generates an output signal having an amplitude by a resistance division of a power-supply voltage; and an output-amplitude correction unit which generates current according to variation in the power-supply voltage, and corrects the amplitude by using the current.

16 Claims, 31 Drawing Sheets

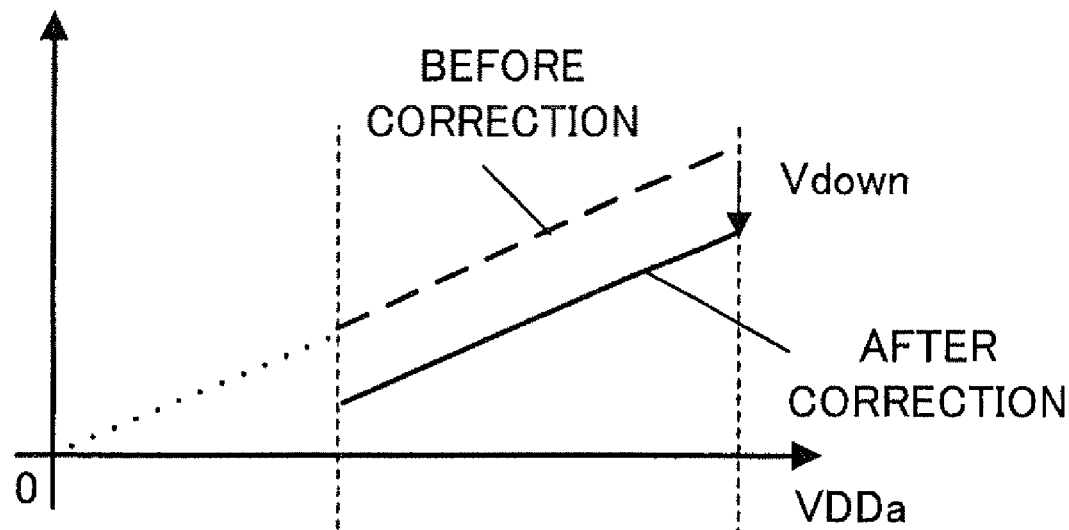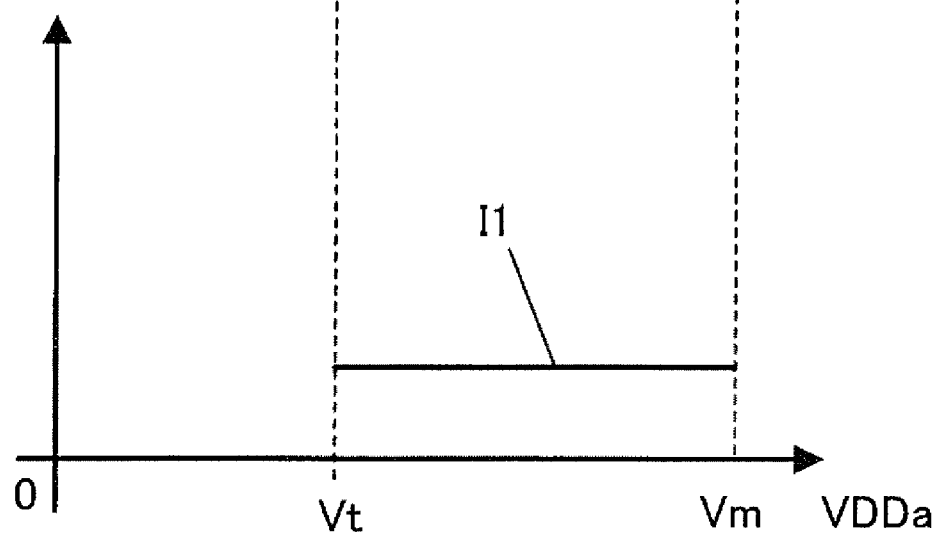
FIG. 10

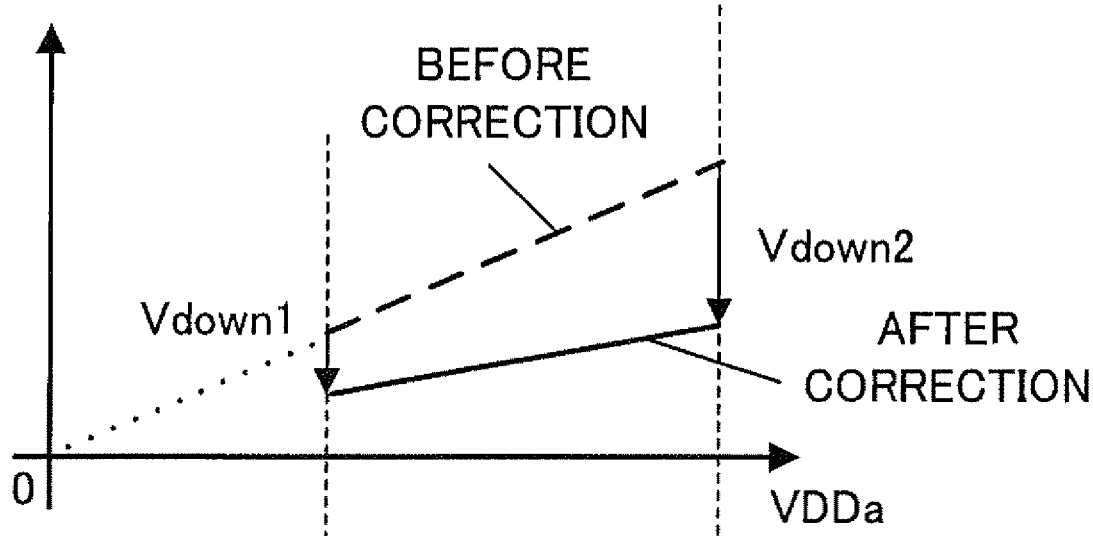
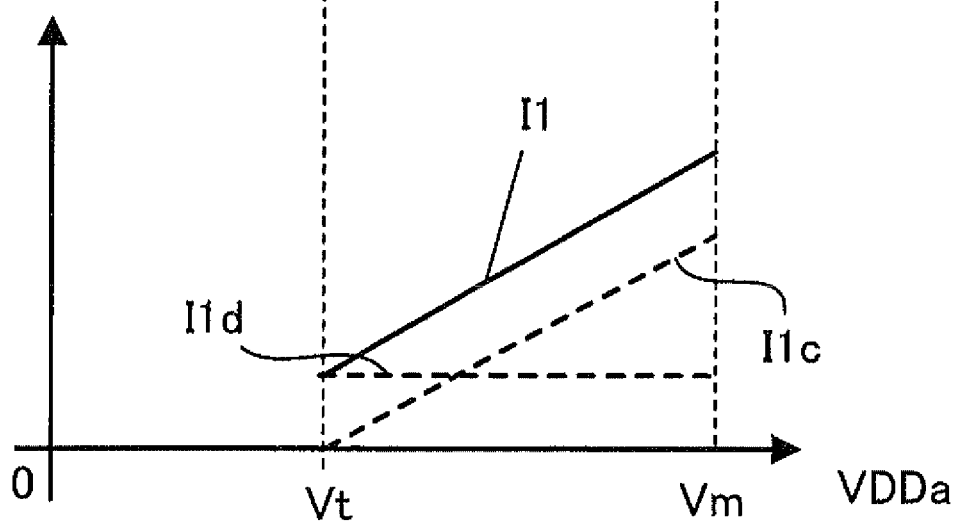
FIG. 11

TRANSMISSION DEVICE

CROSS-REFERENCE TO RELATED APPLICATIONS

This application is based upon and claims the benefits of priority from the prior Japanese Patent Application No. 2007-199255, filed on Jul. 31, 2007, the entire contents of which are incorporated herein by reference.

BACKGROUND

1. Field

The present application relates to a transmission device, and in particular, to a transmission device which is used in a high-speed serial interface using differential signals.

2. Description of the Related Art

Recently, high-speed serial interfaces realizing transmission rates exceeding 1 Gbps have come into widespread use in, for example, data transfer between LSIs (large scale integrated circuits). Such high-speed serial interfaces include the interfaces in accordance with Serial ATA, PCI Express, 10 Gbit-Ethernet, and the like, where ATA stands for advanced technology attachment, PCI stands for peripheral component interconnect, and Ethernet is a registered trade mark of Xerox Corporation. (See, for example, Japanese Unexamined Patent Publication No. 2007-36848.) In order to maintain the waveshape quality in high-speed data signals transferred at high transmission rates as above, various values are specified in various standards for the variations in amplitudes and the common-mode voltage (i.e., the median voltage between the H (high) level signal and the L (low) level signal), the return loss, and the like. (See, for example, National Semiconductor, "LVDS Owner's Manual, Third Edition," available online at the URL, http://www.national.com/appinfo/lvds/0,1798,100,00.html (accessed Jun. 26, 2007))

FIG. 29 is a diagram illustrating circuit constructions of a conventional transmission device 800a and a conventional reception device 900 which receives a differential signal outputted from the conventional transmission device 800a. The transmission device 800a comprises driver circuits 810 and 820. The driver circuit 810 is constituted by p-channel MOSFETs (metallic oxide semiconductor field effect transistors) 811 and 812, n-channel MOSFETs 813 and 814, and resistors Ra1, Ra2, Rb, and Rc. (Hereinafter, the p-channel MOSFETs are referred to as pMOSs, and the n-channel MOSFETs are referred to as nMOSs.)

An input signal IPX is applied to the gate of the pMOS 811, and the power-supply voltage VDDa is applied to the source of the pMOS 811 through the resistor Ra1. The drain of the pMOS 811 is connected to the drain of the nMOS 813. An input signal IP is applied to the gate of the nMOS 813, and the source of the nMOS 813 is grounded through the resistor Ra2. An input signal PD is applied to the gate of the PMOS 812, and the power-supply voltage VDDa is applied to the source of the PMOS 812 through the resistor Rb. The drain of the pMOS 812 is connected to the drain of the nMOS 814. An input signal PDX is applied to the gate of the nMOS 814, and the source of the nMOS 814 is grounded through the resistor Rc. The node between the drains of the pMOS 811 and the nMOS 813 is connected to the node between the drains of the pMOS 812 and the nMOS 814. (These nodes are indicated by filled circles in FIG. 29.) The output signal TXOP of the driver circuit 810 is outputted from the above nodes.

The driver circuit 820 has a similar circuit construction to the driver circuit 810 except that the input signals INX and IN respectively replace the input signals IPX and IP, and the output signal TXON replaces the output signal TXOP.

The reception device 900 is constituted by AC-coupling capacitors Ca1 and Ca2 and the resistors Rf1 and Rf2. The output signal TXOP of the driver circuit 810 is inputted into a terminal of the AC-coupling capacitor Ca1, and the output signal TXON of the driver circuit 820 is inputted into a terminal of the AC-coupling capacitor Ca2. The other terminals of the AC-coupling capacitors Ca1 and Ca2 are connected to each other through the resistors Rf1 and Rf2. In addition, a center-tap voltage VDDb is applied to the node between the resistors Rf1 and Rf2 (which are connected in series).

The pair of the input signals IPX and IP inputted into the driver circuit 810 and the pair of the input signals INX and IN inputted into the driver circuit 820 constitute a differential input signal. The two input signals inputted into each of the driver circuits 810 and 820 are identical logic signals. For example, during normal operation, when the input signals IP and IPX are at the H (high) level, the input signals IN and INX are at the L (low) level. When the input signals IP and IPX rise to the H (high) level and the input signals IN and INX fall to the L (low) level during normal operation, the pMOS 811 is turned off and the nMOS 813 is turned on in the driver circuit 810, so that the output signal TXOP of the driver circuit 810 falls to the L level. Similarly, the output signal TXON of the driver circuit 820 rises to the H level. Thus, each of the driver circuits 810 and 820 behaves as an inverter.

When the input signal PD is set at the L level and the input signal PDX is set at the H level in order to generate the common-mode voltage, both of the pMOS 812 and the nMOS 814 are turned on. At this time, the level of the output signal TXOP becomes equal to the voltage determined by resistance division of the power-supply voltage VDDa.

During power down, the input signals IP, IPX, IN, INX, PD, and PDX are held at such voltage levels as to turn off all of the pMOSs 811 and 812 and the nMOSs 813 and 814 in the driver circuits 810 and 820 and minimize the power consumption.

In addition, when the pMOS 811 and the nMOS 813 in the first stage are turned off and the pMOS 812 and the nMOS 814 in the second stage are turned on, the driver circuits 810 and 820 output the output signals TXOP and TXON at the common-mode voltage. At this time, the driver circuits 810 and 820 is in the "electrical idle" state specified by PCI Express.

The amplitudes of the output signals TXOP and TXON during normal operation and the common-mode voltage are determined according to the power-supply voltage VDDa and the magnitudes of resistance of the resistors Ra1, Ra2, Rb, Rc, Rf1, and Rf2. In order to satisfy the requirements for the return loss specified by the standards, for example, it is necessary to satisfy the equations, $1/50=1/Rf=1/Ra+1/Rb+1/Rc$ in the case where the magnitudes of resistance of the resistors Rf1 and Rf2 are 50 ohm and represented by Rf, the magnitudes of resistance of the resistors Ra1 and Ra2 are identical and represented by Ra, and the magnitudes of resistance of the resistors Rb and Rc are respectively represented by Rb and Rc. At this time, it is further necessary that the values Ra, Rb, and Rc include the on-resistance of the pMOSs 811 and 812 and the nMOSs 813 and 814.

The center-tap voltage VDDb in the reception device 900 may be 0 V. In addition, the AC-coupling capacitors Ca1 and Ca2 may be dispensed with so as to realize DC coupling, instead of the AC coupling. Further, it is possible to realize the pre-emphasis and the de-emphasis specified by PCI Express, by further arranging an output-stage circuit constituted by resistors and switchs realized by a pMOS, an nMOS as illustrated in FIG. 29.

The transmission device 800a, which realizes necessary magnitudes of current by resistance division as explained above, has the following advantages (1) to (5).

(1) The output amplitudes (i.e., the amplitudes of the output signals TXOP and TXON) are determined by the power-supply voltage VDDa and the magnitudes of resistance of the resistors Ra1, Ra2, Rb, Rc, Rf1, and Rf2. Since the resistors are passive elements, the variations in the power-supply voltage are directly reflected in the variations in the output amplitudes, and the output characteristics are expressed by a straight line passing through the point at which the power-supply voltage VDD a is 0 V and the output amplitude is 0 V. Therefore, it is easy to obtain the output amplitudes and the common-mode voltage at desired levels.

(2) The output amplitudes and the common-mode voltage are approximately identical under an identical design condition and an identical measurement condition.

(3) The rising time and the falling time of the output signals TXOP and TXON are small.

(4) The transmission device 800a exhibits superior return-loss characteristics, so that it is easy to realize desired return loss.

(5) The power consumption is low, since current flows basically only to the receiver side except that current flows from the power supply VDDa to the ground through the resistors arranged for determining the common-mode voltage.

Although the necessary current is obtained by the resistance division in the transmission device 800a, another transmission device using one or more current sources is also known.

FIG. 30 is a diagram illustrating a circuit construction of another conventional transmission device 800b together with the conventional reception device 900, which receives a differential signal outputted from the conventional transmission device 800b. The reception device 900 in FIG. 30 has the same circuit construction as the reception device 900 in FIG. 29. The transmission device 800b is constituted by current sources 830 and 831, pMOSs 832 and 833, nMOSs 834 and 835, and resistors Rd1 and Rd2.

The current source 830 receives a power-supply voltage VDDa at an input terminal, and supplies current Ia to the sources of the pMOSs 832 and 833. An input signal IPX is applied to the gate of the pMOS 832, and the drain of the pMOS 832 is connected to the drain of the nMOS 834. In addition, an input signal INX is applied to the gate of the pMOS 833, and the drain of the pMOS 833 is connected to the drain of the nMOS 835. The sources of the nMOSs 834 and 835 are connected to a terminal of another current source 831, the other terminal of which is grounded. Further, the node between the drains of the pMOS 832 and the nMOS 834 is connected to the node between the drains of the pMOS 833 and nMOS 835 through a series connection of the resistors Rd1 and Rd2. In order to generate the common-mode voltage, half of the power-supply voltage VDDa (VDDa/2) is applied to the node between the resistors Rd1 and Rd2. The differential output signal having the two components TXOP and TXON can be obtained from both ends of the series connection of the resistors Rd1 and Rd2.

During normal operation, the input signals IP and IPX and the input signals IN and INX constitute a differential input signal, and the output signals TXOP and TXON invert, so that the transmission device 800b behaves as an inverter.

During power down, the input signals IP, IPX, IN, INX, PD, and PDX are at such voltage levels as to turn off all of the pMOSs 832 and 833 and the nMOSs 834 and 835 in the transmission device 800b and minimize the power consumption.

Although a terminal the voltage of which is fixed at the common-mode voltage is generated by using half of the power-supply voltage VDDa, there are other techniques for generating the common-mode voltage by using resistance division, amplifiers, feedback circuits, and the like.

The amplitudes of the output signals TXOP and TXON during normal operation and the common-mode voltage are depend on the current Ia of the current sources 830 and 831, the resistors Rd1, Rd2, Rf1, and Rf2, and the manner of generation of the common-mode voltage. The output impedances of the current sources 830 and 831 per se are basically infinite (very high). Therefore, in order to satisfy the standardized requirements for the return loss, for example, it is necessary that the magnitudes of resistance of the resistors Rd1 and Rd2 be 50 ohm when the magnitudes of resistance of the resistors Rf1 and Rf2 are 50 ohm.

Since the magnitude of the current flowing from the current source 830 through the series connection of the resistors Rd1 and Rd2 to the current source 831 is required to be identical to the magnitude of the current flowing from the current source 830 through the series connection of the resistors Rf1 and Rf2 to the current source 831, the magnitude of the current Ia which the current sources 830 and 831 are required to generate is twice the magnitude of the current required to flow through the series connection of the resistors Rf1 and Rf2.

Further, it is possible to realize the pre-emphasis and the de-emphasis specified by PCI Express, by further arranging an output-stage circuit constituted by current sources and switches as the current sources 830 and 831 and the pMOSs 832 and 833 and the nMOSs 834 and 835 illustrated in FIG. 30.

The transmission device 800b, in which the current sources 830 and 831 supply necessary current as explained above, has the following advantages (1') and (2').

(1') Since the current sources 830 and 831 can generate the current Ia which is approximately expected, the variations in the output signals TXOP and TXON caused by the variations in the power-supply voltages, the temperature, and the manufacturing process are small, and it is possible to suppress the variations in the amplitudes of the output signals TXOP and TXON generated under an identical condition, by suppressing the variations in the pMOSs 832 and 833 and the nMOSs 834 and 835.

(2') Since the current sources 830 and 831 can be realized by a current-mirror circuit constituted by a plurality of MOSFETs, and the amplitudes of the output signals TXOP and TXON can be changed by the mirror ratio, it is easy to finely adjust the amplitudes of the output signals TXOP and TXON.

FIG. 31 shows an example of a current mirror circuit used as the current sources 830 and 831. The current mirror circuit of FIG. 31 is constituted by the number m of pMOSs 841-1 to 841-m, the number M of pMOSs 842-1 to 842-M, and a current source 840, which is connected to the drains of the m pMOSs 841-1 to 841-m. All of the pMOSs 841-1 to 841-m and the pMOSs 842-1 to 842-M have identical dimensions. The magnitude of the current outputted from the current source 840 is indicated by Iaa.

In the above current mirror circuit, the magnitude of the current Ia outputted from the drains of the M pMOSs 842-1 to 842-M (i.e., the output of each of the current sources 830 and 831) becomes (M/m)Iaa. In the case where all of the pMOSs 841-1 to 841-m and the pMOSs 842-1 to 842-M have identical dimensions, it is possible to finely adjust the magnitude of the current Ia outputted from the current source of FIG. 30 by changing the mirror ratio M/m, and therefore finely adjust the output signals TXOP and TXON.

However, the conventional transmission devices cannot concurrently satisfy various requirements which are specified by the various standards for maintaining the waveshape quality of high-speed data signals.

For example, the conventional transmission devices in which necessary current is obtained by resistance division as the transmission device 800a of FIG. 29 have the following problems (a) and (b).

(a) The output amplitudes of a transmission device in which necessary current is obtained by the resistance division are determined by the power-supply voltage and the magnitudes of resistance (e.g., the magnitudes of resistance of the resistors Ra1, Ra2, Rb, Rc, Rf1, and Rf2 in the transmission device 800a illustrated in FIG. 29). Since the resistors are passive elements, the variations in the power-supply voltage are directly reflected in the variations in the amplitudes of the output signals of the transmission device. Therefore, in some cases, the variations in the output signals TXOP and TXON do not satisfy the requirements specified by the various standards.

(b) Since the output amplitudes are determined by the power-supply voltage and the magnitudes of resistance, it is difficult to finely adjust the output amplitudes. Although it is necessary to change the magnitudes of resistance in order to adjust the output amplitudes, it is difficult to change the magnitudes of resistance since the terminating resistance is required to be maintained constant in order to satisfy the requirements for the return loss specified by the various standards.

Further, the conventional transmission devices in which necessary current is obtained from one or more current sources as the transmission device 800b of FIG. 30 have the following problems (c), (d), (e), and (f).

(c) Since the amplitudes of the output signals TXOP and TXON and the common-mode voltage are determined by the magnitude of the current outputted from the current sources 830 and 831, the expected amplitudes of the output signals TXOP and TXON in the transmission device 800b cannot be achieved when the current sources 830 and 831 do not supply the expected magnitude of current. In addition, when the magnitudes of current supplied by the current sources 830 and 831 do not approximately match, the common-mode voltage deviates from the voltage VDDa/2.

(d) When the dimensions of the current source increase, the capacitance increases, so that the rising time and the falling time of the output signals TXOP and TXON increase.

(e) It is difficult to satisfy the requirements for the return loss specified by the various standards. Although the output impedances of ideal current sources are infinite, the output impedances of the practical current sources are several kiloohm. In addition, the capacitance of a current source increases with the dimensions of the current source. Therefore, in the high-frequency range, the transmitter impedance decreases, so that the return loss deteriorates.

(f) The transmission device 800b has the resistors Rd1 and Rd2 for satisfying the requirements specified by the various standards. However, since it is necessary that the magnitude of the current flowing through the series connection of the resistors Rd1 and Rd2 be identical to the magnitude of the current flowing through the series connection of the resistors Rf1 and Rf2, the magnitude of the current Ia which the current sources 830 and 831 are required to generate is twice the magnitude of the current flowing through the series connection of the resistors Rf1 and Rf2. Therefore, it is necessary that the magnitude of the current Ia which the current sources 830 and 831 are required to generate be twice the magnitude of the current flowing through the series connection of the resistors Rf1 and Rf2, so that the current consumption increases. Even in the case where an amplifier or a feedback circuit is added (instead of application of half of the power-supply voltage VDDa to the node between the resistors Rd1 and Rd2 for generation of a terminal the voltage of which is fixed as illustrated in FIG. 30), the consumption current also increases.

SUMMARY

The present application provides that a transmission device including a driver unit which generates an output signal having a first amplitude by a resistance division of a power-supply voltage, and an output-amplitude correction unit which generates first current according to variation in the power-supply voltage, and corrects the first amplitude by using the first current.

BRIEF DESCRIPTION OF THE DRAWINGS

FIG. 10 is a diagram indicating an example of a characteristic, with respect to the power-supply voltage, of correction current generated by the current-adaptation circuit and the current sources in the second embodiment for finely adjusting output amplitudes, and an example of an output amplitude of the transmission device before and after correction.

FIG. 11 is a diagram indicating an example of a characteristic, with respect to the power-supply voltage, of correction current generated by the current-adaptation circuit and the current sources in the second embodiment for finely adjusting output amplitudes and suppressing variations in the output amplitudes caused by variations in the power-supply voltage, and an example of an output amplitude of the transmission device before and after correction.

DESCRIPTION OF THE PREFERRED EMBODIMENTS

Embodiments will be explained below with reference to the accompanying drawings, wherein like reference numbers refer to like elements throughout.

1. First Embodiment

Figure 1:
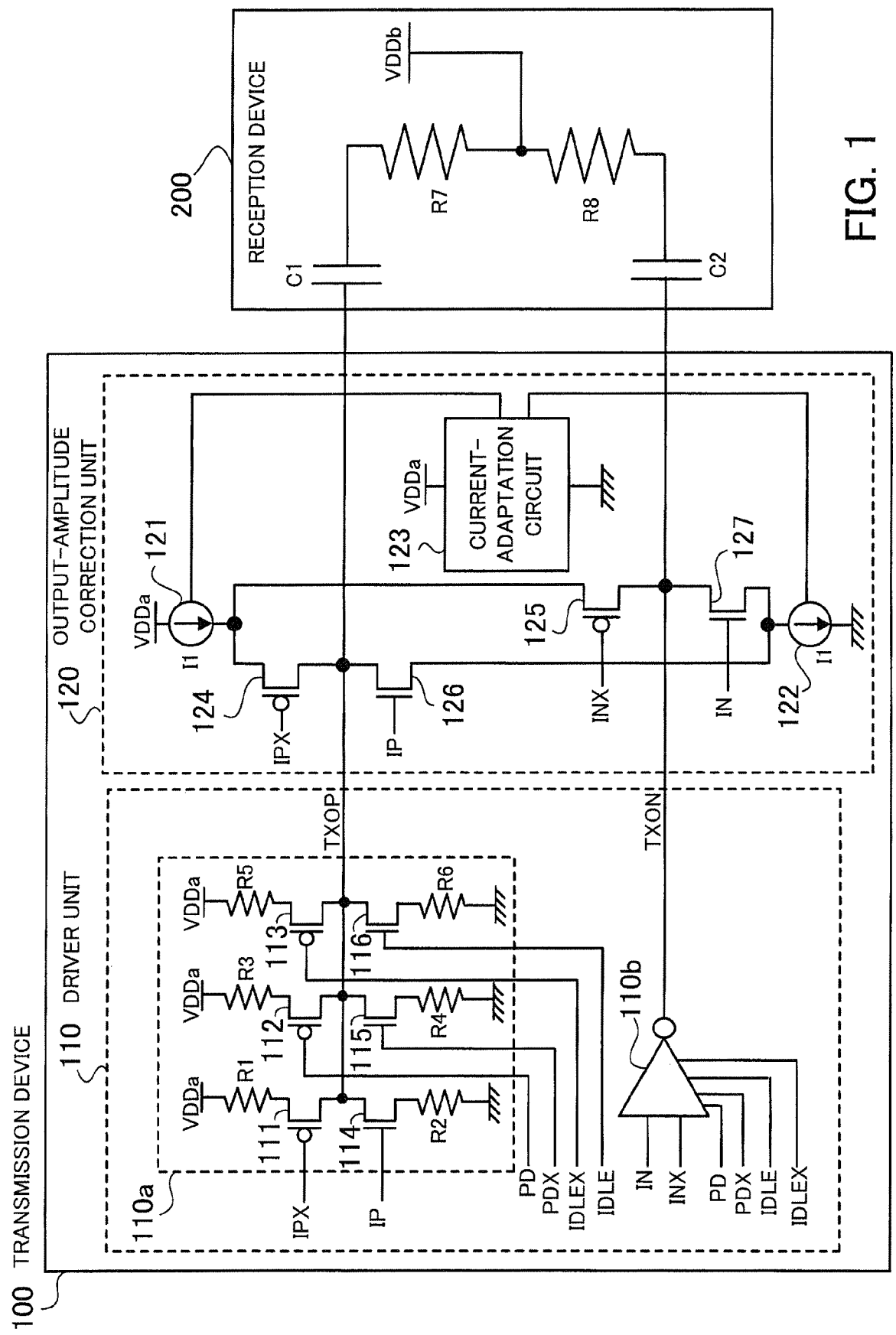
FIG. 1 is a diagram illustrating circuit constructions of a transmission device and a reception device according to a first embodiment.

FIG. 1 is a diagram illustrating circuit constructions of a transmission device and a reception device according to the first embodiment. The transmission device 100 according to the first embodiment comprises a driver unit 110 and an output-amplitude correction unit 120. The driver unit 110 generates output signals TXOP and TXON, and the output-amplitude correction unit 120 corrects the amplitudes of the output signals TXOP and TXON (i.e., the output amplitudes of the driver unit 110).

The driver unit 110 comprises two driver circuits 110a and 110b, makes a resistance division of the power-supply voltage VDDa, and outputs the output signals TXOP and TXON from the driver circuits 110a and 110b, respectively. In FIG. 1, the input signals IP, IPX, IN, and INX are main signals, and the other input signals PD, PDX, IDLE, and IDLEX are signals used for generating a common-mode voltage and an idle voltage by resistance division.

The driver circuit 110a is constituted by pMOSs 111, 112, and 113, nMOSs 114, 115, and 116, and resistors R1, R2, R3, R4, R5, and R6. The input signal IPX is applied to the gate of the pMOS 111, and the power-supply voltage VDDa is applied to the source of the pMOS 111 through the resistor R1. The drain of the pMOS 111 is connected to the drain of the nMOS 114. The input signal IP is applied to the gate of the nMOS 114, and the source of the nMOS 114 is grounded through the resistor R2. The input signal PD is applied to the gate of the PMOS 112, and the power-supply voltage VDDa is applied to the source of the PMOS 112 through the resistor R3. The drain of the pMOS 112 is connected to the drain of the nMOS 115. The input signal PDX is applied to the gate of the nMOS 115, and the source of the nMOS 115 is grounded through the resistor R4. The input signal IDLEX is applied to the gate of the pMOS 113, and the power-supply voltage VDDa is applied to the source of the pMOS 113 through the resistor R5. The drain of the PMOS 113 is connected to the drain of the nMOS 116. The input signal IDLE is applied to the gate of the nMOS 116, and the source of the nMOS 116 is grounded through the resistor R6. The node between the drains of the pMOS 111 and the nMOS 114, the node between the drains of the pMOS 112 and the nMOS 115, and the node between the drains of the pMOS 113 and the nMOS 116 are connected, and the output signal TXOP of the driver circuit 110*a* is outputted from these nodes.

The driver circuit 110*b* has a similar circuit construction to the driver circuit 110*a*. The input signal INX, instead of the input signal IPX, and the input signal IN, instead of the input signal IP, are inputted into the driver circuit 110*b*.

The output-amplitude correction unit 120 has a function of correcting the amplitudes of the output signals TXOP and TXON. The output-amplitude correction unit 120 is constituted by current sources 121 and 122, a current-adaptation circuit 123, pMOSs 124 and 125, and nMOSs 126 and 127. The pMOSs 124 and 125 and nMOSs 126 and 127 have functions of switch circuits which connect or disconnect the current sources 121 and 122 to the signal lines of the output signals TXOP and TXON according to the input signals IP, IPX, IN, and INX.

The current source 121 has a terminal connected to a power-supply terminal, from which the power-supply voltage VDDa is applied to the current source 121. Hereinafter, the power-supply terminal may be referred to as the VDDa terminal. The current source 121 supplies correction current I1 to the sources of the pMOSs 124 and 125. The input signal IPX is applied to the gate of the pMOS 124, and the drain of the pMOS 124 is connected to the drain of the nMOS 126. In addition, the input signal INX is applied to the gate of the pMOS 125, and the drain of the pMOS 125 is connected to the drain of the nMOS 127. The sources of the nMOSs 126 and 127 are connected to a terminal of the other current source 122, the other terminal of which is grounded.

When the pMOS 124 or 125 is on, the correction current I1 supplied from the current source 121 is added to the corresponding one of the output signals TXOP and TXON. On the other hand, when the nMOS 126 or 127 is on, the current source 122 draws the correction current I1 out of the corresponding one of the output signals TXOP and TXON.

In addition, the signal line of the output signal TXOP, which extends from the driver circuit 110*a* to the reception device 200, is connected to the node between the drains of the pMOS 124 and the nMOS 126, so that the output signal TXOP is corrected by using the correction current I1 flowing to the node, and is then outputted to the reception device 200. Similarly, the signal line of the output signal TXON, which extends from the driver circuit 110*b* to the reception device 200, is connected to the node between the drains of the PMOS 125 and the nMOS 127, so that the output signal TXON is corrected by using the correction current I1 flowing to the node, and is then outputted to the reception device 200.

The current-adaptation circuit 123 adapts the correction current I1 generated by the current sources 121 and 122, to the power-supply voltage VDDa. The magnitude of the correction current I1 generated in the output-amplitude correction unit 120 is smaller than the magnitude of the current generated in the driver unit 110, and the output signals TXOP and TXON outputted from the driver unit 110 are corrected by using the correction current I1.

The reception device 200 is constituted by AC-coupling capacitors C1 and C2 and the resistors R7 and R8. The output signal TXOP of the transmission device 100 is inputted into a terminal of the AC-coupling capacitor C1, and the other output signal TXON of the transmission device 100 is inputted into a terminal of the AC-coupling capacitor C2. The other terminals of the AC-coupling capacitors C1 and C2 are connected to each other through the resistors R7 and R8. In addition, the center-tap voltage VDDb is applied to the node between the resistors R7 and R8 (which are connected in series).

The center-tap voltage VDDb in the reception device 200 may be 0 V. In addition, the AC-coupling capacitors C1 and C2 may be dispensed with so as to realize DC coupling, instead of the AC coupling.

The operations of the transmission device 100 according to the first embodiment are explained below.

During normal operation, the pair of the input signals IP and IPX inputted as the main signals into the driver circuit 110*a* and the pair of the input signals IN and INX inputted as the main signals into the driver circuit 110*b* constitute a differential input signal. The input signals IP and IPX inputted into the driver circuit 110*a* are identical logic signals, and the input signals IN and INX inputted into the driver circuit 110*b* are identical logic signals.

For example, when the input signals IP and IPX are at the H level, the input signals IN and INX are at the L level. At this time, in the driver circuit 110*a*, the pMOS 111 is turned off and the nMOS 114 is turned on, so that the output signal TXOP of the driver circuit 110*a* falls to the L level. The output signal TXON is also changed in a similar manner. That is, each of the driver circuits 110*a* and 110*b* outputs the inverted signals of the input signals (i.e., the signals at the different levels from the input signals). Thus, each of the driver circuits 110*a* and 110*b* behaves as an inverter.

In addition, when the common-mode voltage is required to be generated, the input signal PD is set at the L level and the input signal PDX is set at the H level, so that both of the pMOS 112 and the nMOS 115 are turned on. Further, the input signal IDLE is set at the L level and the input signal IDLEX is set at the H level, so that both of the pMOS 113 and the nMOS 116 are turned off.

In the output-amplitude correction unit 120, when the input signals IP and IPX are at the H level, and the input signals IN and INX are at the L level, the pMOS 124 and the nMOS 127 are turned off, and the nMOS 126 and the pMOS 125 are turned on. Therefore, the correction current I1 supplied from the current source 121 flows through the PMOS 125, and the voltage of the output signal TXON, which is at the H level, is further raised. In addition, the correction current I1 drawn by the current source 122 flows through the nMOS 126, and the voltage of the output signal TXOP, which is at the L level, is further lowered. Thus, the amplitudes of the output signals TXOP and TXON are increased.

During normal operation, the amplitudes of the output signals TXOP and TXON and the common-mode voltage are determined by the power-supply voltage VDDa, the magnitudes of resistance of the resistors R1, R2, R3, R4, R7, and R8, and the magnitude of the correction current I1 generated by the current sources 121 and 122. In order to satisfy the requirements for the return loss specified by various standards, for example, it is necessary to satisfy the equations, $1/50=1/R7=1/R8=1/R1+1/R3+1/R4=1/R2+1/R3+1/R4$, in the case where the transmission system of FIG. 1 is a 50 ohm transmission system, the magnitudes of resistance of the resistors R1 and R2 are identical, and the magnitudes of resistance of the resistors R7 and R8 are identical. In the above equations, the magnitudes of resistance of the resistors R1, R2, R3, R4, R7, and R8 are respectively represented by R1, R2, R3, R4, R7, and R8. At this time, it is further necessary that the values R1, R2, R3, and R4 include the on-resistance of the pMOSs 111 and 112 and the nMOSs 114 and 115.

During power down, the input signals IP, IPX, IN, INX, PD, and PDX are at such voltage levels as to turn off all of the pMOSs 111, 112, and 113 and the nMOSs 114, 115, and 116 in the driver circuits 110a and 110b and the pMOSs 124 and 125 and the nMOSs 126 and 127 in the output-amplitude correction unit 120 and minimize the power consumption.

There are two types of IDLE states as indicated below.

In the case where the terminating resistance of 50 ohm is required as in the OOB (out of band) mode in Serial ATA, the input signals IP, IPX, IN, INX, PD, PDX, IDLE, and IDLEX are inputted so as to turn off the PMOS 111, the nMOS 114, the pMOSs 124 and 125, and the nMOSs 126 and 127, and turn on the pMOSs 112 and 113, and the nMOSs 115 and 116. In this case, the common-mode voltage and the consumed current are determined by the power-supply voltage VDDa, the magnitudes of resistance of the resistors R3, R4, R5, and R6. At this time, it is necessary to satisfy the equations, $1/50=1/R7=1/R8=1/R3+1/R4+1/R5+1/R6$, where the magnitudes of resistance of the resistors R5 and R6 are respectively represented by R5 and R6. It is further necessary that the values R3, R4, R5, and R6 include the on-resistance of the pMOSs 112 and 113 and the nMOSs 115 and 116.

In the case where the terminating resistance of 50 ohm is not required as in the electrical idle state according to PCI Express, only the PMOS 113 and the nMOS 116 are turned on. In this case, the common-mode voltage and the consumed current in the idle state are determined by the power-supply voltage VDDa, and the magnitudes of resistance of the resistors R5 and R6.

Figure 2:
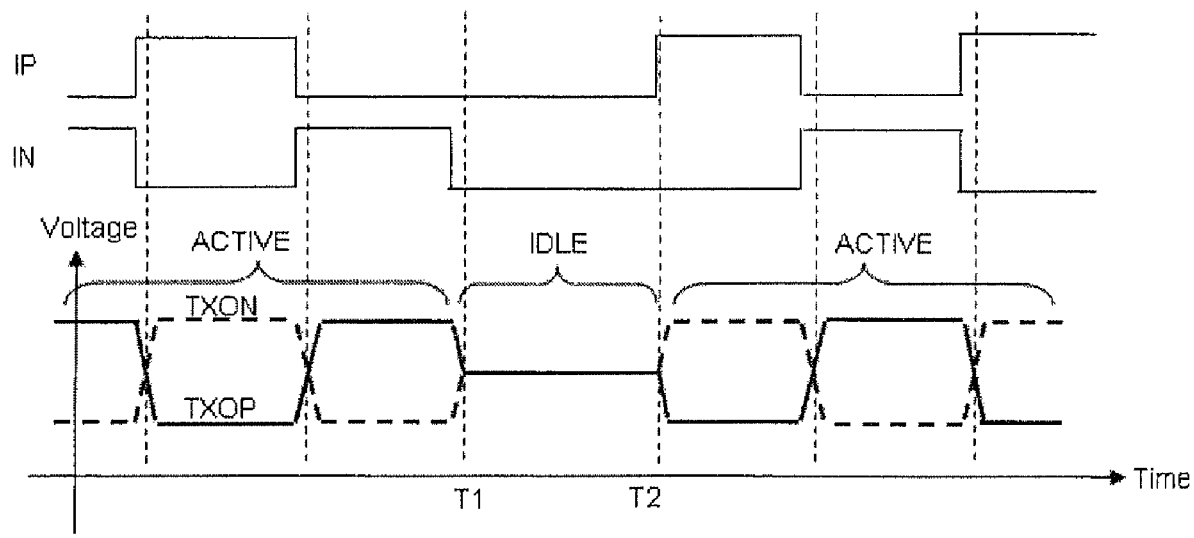
FIG. 2 is a diagram indicating examples of waveshapes in the transmission device according to the first embodiment.

FIG. 2 is a diagram indicating examples of waveshapes of the input signals IP and IN and the output signals TXOP and TXON in the transmission device 100 according to the first embodiment. In FIG. 2, the ordinate corresponds to the voltage, and the abscissa corresponds to the time. The voltage levels of the input signals IP and IN are different in normal operation (indicated by "ACTIVE"). On the other hand, when the voltage levels of the input signals IP and IN are identical in the interval from T1 to T2, the state of the transmission device becomes idle.

As explained before, the output-amplitude correction unit 120 in the transmission device 100 according to the first embodiment has the current-adaptation circuit 123 which adapts the correction current I1 generated by the current sources 121 and 122, to variations in the power-supply voltage VDDa, so that variations in the output signals TXOP and TXON can be corrected.

Figure 3:
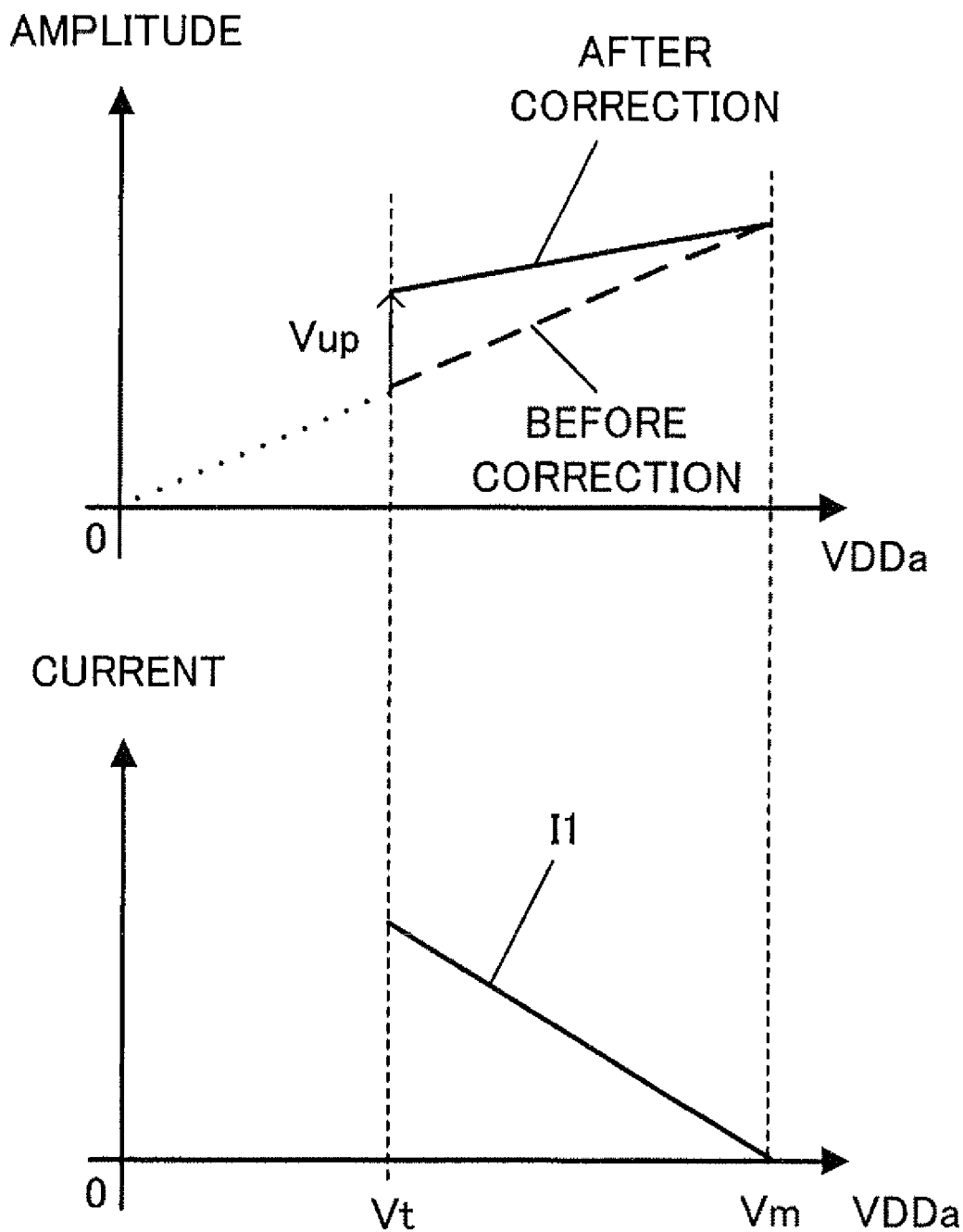
FIG. 3 is a diagram indicating an example of a characteristic, with respect to a power-supply voltage, of correction current generated by a current-adaptation circuit and current sources arranged in the transmission device according to the first embodiment, and an example of an output amplitude of the transmission device before and after correction.

FIG. 3 shows an example of the correction current I1 generated by the current-adaptation circuit 123 in the transmission device 100, and an example of the amplitude of an output signal (representing each of the output signals TXOP and TXON) of the transmission device before and after the correction. The abscissas in the upper and lower parts of FIG. 3 correspond to the power-supply voltage VDDa, and the ordinates in the upper and lower parts of FIG. 3 respectively correspond to the amplitude of the output signal and the magnitude of the correction current I1.

In the lower part of FIG. 3, a relationship between the correction current I1 and the power-supply voltage VDDa in the range from Vt to Vm is indicated. In the example of FIG. 3, the amplitude of each of the output signals TXOP and TXON is corrected by using the correction current I1 in the range of the power-supply voltage VDDa from Vt to Vm.

In the upper part of FIG. 3, the amplitude of the output signal in the range of the power-supply voltage VDDa from Vt to Vm before the correction (i.e., before the output signal in the range of the power-supply voltage VDDa from Vt to Vm is inputted into the output-amplitude correction unit 120) is indicated by the dashed line, and the amplitude of the output signal in the range of the power-supply voltage VDDa from Vt to Vm after the correction (i.e., after the output signal is outputted from the output-amplitude correction unit 120) is indicated by the solid line.

Specifically, in the example indicated in FIG. 3, the current-adaptation circuit 123 is arranged so that the magnitude of the correction current I1 linearly decreases with increase in the power-supply voltage VDDa beyond Vt, and becomes zero when the power-supply voltage VDDa reaches Vm, as indicated in the lower part of FIG. 3. Therefore, as indicated in the upper part of FIG. 3, the amplitude of the output signal is increased in the correction by an amount which decreases with increase in the power-supply voltage VDDa beyond Vt. For example, the amplitude of the output signal is increased by the voltage Vup in the correction when the power-supply voltage VDDa is Vt, and the corrected amplitude of the output signal is identical to the uncorrected amplitude of the output signal when the power-supply voltage VDDa is Vm.

Figure 4:
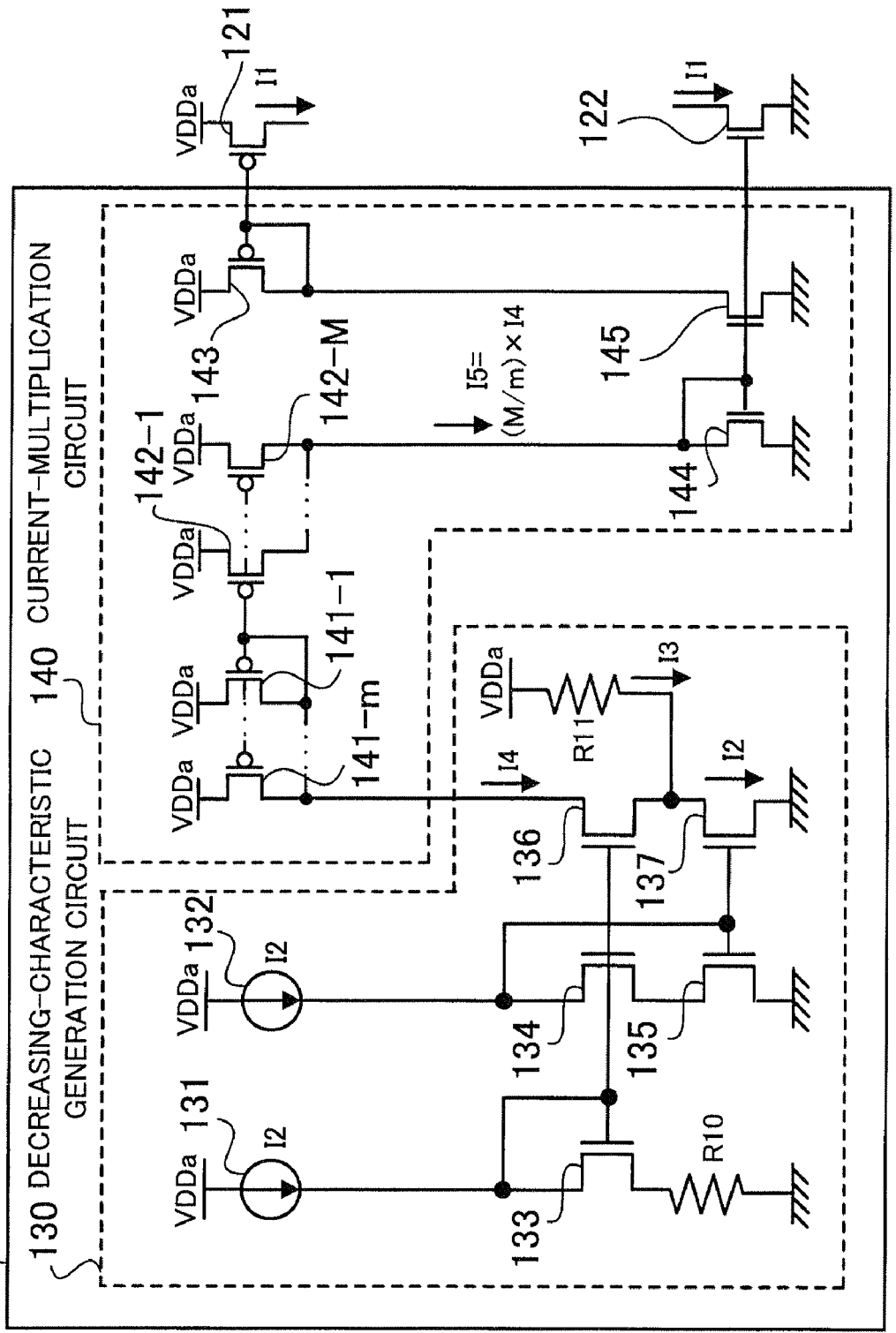
FIG. 4 is a diagram illustrating circuit constructions of examples of the current sources and the current-adaptation circuit in the first embodiment, which reduce the magnitude of the correction current as the power-supply voltage increases.

The correction current I1 having the characteristic as indicated in the lower part of FIG. 3 can be generated by using the current-adaptation circuit 123, for example, when the current-adaptation circuit 123 has the circuit construction illustrated in FIG. 4.

FIG. 4 is a diagram illustrating circuit constructions of examples of the current sources 121 and 122 and the current-adaptation circuit 123 in the transmission device 100 according to the first embodiment, which reduce the magnitude of the correction current I1 as the power-supply voltage increases.

The current-adaptation circuit 123 illustrated in FIG. 4 comprises a decreasing-characteristic generation circuit 130 and a current-multiplication (current-amplification) circuit 140. In the example of FIG. 4, the current sources 121 and 122 are respectively realized by a pMOS and an nMOS.

The decreasing-characteristic generation circuit 130 is constituted by current sources 131 and 132, nMOSs 133, 134, 135, 136, and 137, and resistors R10 and R11.

One terminal of each of the current sources 131 and 132 is connected to a VDDa terminal, and the current sources 131 and 132 supply the current I2 to the drains of the nMOSs 133 and 134, respectively. The gate of the nMOS 133 is connected to the drain of the nMOS 133 and the gates of the nMOSs 134 and 136. The source of the nMOS 133 is grounded through the resistor R10. The source of the nMOS 134 is connected to the drain of the nMOS 135. The gate of the nMOS 135 is connected to the drain of the nMOS 134 and the gate of the nMOS 137. The sources of the nMOSs 135 and 137 are grounded. The source of the nMOS 136 is connected to the drain of the nMOS 137, and a terminal of the resistor R11 is connected to the node between the nMOSs 136 and 137. The other terminal of the resistor R11 is connected to a VDDa terminal. The drain-source current I4 of the nMOS 136 is the output of the decreasing-characteristic generation circuit 130.

In the above decreasing-characteristic generation circuit 130, the voltage Va applied to the resistor R10 equals I2×R10, where I2 represents the magnitude of the current I2, and R10 represents the magnitude of resistance of the resistor R10. The current I2 also flows through the nMOS 137 due to the current mirror arrangement. In addition, since the voltage of the node between the nMOSs 136 and 137 is Va, the magnitude of the current I3 flowing through the resistor R11 equals (VDDa−Va)/R11=(VDDa−I2×R10)/R11, where R11 represents the magnitude of resistance of the resistor R11.

Therefore, the magnitude of the current I4, which is the output of the decreasing-characteristic generation circuit 130, equals I4=I2−I3=(1+R10/R11)×I2−VDDa/R11, where the magnitudes of the current I3 and the current I4 are respectively indicated by I3 and I4. Thus, the magnitude of the current I4 decreases with increase in the voltage VDDa.

The current-multiplication circuit 140 is constituted by the number m of pMOSs 141-1 to 141-$m$, the number M of pMOSs 142-1 to 142-M, a pMOS 143, and nMOSs 144 and 145.

The pMOSs 141-1 to 141-$m$ and the pMOSs 142-1 to 142-M constitute a current-mirror circuit with a mirror ratio of m:M. The drains of the pMOSs 141-1 to 141-$m$ are connected to each other, and are also connected to the drain of the nMOS 136 in the decreasing-characteristic generation circuit 130. The sources of the pMOSs 141-1 to 141-$m$ and the pMOSs 142-1 to 142-M are connected to VDDa terminals. The drains of the pMOSs 142-1 to 142-M are connected to each other, and are also connected to the drain of the nMOS 144. The gate of the nMOS 144 is connected to the drain of the nMOS 144 and the gates of the nMOS 145 and the nMOS realizing the current source 122. The sources of the nMOSs 144 and 145 are grounded. The drain of the nMOS 145 is connected to the drain of the pMOS 143. The source of the pMOS 143 is connected to a VDDa terminal. The gate of the pMOS 143 is connected to the drain of the pMOS 143 and the gate of the PMOS realizing the current source 121.

When the current I4 is inputted into the current-mirror circuit (with the mirror ratio of m:M) in the current-multiplication circuit 140, the magnitude of the current I5 flowing through the nMOS 144 equals (M/m)×I4, where the magnitude of the current I4 is indicated by I4. Then, the current-mirror circuits constituted by the nMOSs 144 and 145 and the PMOS 143 make the current sources 121 and 122 generate the correction current I1. At this time, the magnitude of the correction current I1 equals (M/m)×{(1+R10/R11)×I2−VDDa/R11}.

As explained above, the current-adaptation circuit 123 can make the current sources 121 and 122 generate the correction current I1 having the characteristic indicated in FIG. 3, and can therefore suppress the variations in the output amplitudes caused by the variations in the power-supply voltage VDDa. In addition, when the decreasing-characteristic generation circuit 130 as illustrated in FIG. 4 is used, the variations in the output amplitudes caused by the variations in the temperature and the manufacturing process can also be suppressed for the following reason.

The resistance of the resistors formed in a chip generally varies with the manufacturing process and the temperature, so that the output amplitudes also vary. Specifically, the output amplitudes increase when the magnitudes of resistance of the resistors are small, and decrease when the magnitudes of resistance of the resistors are great.

In the construction of FIG. 4, the magnitude of the current I2 increases when the magnitudes of resistance of the resistors R10 and R11 are small, and decreases when the magnitudes of resistance of the resistors R10 and R11 are great. Therefore, the voltage Va applied to the resistor R10 is unchanged. Since the voltage Va is unchanged, when the magnitude of resistance of the resistor R11 is small, the magnitude of the current I3 increases, and the magnitude of the current I4, which is the output of the decreasing-characteristic generation circuit 130, decreases. On the other hand, when the magnitude of resistance of the resistor R11 is great, the magnitude of the current I3 decreases, and the magnitude of the current I4 increases.

Therefore, when the magnitudes of resistance of the resistors are small, the magnitude of the correction current I1, which is generated by the current sources 121 and 122, decreases, and the decreased correction current I1 suppresses the increase in the output amplitudes, although such increase generally occurs when the magnitudes of resistance of the resistors in a chip are small. On the other hand, when the magnitude of resistance of the resistors are great, the magnitude of the correction current I1 increases, and the increased correction current I1 suppresses the decrease in the output amplitudes, although such decrease generally occurs when the magnitudes of resistance of the resistors in a chip are great. Thus, the variations in the output amplitudes caused by the variations in the temperature and the manufacturing process can be suppressed.

Since the current sources 121 and 122 in the transmission device 100 of FIG. 1 generate the constant correction current I1, which does not depend on the power-supply voltage VDDa, it is possible to finely adjust the amplitudes of the output signals TXOP and TXON.

Figure 5:
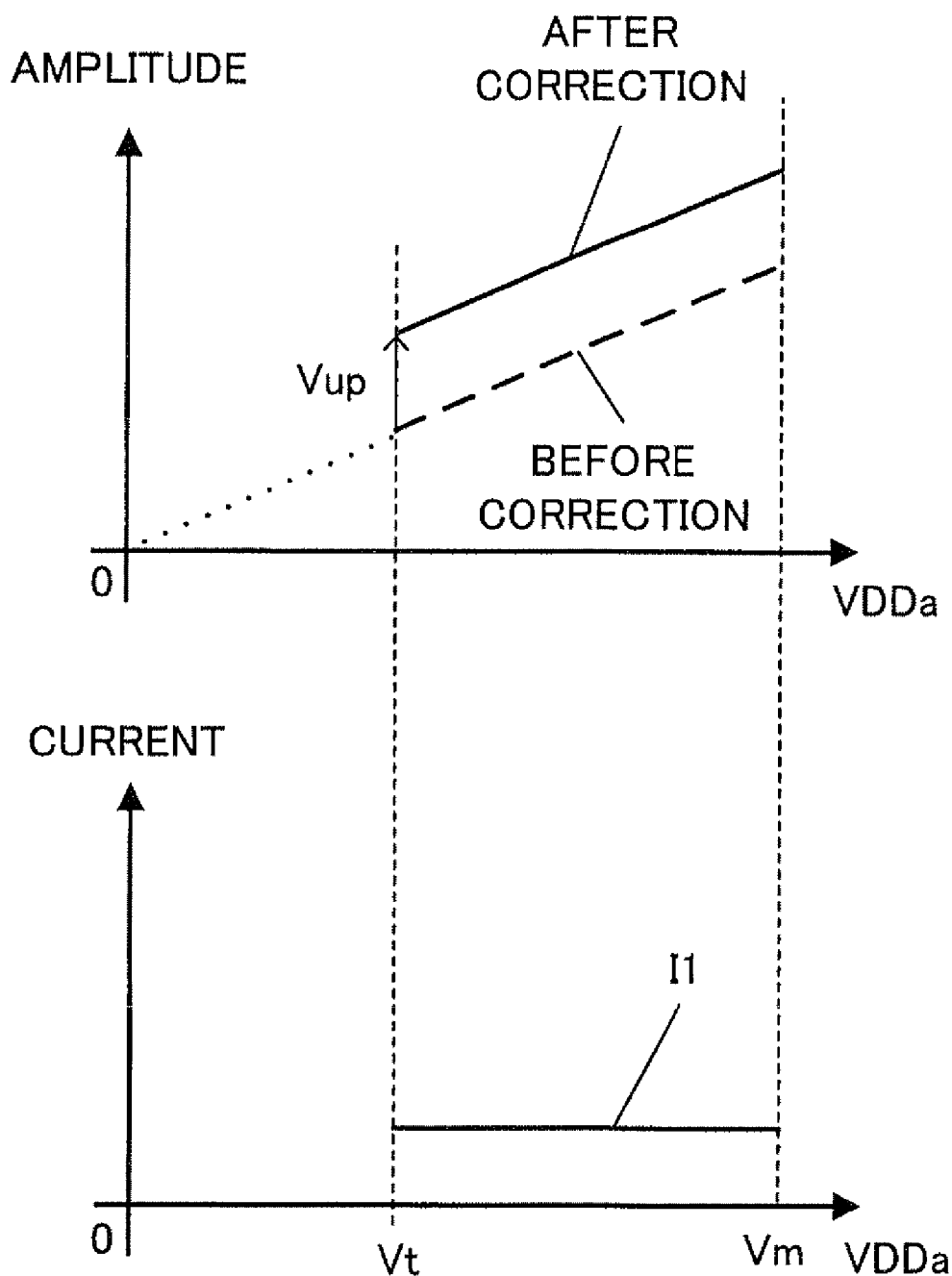
FIG. 5 is a diagram indicating an example of a characteristic, with respect to the power-supply voltage, of correction current generated by the current-adaptation circuit and the current sources in the first embodiment for finely adjusting output amplitudes, and an example of an output amplitude of the transmission device before and after correction.

FIG. 5 is a diagram indicating an example of a characteristic, with respect to the power-supply voltage, of the correction current generated by the current-adaptation circuit 123 and the current sources 121 and 122 in the first embodiment for finely adjusting output amplitudes, and an example of the amplitude of an output signal (representing each of the output signals TXOP and TXON) of the transmission device before and after correction. The abscissas in the upper and lower parts of FIG. 5 correspond to the power-supply voltage VDDa, and the ordinates in the upper and lower parts of FIG. 5 respectively correspond to the amplitude of the output signal and the magnitude of the correction current I1.

In the lower part of FIG. 5, a relationship between the correction current I1 and the power-supply voltage VDDa in the range from Vt to Vm is indicated. In the example of FIG. 5, the amplitude of each of the output signals TXOP and TXON is corrected by using the correction current I1 in the range of the power-supply voltage VDDa from Vt to Vm.

In the upper part of FIG. 5, the amplitude of the output signal in the range of the power-supply voltage VDDa from Vt to Vm before the correction is indicated by the dashed line, and the amplitude of the output signal in the range of the power-supply voltage VDDa from Vt to Vm after the correction is indicated by the solid line.

In the example indicated in FIG. 5, the current-adaptation circuit 123 is arranged so that the magnitude of the correction current I1 is constant regardlessly of the power-supply voltage VDDa. In this case, the amplitude of the output signal evenly increases in the range of the power-supply voltage VDDa from Vt to Vm as indicated in the upper part of FIG. 5, so that fine adjustment of the output amplitudes is enabled.

The correction current I1 having the characteristic as indicated in the lower part of FIG. 5 can be generated by removing the resistor R11 in the current-adaptation circuit 123 so that the current I2 is equalized with the current I4. In addition, the magnitude of the correction current I1 can be changed by changing the mirror ratio in the current-multiplication circuit 140. Therefore, it is easy to finely adjust the amplitudes of the output signals TXOP and TXON.

However, when the correction current I1, which does not depend on the power-supply voltage VDDa, is generated as indicated in the lower part of FIG. 5, the amplitudes of the output signals TXOP and TXON can vary with the variations in the power-supply voltage VDDa according to the characteristics indicated in the upper part of FIG. 5. This problem can be solved when the current-adaptation circuit 123 and the current sources 121 and 122 generate the correction current I1 as explained below.

Figure 6:
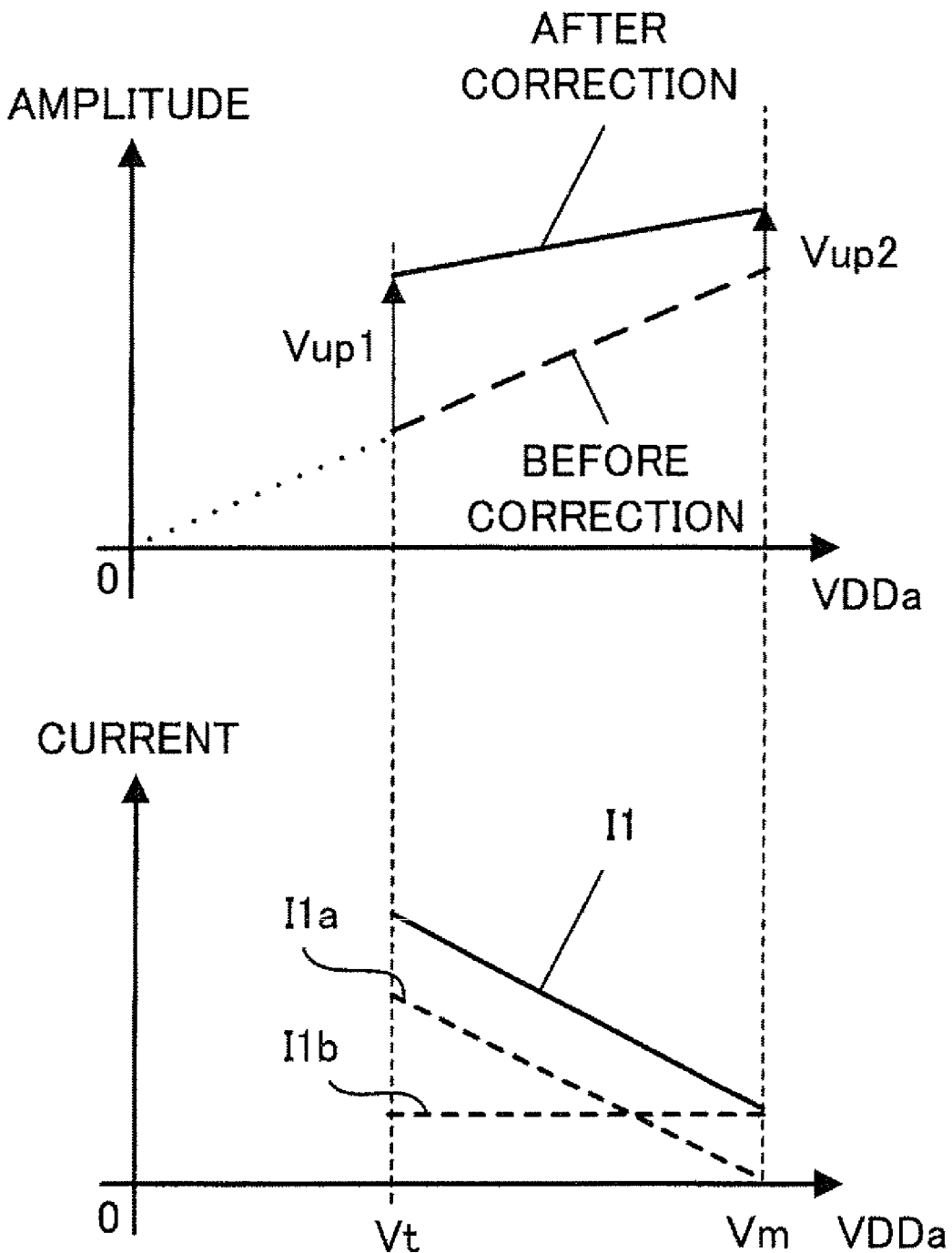
FIG. 6 is a diagram indicating an example of a characteristic, with respect to the power-supply voltage, of correction current generated by the current-adaptation circuit and the current sources in the first embodiment for finely adjusting output amplitudes and suppressing variations in the output amplitudes caused by variations in the power-supply voltage, and an example of an output amplitude of the transmission device before and after correction.

FIG. 6 is a diagram which indicates an example of the correction current I1 generated by the current sources 121 and 122 for finely adjusting the output amplitudes and suppressing the variations in the output amplitudes caused by the variations in the power-supply voltage, and an example of an amplitude of an output signal (representing each of the output signals TXOP and TXON) of the transmission device before and after correction in the first embodiment. The abscissas in the upper and lower parts of FIG. 6 correspond to the power-supply voltage VDDa, and the ordinates in the upper and lower parts of FIG. 6 respectively correspond to the amplitude of the output signal and the magnitude of the correction current I1.

In the lower part of FIG. 6, a relationship between the correction current I1 and the power-supply voltage VDDa in the range from Vt to Vm is indicated. In the example of FIG. 6, the amplitude of each of the output signals TXOP and TXON is corrected by using the correction current I1 in the range of the power-supply voltage VDDa from Vt to Vm.

In the upper part of FIG. 6, the amplitude of the output signal in the range of the power-supply voltage VDDa from Vt to Vm before the correction is indicated by the dashed line, and the amplitude of the output signal in the range of the power-supply voltage VDDa from Vt to Vm after the correction is indicated by the solid line.

In the example indicated in FIG. 6, the current-adaptation circuit 123 is arranged to make the current sources 121 and 122 generate as the correction current I1 the sum of the first component I1a and the second component I1b, where the first component I1a of the correction current I1 linearly decreases with increase in the power-supply voltage VDDa beyond Vt, and the second component I1b of the correction current I1 is constant regardlessly of the power-supply voltage VDDa, as indicated in the lower part of FIG. 6. Thus, the amplitude of the output signal is increased in the correction by an amount which decreases with increase in the power-supply voltage VDDa as indicated in the upper part of FIG. 6. For example, the amplitude of the output signal is increased in the correction by Vup1 (by the addition of the sum of the first component I1a and the second component I1b) when the power-supply voltage VDDa is Vt, and by Vup2 (by the addition of the second component I1b) when the power-supply voltage VDDa is Vm.

Figure 7:
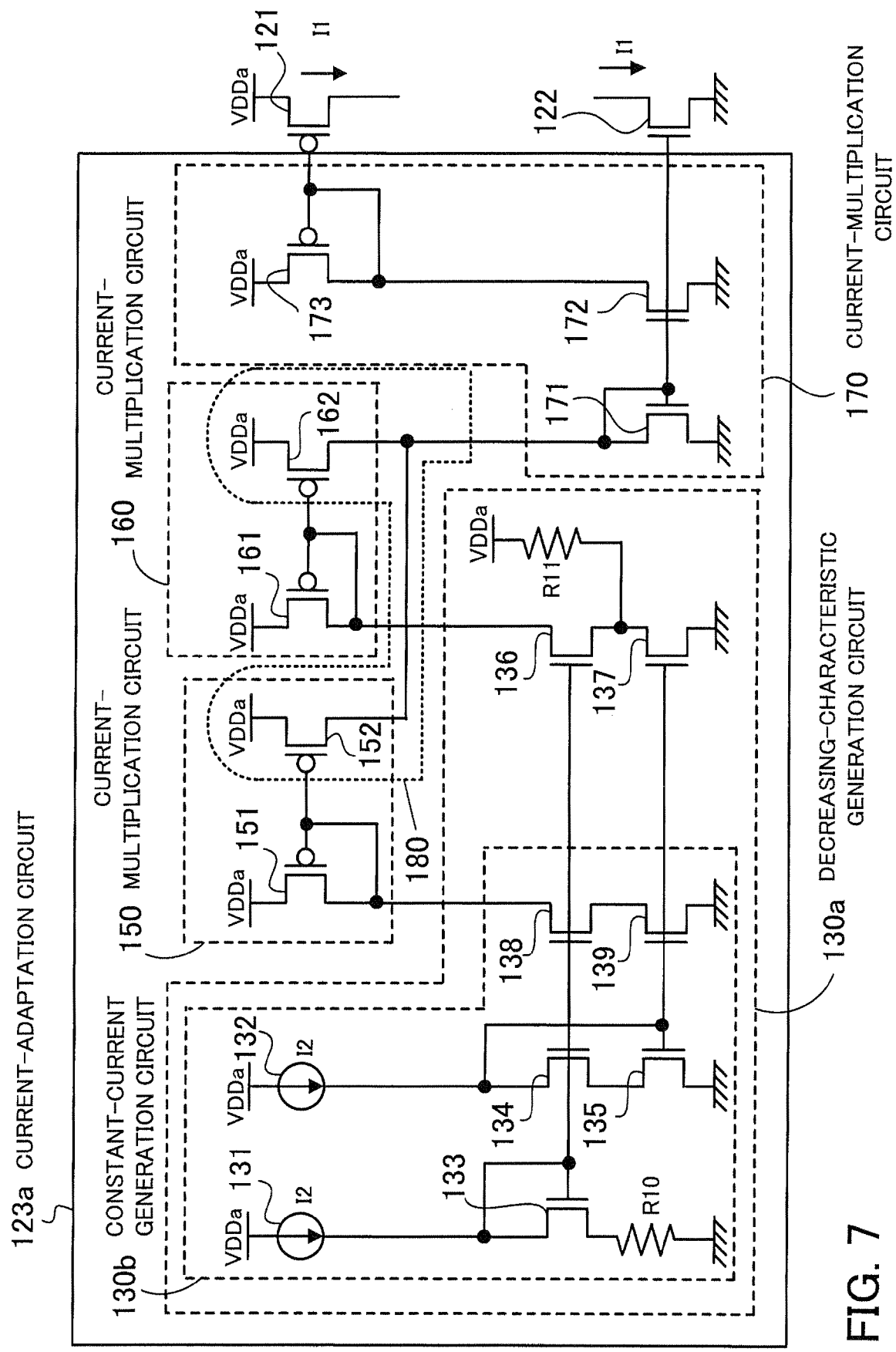
FIG. 7 is a diagram illustrating circuit constructions of the current sources and a current-adaptation circuit in the first embodiment which generate correction current for suppressing the variations in the output amplitudes caused by the variations in the power-supply voltage and finely adjusting the output amplitudes.

The correction current I1 having the characteristic as indicated in the lower part of FIG. 6 can be generated by using the current-adaptation circuit 123, for example, when the current-adaptation circuit 123 has the circuit construction 123a illustrated in FIG. 7.

FIG. 7 is a diagram illustrating circuit constructions of the current sources 121 and 122 and the current-adaptation circuit 123 (123a) in the transmission device 100 according to the first embodiment which generate the correction current I1 for suppressing the variations in the output amplitudes caused by the variations in the power-supply voltage and finely adjusting the output amplitudes. In FIG. 7, the same elements as the elements in the current-adaptation circuit 123 of FIG. 4 respectively bear the same reference numbers.

The current-adaptation circuit 123a illustrated in FIG. 7 comprises a decreasing-characteristic generation circuit 130a, a constant-current generation circuit 130b, current-multiplication circuits 150, 160, and 170, and a current-addition circuit 180. In the example of FIG. 7, the current sources 121 and 122 are respectively realized by a pMOS and an nMOS.

The decreasing-characteristic generation circuit 130a comprises a series connection of nMOSs 138 and 139 in addition to a circuit similar to the decreasing-characteristic generation circuit 130 illustrated in FIG. 4. The series connection of nMOSs 138 and 139 and a circuit constituted by the current sources 131 and 132, the nMOSs 133, 134, and 135, and the resistor R10 in a similar manner to the corresponding part of the decreasing-characteristic generation circuit 130 of FIG. 4 constitute the constant-current generation circuit 130b. The drain of the nMOS 138 is connected to the drain of the pMOS 151 in the current-multiplication circuit 150, the source of the nMOS 138 is connected to the drain of the nMOS 139, and the gate of the nMOS 138 is connected to the gates of the nMOSs 133, 134, and 136 and the drain of the nMOS 133. The gate of the nMOS 139 is connected to the gates of the nMOSs 135 and 137 and the drain of the nMOS 134, and the source of the nMOS 139 is grounded. Thus, the output of the constant-current generation circuit 130b is transmitted to the current-multiplication circuit 150 through the series connection of the nMOSs 138 and 139.

The current-multiplication circuit 150 is a current-mirror circuit which makes an adjustment of the current outputted from the series connection of the nMOSs 138 and 139 in the constant-current generation circuit 130b according to the mirror ratio of the current-mirror circuit 150. The current-mirror circuit 150 is constituted by one or more pMOSs arranged on each of the input and output sides (in a similar manner to the current-mirror circuit constituted by the pMOSs 141-1 to 141-m and the pMOSs 142-1 to 142-M in FIG. 4), although only the pMOSs 151 and 152 are representatively indicated on the input and output sides in the current-multiplication circuit 150 in FIG. 7 for simple illustration.

The current-multiplication circuit 160 is also a current-mirror circuit which makes an adjustment of the current outputted from the series connection of the nMOSs 136 and 137 in the decreasing-characteristic generation circuit 130a according to the mirror ratio of the current-mirror circuit 160. The current-mirror circuit 160 is constituted by one or more pMOSs arranged on each of the input and output sides in a similar manner to the current-mirror circuit 150, although only the pMOSs 161 and 162 are representatively indicated on the input and output sides in the current-multiplication circuit 160 in FIG. 7 for simple illustration.

The current-addition circuit 180 adds the current outputted from the current-multiplication circuit 150 and the current outputted from the current-multiplication circuit 160, and inputs the added current to the current-multiplication circuit 170. The current-addition circuit 180 is realized by connection of the drains of the one or more nMOSs (representatively indicated by the pMOS 152) arranged on the output side in the current-multiplication circuit 150 and the drains of the one or more nMOSs (representatively indicated by the pMOS 162) arranged on the output side in the current-multiplication circuit 160.

The current-multiplication circuit 170 contains nMOSs being representatively indicated by nMOSs 171 and 172 and constituting a first current-mirror circuit, and one or more pMOSs being representatively indicated by a pMOS 173 and constituting a second current-mirror circuit. The first current-mirror circuit is constituted by one or more nMOSs (representatively indicated by the nMOS 171) arranged on the input side, and one or more nMOSs (representatively indicated by the nMOS 172) and the current source 122 which are arranged on the output side. The second current-mirror circuit is constituted by one or more pMOSs arranged on the input side (representatively indicated by the pMOS 173) and the current source 121, which is arranged on the output side. The drains of the one or more nMOSs (representatively indicated by the nMOS 171) arranged on the input side receive the output of to the current-addition circuit 180. Thus, the current-multiplication circuit 170 makes an adjustment the current outputted from the current-addition circuit 180, and controls the current sources 121 and 122 by using the adjusted current.

The current-adaptation circuit 123a arranged as above have the following advantages.

(i) It is possible to generate the correction current I1 as indicated in the lower part of FIG. 6, suppress the variations in the output amplitudes caused by the variations in the power-supply voltage VDDa, and finely adjust the output amplitudes. In addition, since the decreasing-characteristic generation circuit 130a illustrated in FIG. 7 substantially contains the decreasing-characteristic generation circuit 130 illustrated in FIG. 4, it is possible to suppress the variations in the output amplitudes caused by the variations in the temperature and the manufacturing process.

(ii) Since the magnitude of the correction current I1 generated in the output-amplitude correction unit 120 for correcting the output amplitudes can be reduced, the dimensions of the current sources 121 and 122 can also be reduced. Therefore, it is possible to reduce the load capacitance which the output signals TXOP and TXON suffer from, as well as the rising times of the falling times of the output signals TXOP and TXON. Thus, it is possible to suppress the lowering of the high-frequency impedance and deterioration of the return loss.

(iii) Since the current sources 121 and 122 can be isolated from the signal lines for the output signals TXOP and TXON by the pMOSs 124 and 125 and the nMOSs 126 and 127 when the correction current I1 is not added to or is not drawn from the output signals, it is possible to reduce the load capacitance, and suppress the lowering of the high-frequency impedance and the deterioration of the return loss.

(iv) Since the common-mode voltage is generated by resistance division, it is possible to stably set a terminal at which the voltage is fixed, and reduce the deterioration of the return loss.

As explained above, the transmission device 100 according to the first embodiment concurrently satisfies the requirements which are specified by various standards for maintaining the waveshape quality of high-speed data signals.

2. Second Embodiment

The transmission device 100 according to the first embodiment suppresses the variations in the output amplitudes caused by the variations in the power-supply voltage VDDa, by generating such correction current I1 that the output amplitudes are increased in correction by an amount which increases with decrease in the power-supply voltage VDDa. On the other hand, the variations in the output amplitudes caused by the variations in the power-supply voltage VDDa can be suppressed by generating such correction current I1 that the output amplitudes are decreased in correction by an amount which increases with increase in the power-supply voltage VDDa.

The second embodiment is explained in detail below.

Figure 8:
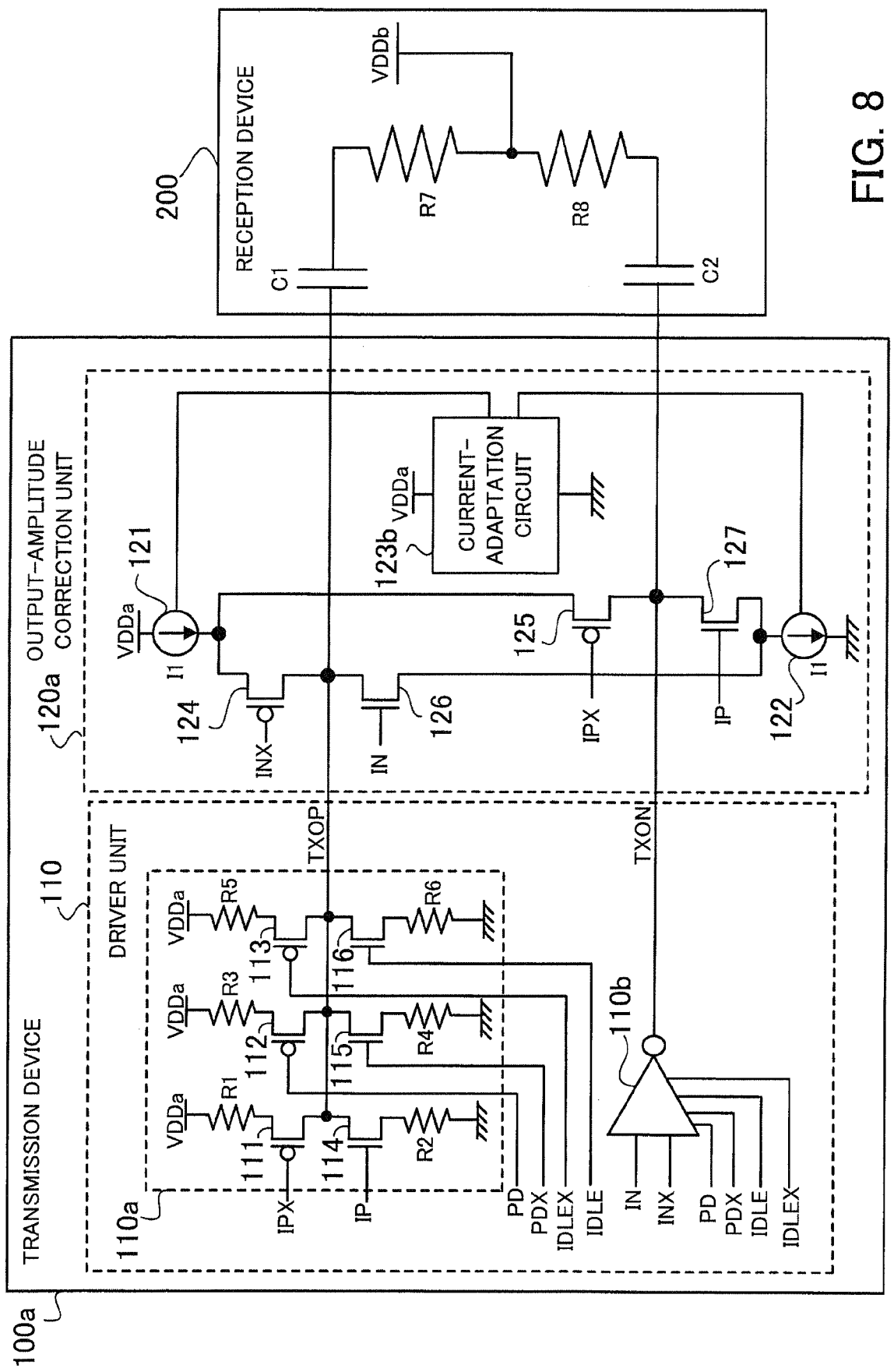
FIG. 8 is a diagram illustrating circuit constructions of a transmission device and a reception device according to a second embodiment.

FIG. 8 is a diagram illustrating circuit constructions of a transmission device and a reception device according to the second embodiment. In FIG. 8, the same elements as the elements in the transmission device 100 according to the first embodiment respectively bear the same reference numbers. Therefore, the explanations on the same elements are not repeated unless necessary.

The transmission device 100a according to the second embodiment is different from the transmission device 100 according to the first embodiment in the input signals of the output-amplitude correction unit 120a. The output-amplitude correction unit 120a according to the second embodiment is different from the output-amplitude correction unit 120 (in the transmission device 100 according to the first embodiment) in that the input signals INX and IN are respectively applied to the gates of the pMOS 124 and the nMOS 126, the input signals IPX and IP are respectively applied to the gates of the pMOS 125 and the nMOS 127, and the current-adaptation circuit 123b in the transmission device 100a behaves differently from the current-adaptation circuit 123 in the transmission device 100 according to the first embodiment.

During normal operation, for example, when the input signals IP and IPX are at the H level, and the input signals IN and INX are at the L level, the output signal TXOP is at the L level, and the output signal TXON is at H level. At this time, in the output-amplitude correction unit 120a, the pMOS 124 and the nMOS 127 are turned on, and the nMOS 126 and the pMOS 125 are turned off. Therefore, the correction current I1 supplied from the current source 121 flows through the pMOS 124, and the voltage of the output signal TXOP, which is at the L level, is raised. In addition, the correction current I1 drawn by the current source 122 flows through the nMOS 127, and the voltage of the output signal TXON, which is at the H level, is lowered. Thus, the amplitudes of the output signals TXOP and TXON are decreased.

In the transmission device 100a, the current-adaptation circuit 123b makes the current sources 121 and 122 generate the correction current I1 according to the power-supply voltage VDDa as explained below.

Figure 9:
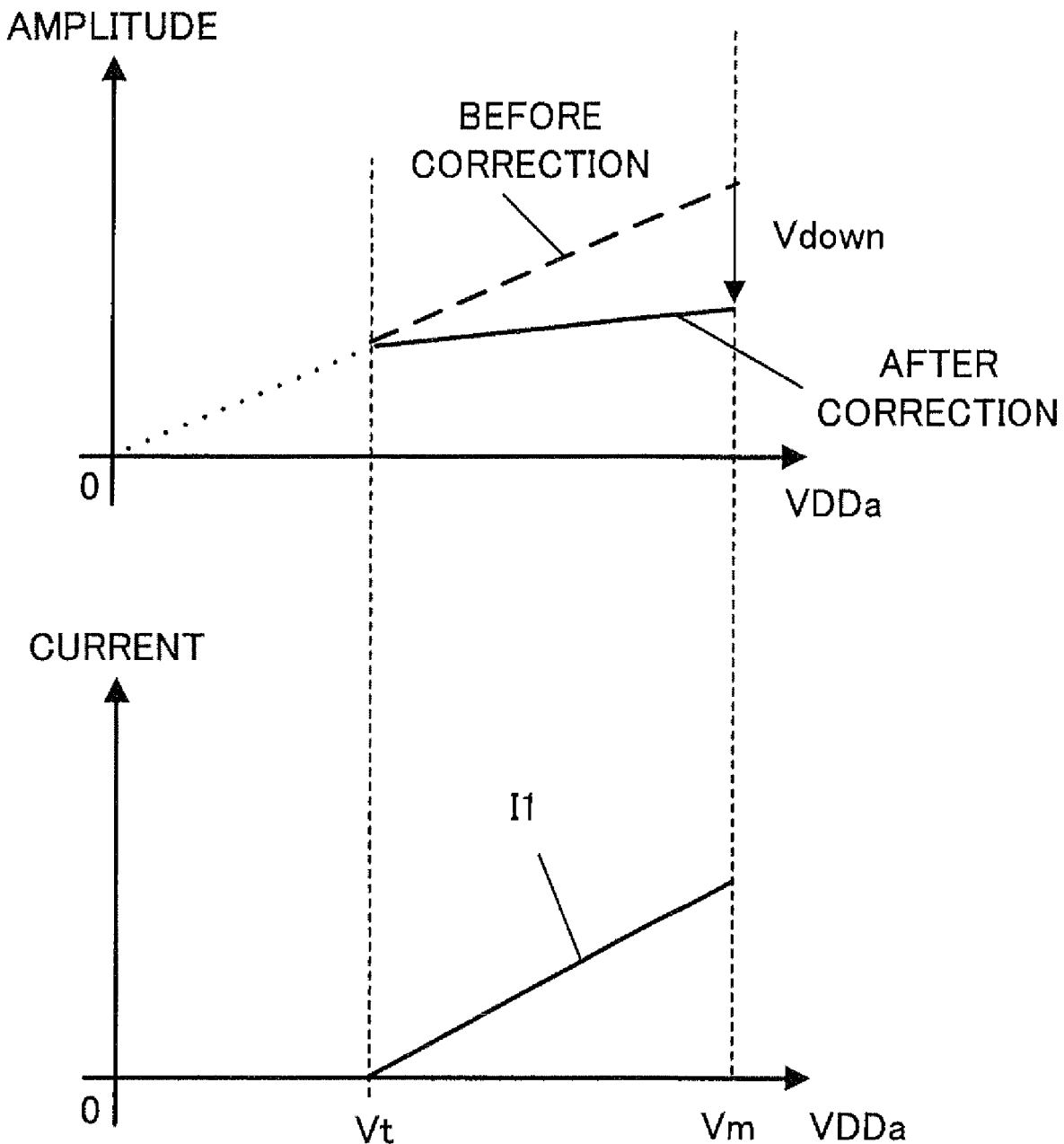
FIG. 9 is a diagram indicating an example of a characteristic, with respect to the power-supply voltage, of correction current generated by a current-adaptation circuit and current sources arranged in the transmission device according to the second embodiment, and an example of an output amplitude of the transmission device before and after correction.

FIG. 9 is a diagram indicating an example of the correction current I1 generated by a current-adaptation circuit 123b and the current sources 121 and 122 arranged in the transmission device 100a according to the second embodiment, and an example of an amplitude of an output signal (representing each of the output signals TXOP and TXON) of the transmission device before and after correction. The abscissas in the upper and lower parts of FIG. 9 correspond to the power-supply voltage VDDa, and the ordinates in the upper and lower parts of FIG. 9 respectively correspond to the amplitude of the output signal and the magnitude of the correction current I1.

In the lower part of FIG. 9, a relationship between the correction current I1 and the power-supply voltage VDDa in the range from Vt to Vm is indicated. In the example of FIG. 9, the amplitude of each of the output signals TXOP and TXON is corrected by using the correction current I1 in the range of the power-supply voltage VDDa from Vt to Vm.

In the upper part of FIG. 9, the amplitude of the output signal in the range of the power-supply voltage VDDa from Vt to Vm before the correction (i.e., before the output signal in the range of the power-supply voltage VDDa from Vt to Vm is inputted into the output-amplitude correction unit 120a) is indicated by the dashed line, and the amplitude of the output signal in the range of the power-supply voltage VDDa from Vt to Vm after the correction (i.e., after the output signal is outputted from the output-amplitude correction unit 120a) is indicated by the solid line.

In the example indicated in FIG. 9, the current-adaptation circuit 123b is arranged so that the magnitude of the correction current I1 linearly increases beyond zero as the power-supply voltage VDDa increases beyond Vt as indicated in the lower part of FIG. 9. Therefore, the amplitude of the output signal exhibits a characteristic as indicated in the upper part of FIG. 9. That is, the amplitude of the output signal is reduced in the correction by an amount which increases from zero with the increase in the power-supply voltage VDDa beyond Vt, and reduced in the correction by Vdown when the power-supply voltage VDDa reaches Vm. Thus, it is possible to suppress the variations in the output amplitude even when the power-supply voltage VDDa varies in the range from Vt to Vm as indicated in the upper part of FIG. 9.

Further, it is possible to finely adjust the amplitudes of the output signals TXOP and TXON by arranging the current-adaptation circuit 123b so that the current sources 121 and 122 generate constant correction current (which does not depend on the power-supply voltage VDDa) as in the first embodiment.

FIG. 10 is a diagram indicating an example of a characteristic, with respect to the power-supply voltage, of the correction current I1 generated by the current-adaptation circuit 123b and the current sources 121 and 122 in the transmission device according to the second embodiment for finely adjusting output amplitudes, and an example of the amplitude of an output signal (representing each of the output signals TXOP and TXON) of the transmission device before and after correction. The abscissas in the upper and lower parts of FIG. 10 correspond to the power-supply voltage VDDa, and the ordinates in the upper and lower parts of FIG. 10 respectively correspond to the amplitude of the output signal and the magnitude of the correction current I1.

In the example indicated in FIG. 10, the current-adaptation circuit 123b is arranged so that the magnitude of the correction current I1 is constant regardlessly of the power-supply voltage VDDa. In this case, the amplitude of each of the output signals TXOP and TXON is evenly decreased by Vdown in the range of the power-supply voltage VDDa from Vt to Vm as indicated in the upper part of FIG. 10, so that fine adjustment of the output amplitudes is enabled.

However, when the correction current I1, which does not depend on the power-supply voltage VDDa, is generated as indicated in the lower part of FIG. 10, the amplitudes of the output signals TXOP and TXON can vary with the variations in the power-supply voltage VDDa in accordance with the characteristics indicated in the upper part of FIG. 10. This problem can be solved when the current-adaptation circuit 123b and the current sources 121 and 122 generate the correction current I1 as explained below.

FIG. 11 is a diagram which indicates an example of the correction current I1 generated for suppressing variations in the output amplitudes caused by variations in the power-supply voltage and finely adjusting the output amplitudes, and an example of an amplitude of an output signal (representing each of the output signals TXOP and TXON) of the transmission device before and after correction in the second embodiment. The abscissas in the upper and lower parts of FIG. 11 correspond to the power-supply voltage VDDa, and the ordinates in the upper and lower parts of FIG. 11 respectively correspond to the amplitude of the output signal and the magnitude of the correction current I1.

In the example indicated in FIG. 11, the current-adaptation circuit 123b is arranged to make the current sources 121 and 122 generate as the correction current I1 the sum of a first component I1c and a second component I1d, where the first component I1c linearly increases with increase in the power-supply voltage VDDa beyond Vt, and the second component I1d is constant regardlessly of the power-supply voltage VDDa, as indicated in the upper part of FIG. 11. Thus, the amplitude of the output signal is decreased in the correction by an amount which increases with increase in the power-supply voltage VDDa as indicated in the upper part of FIG. 11. For example, the amplitude of the output signal is decreased in the correction by Vdown1 (by reduction of the sum of the first component I1c and the second component I1d) when the power-supply voltage VDDa is Vt, and by Vdown2 (by the reduction of the sum of the first component I1c and the second component I1d) when the power-supply voltage VDDa is Vm.

Figure 12:
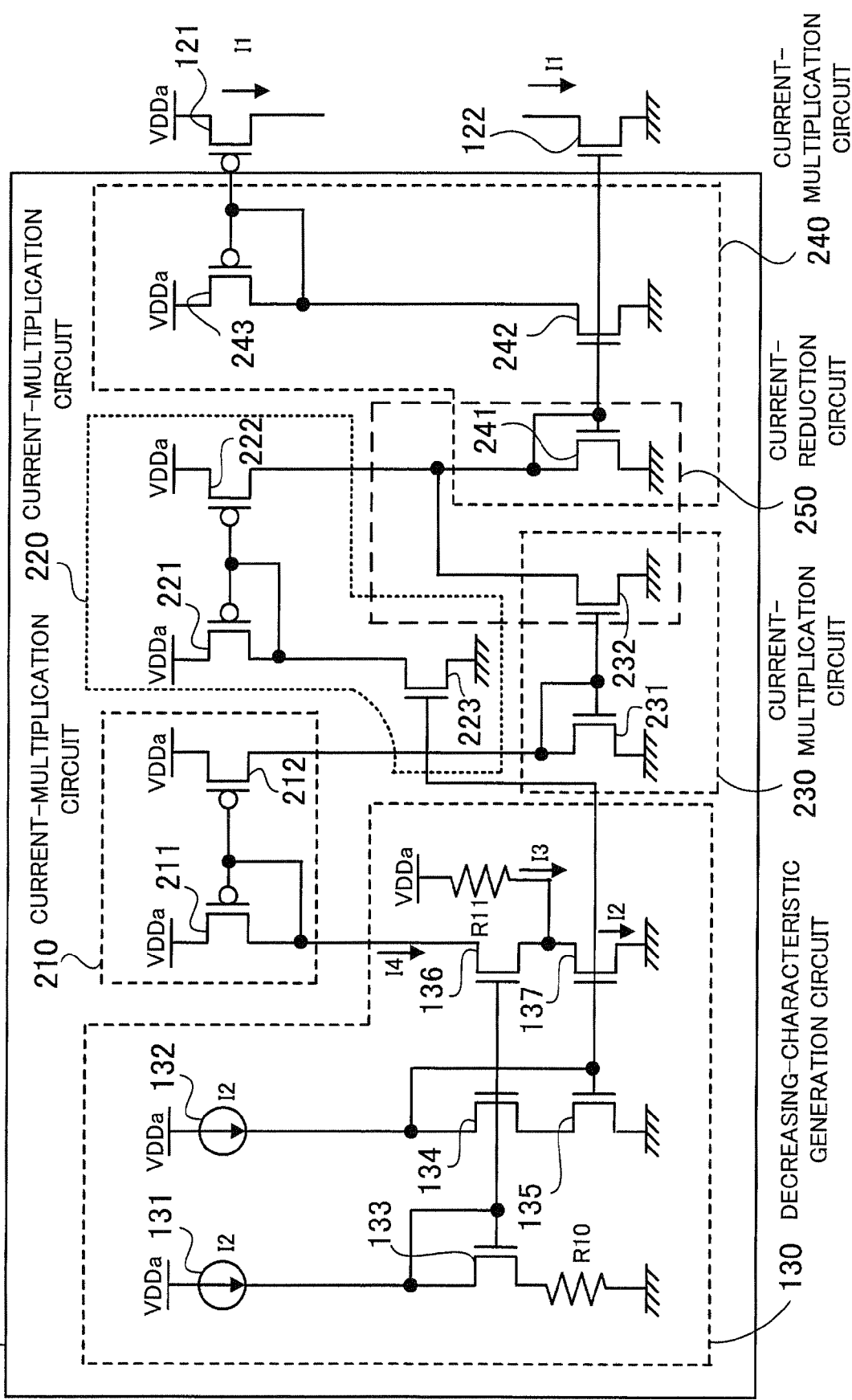
FIG. 12 is a diagram illustrating circuit constructions of a first example of the current-adaptation circuit and the current sources in the second embodiment, which increase the magnitude of the correction current as the power-supply voltage increases.

The current the magnitude of which increases with increase in the power-supply voltage VDDa such as the correction current I1 indicated in the lower part of FIG. 9 or 11 can be generated by using the current-adaptation circuit 123b, for example, when the current-adaptation circuit 123b has the circuit construction illustrated in FIG. 12.

FIG. 12 is a diagram illustrating circuit constructions of a first example 123b of the current-adaptation circuit and the current sources 121 and 122 in the transmission device according to the second embodiment, which increase the magnitude of the correction current I1 as the power-supply voltage increases. In FIG. 12, the same elements as the elements in the current-adaptation circuit 123 of FIG. 4 respectively bear the same reference numbers.

The current-adaptation circuit 123b illustrated in FIG. 12 comprises a decreasing-characteristic generation circuit 130, current-multiplication circuits 210, 220, 230, and 240, and a current-reduction circuit 250. In the example of FIG. 12, the current sources 121 and 122 are respectively realized by a pMOS and an nMOS.

The decreasing-characteristic generation circuit 130 in the current-adaptation circuit 123b of FIG. 12 has an identical construction to the decreasing-characteristic generation circuit 130 illustrated in FIG. 4.

The current-multiplication circuit 210 is a current-mirror circuit which makes an adjustment of the current I4 outputted from the decreasing characteristic generation circuit 130 according to the mirror ratio of the current-mirror circuit 210. The current-mirror circuit 210 is constituted by one or more pMOSs arranged on each of the input and output sides (in a similar manner to the current-mirror circuit constituted by the pMOSs 141-1 to 141-m and the pMOSs 142-1 to 142-M in FIG. 4), although only the pMOSs 211 and 212 are representatively indicated on the input and output sides in the current-multiplication circuit 210 in FIG. 12 for simple illustration.

The current-multiplication circuit 220 comprises an nMOS 223 and a first current-mirror circuit. The nMOS 223 and the nMOS 135 in the decreasing-characteristic generation circuit 130 constitute a second current-mirror circuit, so that the current I2 flowing through the nMOS 135 is transferred to the nMOS 223. The first current-mirror circuit is constituted by one or more pMOSs arranged on each of the input and output sides in a similar manner to the current-mirror circuit 210, although only the pMOSs 221 and 222 are representatively indicated on the input and output sides in the current-multiplication circuit 220 in FIG. 12 for simple illustration. The drain of the nMOS 223 is connected to the drains of one or more pMOSs (representatively indicated by the pMOS 211) arranged on the input output side in the first current-mirror circuit, so that the first current-mirror circuit makes an adjustment of the current I2 transferred from the decreasing-characteristic generation circuit 130 according to the mirror ratio of the first current-mirror circuit in the current-mirror circuit 220.

The current-multiplication circuit 230 is also a current-mirror circuit which makes an adjustment of the current outputted from the current-multiplication circuit 210 according to the mirror ratio of the current-mirror circuit 230. The current-mirror circuit 230 is constituted by one or more nMOSs arranged on each of the input and output sides in a similar manner to the current-mirror circuit 210, although only the nMOSs 231 and 232 are representatively indicated on the input and output sides in the current-multiplication circuit 230 in FIG. 12 for simple illustration.

The current-multiplication circuit 240 contains nMOSs being representatively indicated by nMOSs 241 and 242 and constituting a first current-mirror circuit, and one or more pMOSs being representatively indicated by a pMOS 243 and constituting a second current-mirror circuit. The first current-mirror circuit is constituted by one or more nMOSs (representatively indicated by the nMOS 241) arranged on the input side, and one or more nMOSs (representatively indicated by the nMOS 242) and the current source 122 which are arranged on the output side. The second current-mirror circuit is constituted by one or more pMOss (representatively indicated by the pMOS 243) arranged on the input side and the current source 121, which is arranged on the output side. The drains of the one or more nMOSs (representatively indicated by the nMOS 241) arranged on the input side in the first current-mirror circuit in the current-multiplication circuit 240 are connected to the drains of the one or more pMOSs (representatively indicated by the pMOS 222) arranged on the output side in the current-multiplication circuit 220. Thus, the current-multiplication circuit 240 makes an adjustment of the current outputted from the current-multiplication circuit 220, 230 according to the mirror ratios of the current-mirror circuits in the current-multiplication circuit 240, and controls the current sources 121 and 122 so as to generate the correction current I1.

The current-reduction circuit 250 is realized by connecting the drains of the one or more nMOSs (representatively indicated by the nMOS 232) arranged on the output side in the current-multiplication circuit 230 to the drains of the one or more pMOSs (representatively indicated by the pMOS 222) arranged on the output side in the current-multiplication circuit 220 (as well as the drains of the one or more nMOSs representatively indicated by the nMOS 241 and arranged on the input side in the first current-mirror circuit in the current-multiplication circuit 240). The current-reduction circuit 250 reduces the current outputted from the current-multiplication circuit 220, by drawing the current as the output of the current-multiplication circuit 230 out of the current outputted from the current-multiplication circuit 220, and outputs the reduced current to the current-multiplication circuit 240. The current-multiplication circuit 240 makes an adjustment of the output of the current-reduction circuit 250 according to the mirror ratios of the first and second current-mirror circuit 240.

As explained before, the magnitude of the current I4, which is outputted from the decreasing-characteristic generation circuit 130, equals $I4=I2-I3=(1+R10/R11) \times I2-VDDa/R11$, so that the magnitude of the current I4 decreases with increase in the voltage VDDa. In the case where the mirror ratios in the current-multiplication circuits 210, 220, and 230 are 1:1, the magnitude of the output of the current-reduction circuit 250 equals $I2-I4=I2-(1+R10/R11) \times I2+VDDa/R11$, i.e., the magnitude of the output of the current-reduction circuit 250 increases with increase in the power-supply voltage VDDa.

Thus, the current-adaptation circuit 123b arranged as above can generate the correction current I1 having the characteristics as indicated in the lower part of FIG. 9 or 11, so that it is possible to suppress the variations in the output amplitudes caused by the variations in the power-supply voltage VDDa. In addition, since the decreasing-characteristic generation circuit 130 in the current-adaptation circuit 123b illustrated in FIG. 12 is used in a similar manner to the current-adaptation circuit 123 illustrated in FIG. 4, the variations in the output amplitudes caused by the variations in the temperature and the manufacturing process can also be suppressed, so that the transmission device 100a according to the second embodiment having the current-adaptation circuit 123b also have advantages similar to the transmission device 100 according to the first embodiment.

Figure 13:
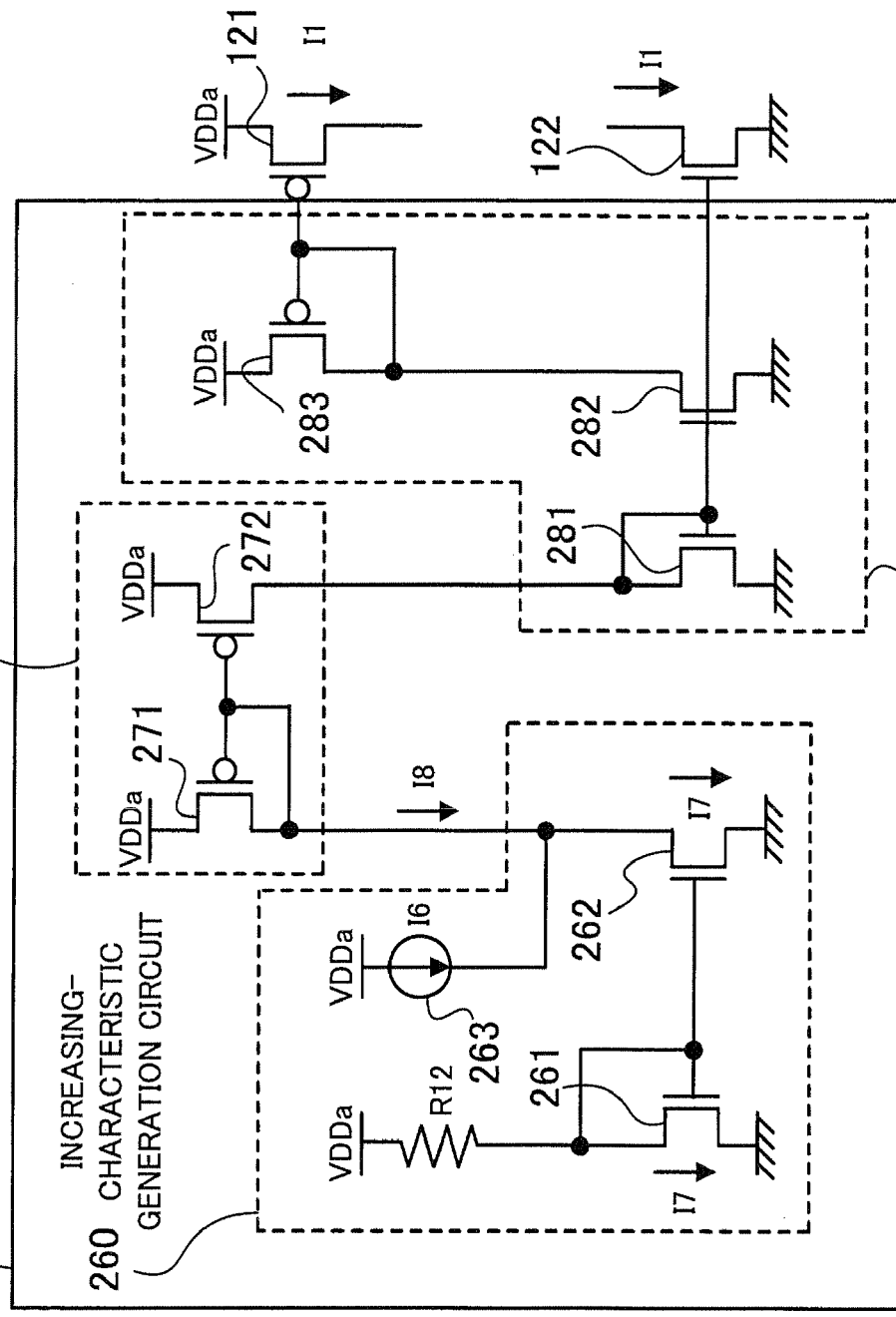
FIG. 13 is a diagram illustrating circuit constructions of a second example of the current-adaptation circuit and the current sources in the second embodiment, which increase the magnitude of the correction current as the power-supply voltage increases.

FIG. 13 is a diagram illustrating circuit constructions of a second example 123c of the current-adaptation circuit and the current sources 121 and 122 in the second embodiment, which increase the magnitude of the correction current I1 as the power-supply voltage increases.

The current-adaptation circuit 123c illustrated in FIG. 13 comprises an increasing-characteristic generation circuit 260 and current-multiplication circuits 270 and 280.

The increasing-characteristic generation circuit 260 comprises nMOSs 261 and 262, a current source 263, and a resistor R12. The power-supply voltage VDDa is applied to the drain of the nMOS 261 through the resistor R12. The drain and the gate of the nMOS 261 and the gate of the nMOS 262 are connected. The sources of the nMOSs 261 and 262 are grounded. Current I6 flows from the current source 263 to the drain of the nMOS 262. A terminal of the current source 263 opposite to the nMOS 262 is connected to a VDDa terminal. The drain of the nMOS 262 is also connected to the drains of one or more pMOSs (representatively indicated by a pMOS 271) arranged on the input side in the current-multiplication circuit 270.

The current-multiplication circuit 270 is a current-mirror circuit which makes an adjustment of the current I8 according to the mirror ratio of the current-mirror circuit 270, where the current I8 is the output of the increasing-characteristic generation circuit 260 The current-mirror circuit 270 is constituted by the above-mentioned one or more pMOSs (representatively indicated by the pMOS 271) arranged on the input side and one or more other pMOSs representatively indicated by a pMOS 272 and arranged on each of the input and output sides.

The current-multiplication circuit 280 contains nMOSs being representatively indicated by nMOSs 281 and 282 and constituting a first current-mirror circuit, and one or more pMOSs being representatively indicated by a pMOS 283 and constituting a second current-mirror circuit. The first current-mirror circuit is constituted by one or more nMOSs (representatively indicated by the nMOS 281) arranged on the input side, and one or more nMOSs (representatively indicated by the nMOS 282) and the current source 122 which are arranged on the output side. The second current-mirror circuit is constituted by one or more pMOSs (representatively indicated by the pMOS 283) arranged on the input side and the current source 121, which is arranged on the output side. The drains of the one or more nMOSs (representatively indicated by the nMOS 281) arranged on the input side in the current-multiplication circuit 280 are connected to the drains of the one or more pMOSs (representatively indicated by the PMOS 272) arranged on the output side in the current-multiplication circuit 270. The current-multiplication circuit 280 makes an adjustment of the output of the current-multiplication circuit 270 according to the mirror ratios of the first and second current-mirror circuits, so that the current sources 121 and 122 generate the correction current I1.

The magnitude of the current I8 as the output of the increasing-characteristic generation circuit 260 can be expressed as $I8=I7-I6=(VDDa-Vb)/R12-I6=1/R12 \times VDDa+I6-Vb/R12$, where Vb represents the drain voltage (the gate voltage) of the nMOS 261, I6 represents the magnitude of the current I6, I7 represents the magnitude of the current I7, and I8 represents the magnitude of the current I8. Then, the current-multiplication circuits 270 and 280 make the adjustment of the current I8, so that the magnitude of the correction current I1 generated by the current sources 121 and 122 increases with increase in the power-supply voltage VDDa. That is, the current-adaptation circuit 123c can make the current sources 121 and 122 generate the correction current I1 having the characteristic as indicated in the lower part of FIG. 9 or 11.

3. Variations of First and Second Embodiments

3.1 Variations of Current-adaptation Circuit

As explained above, the output amplitudes are adapted for variations in the power-supply voltage by additive correction in the transmission device 100 according to the first embodiment, and by reductive correction in the transmission device 100a according to the second embodiment. Further, it is possible to realize both of the additive correction and the reductive correction in a transmission device. An example of a current-adaptation circuit for realizing such a transmission device is indicated below.

Although the current-adaptation circuit 123 illustrated in FIG. 4 basically realizes the correction current I1 having the characteristic as indicated in the lower part of FIG. 3, in practice, the magnitude of the correction current I1 generated by using the current-adaptation circuit 123 of FIG. 4 may not actually fall to zero at the power-supply voltage VDDa=Vm due to the existence of offset current. Therefore, it is desirable that the current-adaptation circuit 123 of FIG. 4 be modified as follows.

Figure 14:
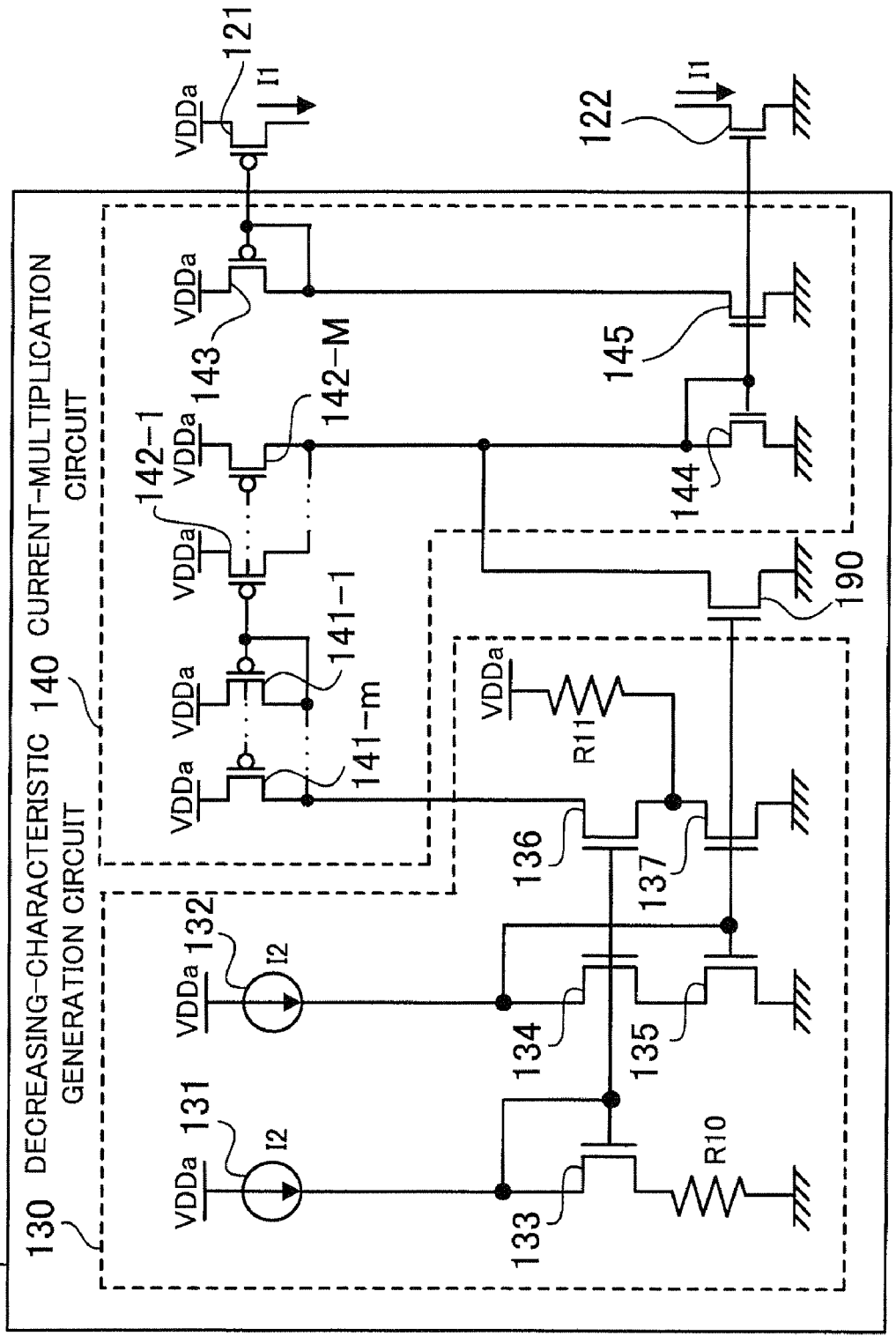
FIG. 14 is a diagram illustrating circuit constructions of a third example of the current-adaptation circuit and the current sources in the second embodiment, which reduce the magnitude of the correction current as the power-supply voltage increases.

FIG. 14 is a diagram illustrating circuit constructions of a third example 123d of the current-adaptation circuit and the current sources 121 and 122 in the second embodiment, which reduce the magnitude of the correction current I1 as the power-supply voltage increases. In FIG. 14, the same elements as the elements in FIG. 4 respectively bear the same reference numbers.

The current-adaptation circuit 123d of FIG. 14 is different from the current-adaptation circuit 123 of FIG. 4 in that the current-adaptation circuit 123d of FIG. 14 comprises an nMOS 190 arranged between the decreasing-characteristic generation circuit 130 and current-multiplication circuit 140. The gate of the nMOS 190 is connected to the gates of the nMOSs 135 and 137, and the drain of the nMOS 190 is connected to the node between the drains of the pMOSs 142-1 to 142-M and the drain of the nMOS 144, and the source of the nMOS 190 is grounded. The nMOS 190, the pMOSs 142-1 to 142-M, and the nMOS 144 realize a current-reduction circuit.

Further, the offset current in the current-adaptation circuit 123a of FIG. 7 can also be reduced by using a current-reduction circuit constructed as above. That is, in the case where the transmission device 100 having the current-adaptation circuit 123a of FIG. 7 uses the above current-reduction circuit, it is possible to adjust the output amplitudes of the transmission device 100 so as to reduce the output amplitudes. On the other hand, the offset current in each of the current-adaptation circuit 123b of FIG. 12 and the current-adaptation circuit 123c of FIG. 13 can be increased by using a current-reduction circuit constructed as above. That is, it is possible to adjust the output amplitudes of the transmission device 100 so as to increase the output amplitudes in the case where the transmission device 100 having the current-adaptation circuit 123b of FIG. 12 or the current-adaptation circuit 123c of FIG. 13 uses the above current-reduction circuit.

3.2 Variations of Driver Circuits

Figure 15:
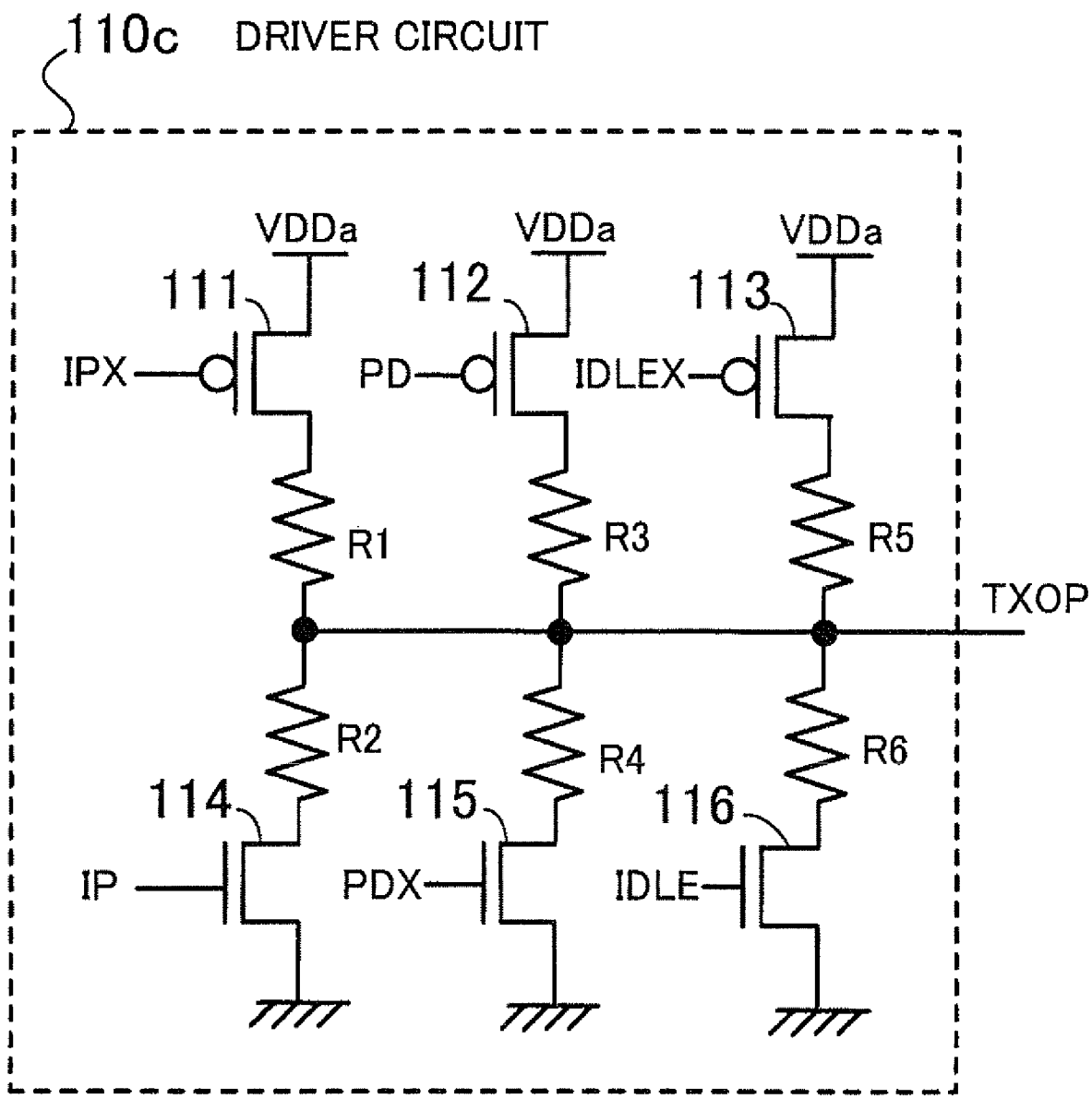
FIG. 15 is a diagram illustrating a circuit construction of a first alternative example of a driver circuit in the transmission devices according to the first and second embodiments.
Figure 16:
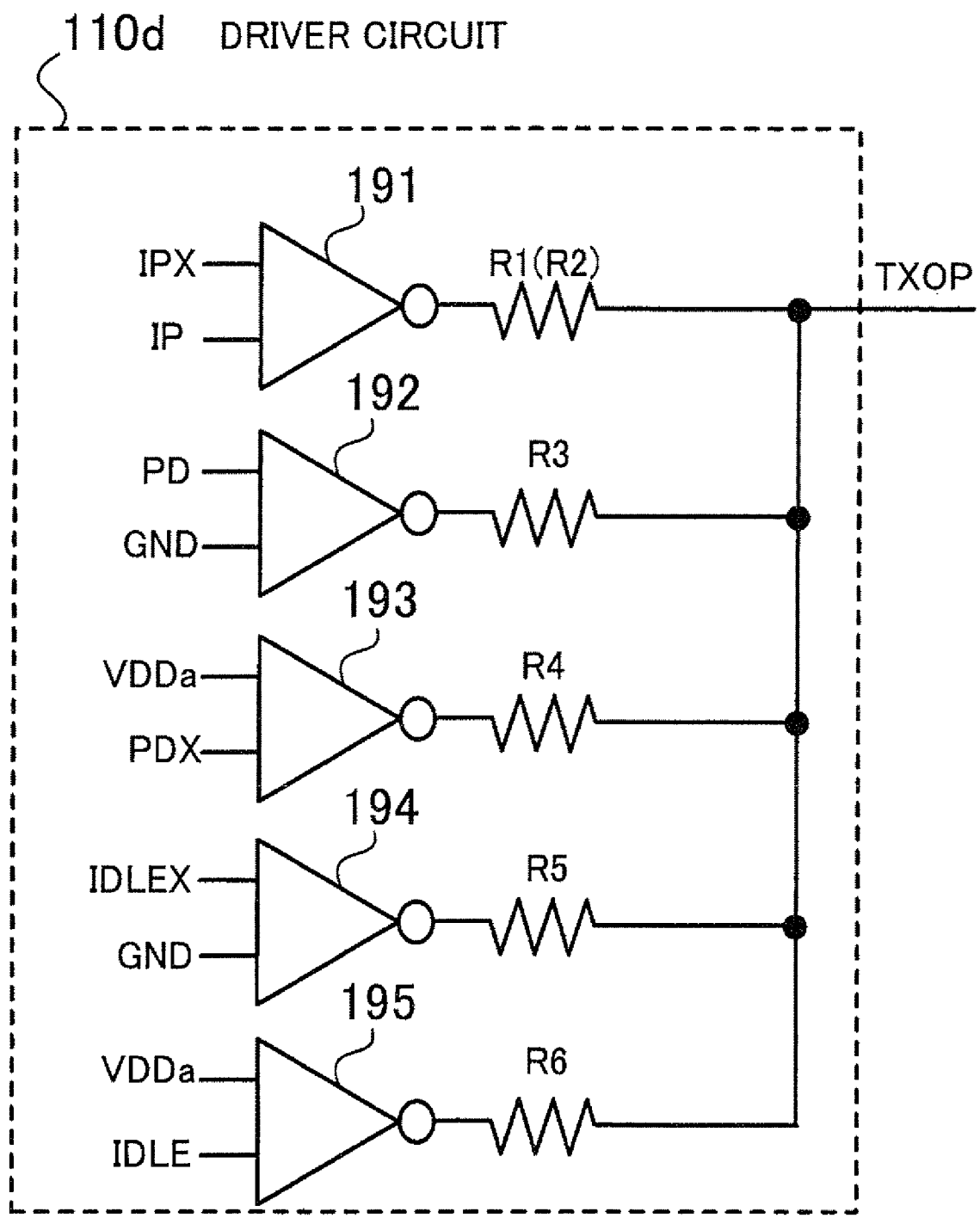
FIG. 16 is a diagram illustrating a circuit construction of a second alternative example of a driver circuit in the transmission devices according to the first and second embodiments.

The circuit constructions of the driver circuits 110a and 110b may not be necessarily as illustrated in FIGS. 1 and 8, and may have the circuit constructions as illustrated in FIGS. 15 and 16, which show circuit constructions of first and second alternatives of the driver circuit 110a in the transmission devices according to the first and second embodiments. The circuit constructions illustrated in FIGS. 15 and 16 are equivalent circuits to the driver circuit 110a of FIG. 1.

The driver circuit 110c illustrated in FIG. 15 is different from the driver circuit 110a illustrated in FIG. 1 in that the positions of the resistors R1, R3, and R5 and the pMOSs 111, 112, and 113 are exchanged, and the positions of the resistors R2, R4, and R6 and the nMOSs 114, 115, and 116 are exchanged.

On the other hand, the driver circuit 110d illustrated in FIG. 16 comprises inverter circuits 191, 192, 193, 194, and 195, and the resistors R1 (or R2), R3, R4, R5, and R6. The input signals IPX and IP are applied to the input terminals of the inverter circuit 191. The input signal PD is applied to an input terminal of the inverter circuit 192, and the ground GND is connected to the other input terminal of the inverter circuit 192. An input terminal of the inverter circuit 193 is connected to a VDDa terminal, and the input signal PDX is applied to the other input terminal of the inverter circuit 193. The input signal IDLEX is applied to an input terminal of the inverter circuit 194, and the ground GND is connected to the other input terminal of the inverter circuit 194. An input terminal of the inverter circuit 195 is connected to a VDDa terminal, and the input signal IDLE is applied to the other input terminal of the inverter circuit 195. Although not shown in FIG. 16, each of the inverter circuits 191, 192, 193, 194, and 195 is constituted by a series connection of a pMOS and an nMOS connected between a VDDa terminal and the ground GND, and the two inputs of each of the inverter circuits 191, 192, 193, 194, and 195 are respectively applied to the gates of the pMOS and the nMOS. The output terminals of the inverter circuits 191, 192, 193, 194, and 195 are respectively connected to terminals of the resistors R1 (or R2), R3, R4, R5, and R6, and the other terminals of the resistors R1 (or R2), R3, R4, R5, and R6 are connected to a node, so that the output signal TXOP is obtained from the node.

When the driver circuit 110a in the constructions of FIG. 1 or 8 is replaced with the driver circuit 110c of FIG. 15 or the driver circuit 110d of FIG. 16, the driver circuit 110b in the constructions of FIG. 1 or 8 is also replaced with a driver circuit which has a similar circuit construction to the driver circuit 110c or 110d.

4. Third Embodiment

The third embodiment is explained in detail below.

Figure 17:
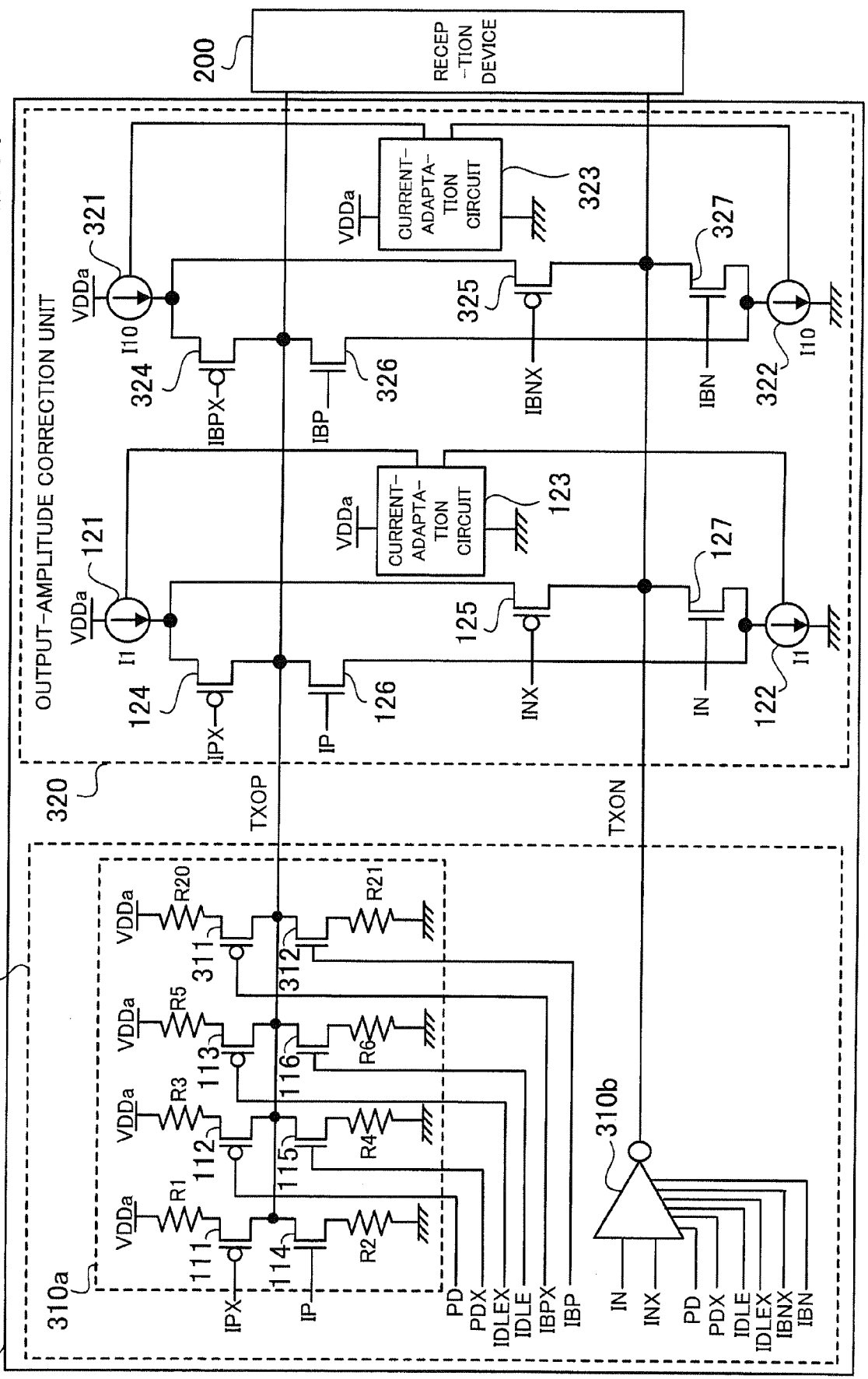
FIG. 17 is a diagram illustrating a circuit construction of a transmission device according to a third embodiment.

FIG. 17 is a diagram illustrating a circuit construction of a transmission device according to the third embodiment. In FIG. 17, the same elements as the elements in FIG. 1 respectively bear the same reference numbers. Therefore, the explanations on the same elements are not repeated unless necessary.

The transmission device 300 illustrated in FIG. 17 comprises a driver unit 310 and an output-amplitude correction unit 320, and realizes the functions of pre-emphasis and de-emphasis according to PCI Express. The input signals (as the boost signals) IBP, IBPX, IBN, and IBNX, as well as the input signals (as the main signals) IP, IPX, IN, and INX, are inputted into the driver unit 310 and the output-amplitude correction unit 320 in the transmission device 300 for generating and correcting pre-emphasis and de-emphasis signals.

The driver unit 310 comprises two driver circuits 310a and 310b. The driver circuits 310a and 310b make a resistance division of the power-supply voltage VDDa, and respectively output output signals TXOP and TXON.

The driver circuit 310a comprises a first part similar to the driver circuit 110 illustrated in FIG. 1 and a second part which receives the input signals IBP and IBPX and generates a pre-emphasis signal and a de-emphasis signal. The second part of the driver circuit 310a comprises a pMOS 311, an nMOS 312, and resistors R20 and R21. The input signal IBPX is applied to the gate of the pMOS 311, and the input signal IBP is applied to the gate of the nMOS 312. The resistor R20 is connected between a VDDa terminal and the source of the pMOS 311, and the resistor R21 is connected between the source of the nMOS 312 and the ground GND. The node between the drains of the pMOS 311 and the nMOS 312 is connected to the node between the drains of the pMOSs 111, 112, and 113 and the drains of the nMOSs 114, 115, and 116.

The driver circuit 310b has a similar circuit construction to the driver circuit 310a. The input signals IN, INX, IBNX, and IBN, instead of the input signals IPX, IP, IBPX, and IBP, are inputted into the driver circuit 310b.

The output-amplitude correction unit 320a comprises a first part which is constituted by the current sources 121 and 122, the current-adaptation circuit 123, the pMOSs 124 and 125, and the nMOSs 126 and 127 and similar to the output-amplitude correction unit 120 illustrated in FIG. 1, and a second part which is constituted by current sources 321 and 322, a current-adaptation circuit 323, pMOSs 324 and 325, and nMOSs 326 and 327 in a similar manner to the first part. The first part of the output-amplitude correction unit 320 is provided for correcting the output amplitudes corresponding to the input signals IPX, IP, INX, and IN (as the main signals), and the second part of the output-amplitude correction unit 320 is provided for correcting the pre-emphasis signal and the de-emphasis signal.

The input signals IBP, IBPX, IBN, and IBNX (as the boost signals), instead of the input signals IPX, IP, INX, and IN (as the main signals), are applied to the gates of the pMOSs 324 and 325 and the nMOSs 326 and 327. Specifically, the input signal IBPX is applied to the gate of the pMOS 324, the drain of which is connected to the signal line of the output signal TXOP. The input signal IBP is applied to the gate of the nMOS 326, the drain of which is also connected to the signal line of the output signal TXOP. The input signal IBNX is applied to the gate of the PMOS 325, the drain of which is connected to the signal line of the output signal TXON. The input signal IBN is applied to the gate of the nMOS 327, the drain of which is also connected to the signal line of the output signal TXON. Thus, the second part of the output-amplitude correction unit 320 corrects the pre-emphasis signal and the de-emphasis signal.

The transmission device 300 according to the third embodiment operates as follows.

During normal operation, the pair of the input signals IP and IPX inputted as the main signals into the driver circuit 310a and the pair of the input signals IN and INX inputted as the main signals into the driver circuit 310b constitute a differential input signal. Similarly, the pair of the input signals IBP and IBPX inputted as the main signals into the driver circuit 310a and the pair of the input signals IBN and IBNX inputted as the main signals into the driver circuit 310b constitute a differential input signal. The input signals IP and IPX inputted into the driver circuit 310a are identical logic signals, and the input signals IN and INX inputted into the driver circuit 310b are identical logic signals. In addition, the input signals IBP and IBPX inputted into the driver circuit 310a are identical logic signals, and the input signals IBN and IBNX inputted into the driver circuit 310b are identical logic signals.

Figure 18:
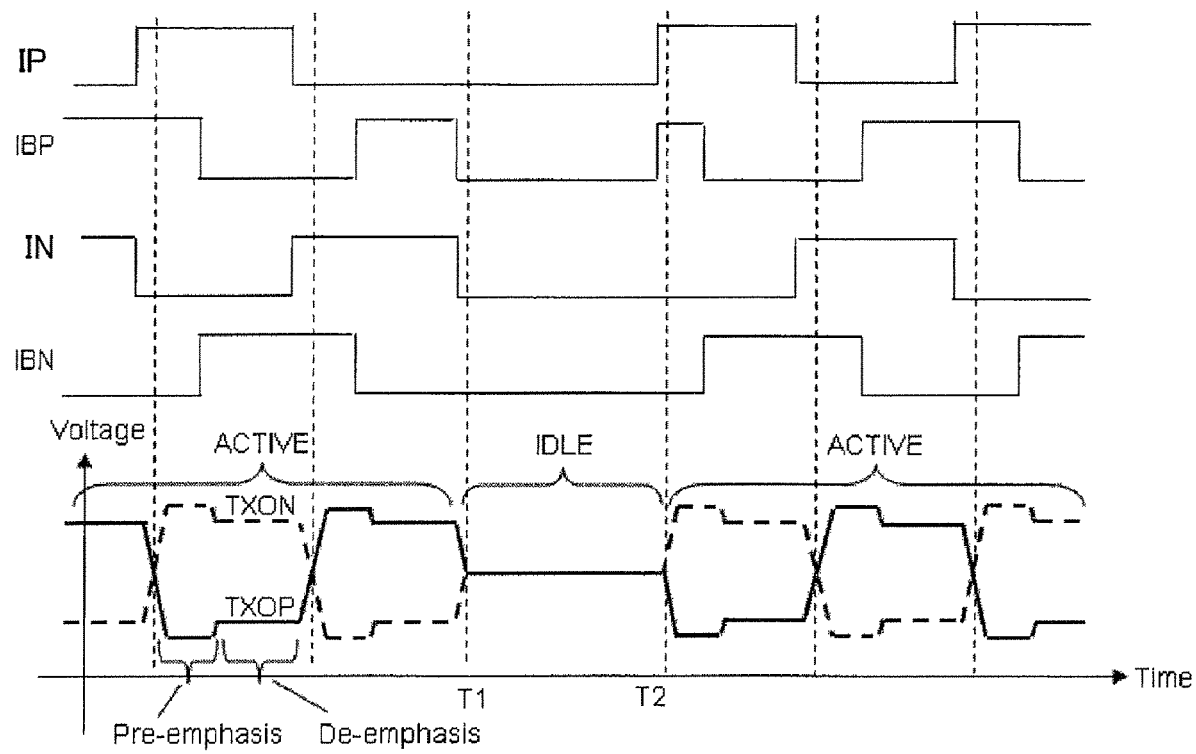
FIG. 18 is a diagram indicating examples of waveshapes in the transmission device according to the third embodiment.

FIG. 18 is a diagram indicating examples of waveshapes of the input signals IP, IBP, IN, and IBN, the output signals TXOP and TXON, the pre-emphasis signal, and the de-emphasis signal during normal operation (indicated by "ACTIVE") and idle operation (indicated by "IDLE") of the transmission device 300 according to the third embodiment. In FIG. 18, the ordinate corresponds to the voltage, and the abscissa corresponds to the time. As illustrated in FIG. 18, the transmission device 300 is in the idle state from time T1 to T2.

The pre-emphasis signal is outputted when the voltage levels of the input signals IP and IBP are identical, and the de-emphasis signal is outputted when the voltage levels of the input signals IP and IBP are different. For example, when the input signals IP and IPX are at the H level, the input signals IN and INX are at the L level. At this time, in the driver circuit 310a, the pMOS 111 is turned off, and the nMOS 114 is turned on. In addition, in order to generate the common-mode voltage, both of the pMOS 112 and the nMOS 115 are turned on by setting the input signal PD at the L level, and the input signal PDX at the H level, and both of the pMOS 113 and the nMOS 116 are turned off by setting the input signal IDLE at the L level, and the input signal IDLEX at the H level. Further, when the input signals IBP and IBPX (as the boost signals) are at the H level, and are identical to the input signals IP and IPX, the pMOS 311 is turned off, and the nMOS 312 is turned on, so that the level of the output signal TXOP is lowered (i.e., the pre-emphasis function is performed). On the other hand, when the input signals IBP and IBPX (as the boost signals) are at the L level, and are different from the input signals IP and IPX, the pMOS 311 is turned on, and the nMOS 312 is turned off, so that the level of the output signal TXOP is raised (i.e., the de-emphasis function is performed). Further, the output signal TXON is the inverse of the output signal TXOP, i.e., the output signal TXOP and the output signal TXON constitute a differential output.

On the other hand, the output-amplitude correction unit 320 corrects the amplitudes of the output signals TXOP and TXON by using the correction current I1 and the correction current I10 which are generated according to the variations in the power-supply voltage VDDa. The ratio between the magnitudes of the correction current I1 and the correction current I10 is maintained constant irrespectively of the power-supply voltage VDDa in order to maintain the pre-emphasis ratio constant.

For example, when the input signals IP and IPX are at the H level, and the input signals IN and INX are at the L level, in the output-amplitude correction unit 320, the pMOS 124 and the nMOS 127 are turned off, and the nMOS 126 and the pMOS 125 are turned on. At this time, the correction current I1 supplied from the current source 121 flows through the pMOS 125, and raises the voltage level of the output signal TXON, which is at the H level. In addition, the correction current I1 drawn by the current source 122 flows through the nMOS 126, and lowers the voltage level of the output signal TXOP, which is at the L level. Thus, the amplitudes of the output signals TXOP and TXON are increased.

Further, when the input signals IBP and IBPX are at the same level as the input signals IP and IPX, for example, when the input signals IBP, IBPX, IP, and IPX are at the H level and the input signals IBN and IBNX are at the L level (i.e., when the pre-emphasis function is performed), the pMOS 324 and the nMOS 327 are turned off, and the nMOS 326 and the pMOS 325 are turned on. At this time, the correction current I10 supplied from the current source 321 flows through the pMOS 325, and raises the voltage level of the output signal TXON, which is at the H level. In addition, the correction current I10 drawn by the current source 322 flows through the nMOS 326, and lowers the voltage level of the output signal TXON, which is at the L level. Thus, the amplitudes of the output signals TXOP and TXON are further increased.

On the other hand, when the input signals IBP and IBPX are at the different level from the input signals IP and IPX, for example, when the input signals IBP and IBPX are at the L level and the input signals IP, IPX, IBN and IBNX are at the H level (i.e., when the de-emphasis function is performed), the pMOS 324 and the nMOS 327 are turned on, and the nMOS 326 and the pMOS 325 are turned off. At this time, the correction current I10 supplied from the current source 321 flows through the pMOS 324, and raises the voltage level of the output signal TXOP, which is at the L level. In addition, the correction current I10 drawn by the current source 322 flows through the nMOS 327, and lowers the voltage level of the output signal TXON, which is at the H level. Thus, the amplitudes of the output signals TXOP and TXON are decreased.

During normal operation, the amplitudes of the output signals TXOP and TXON and the common-mode voltage are determined by the power-supply voltage VDDa, the magnitudes of resistance of the resistors R1, R2, R3, R4, R20, and R21 in the driver unit 310, the magnitudes of resistance of the resistors R7 and R8 in the reception device 200, the magnitude of the correction current I1 generated by the current sources 121 and 122, and the magnitude of the correction current I10 generated by the current sources 321 and 322. In order to satisfy the requirements for the return loss specified by various standards, for example, it is necessary to satisfy the equations, 1/50=1/R7=1/R8=1/R1+1/R3+1/R4+1/R20, in the case where the magnitudes of resistance of the resistors R7 and R8 are 50 ohm, the magnitudes of resistance of the resistors R1 and R2 are identical, and the magnitudes of resistance of the resistors R20 and R21, represented by R20 and R21, are identical. At this time, it is further necessary that the values R1, R2, R3, R4, R20, and R21 include the on-resistance of the pMOSs 111, 112, and 311 and the nMOSs 114, 115, and 312.

In the power-down state or in the idle state, the operations performed in the transmission device 300 according to the third embodiment are similar to the operations performed in the transmission device 100 according to the first embodiment except that the PMOS 311 and the nMOS 312 in the driver circuit 310a and the pMOSs 324 and 325 and the nMOSs 326 and 327 in the output-amplitude correction unit 320 are turned off.

In the case where one of the current-adaptation circuits 123, 123a, and 123d illustrated in FIGS. 4, 7, and 14 is used as the current-adaptation circuit 323 in the output-amplitude correction unit 320, the variations in the output amplitudes can be suppressed even when the power-supply voltage VDDa varies during the pre-emphasis or de-emphasis operations. At this time, the variations in the output amplitudes caused by the variations in the temperature and the manufacturing process can also be suppressed, and the output amplitudes can be finely adjusted.

When the ratio between the magnitudes of the correction current I1 and the correction current I10 is maintained constant irrespectively of the power-supply voltage VDDa, the pre-emphasis ratio can be maintained constant. In other words, when the ratio between the magnitudes of the correction current I1 and the correction current I10 is changed, the pre-emphasis ratio varies.

In the output-amplitude correction unit 320, it is possible to exchange the pair of the input signals IPX and IP and the pair of the input signals INX and IN, and the pair of the input signals IBPX and IBP and the pair of the input signals IBNX and IBN, as in the driver circuit 100a according to the second embodiment. That is, it is possible to modify the output-amplitude correction unit 320 so that the pair of the input signals IPX and IP are applied to the pMOS 125 and the nMOS 127 which are connected to the signal line of the output signal TXON (instead of the pMOS 124 and the nMOS 126 which are connected to the signal line of the output signal TXOP), the pair of the input signals INX and IN are applied to the pMOS 124 and the nMOS 126 which are connected to the signal line of the output signal TXOP (instead of the pMOS 125 and the nMOS 127 which are connected to the signal line of the output signal TXON), the pair of the input signals IBPX and IBP are applied to the pMOS 325 and the nMOS 327 (instead of the pMOS 324 and the nMOS 326), and the pair of the input signals IBNX and IBN are applied to the pMOS 324 and the nMOS 326 (instead of the pMOS 325 and the nMOS 327). In this case, each of the current-adaptation circuits 123 and 323 (which are used for generating the correction current I1 and the current I10 for suppressing the variations in the output amplitudes caused by the variations in the power-supply voltage VDDa) can be realized by using one of the circuit constructions illustrated in FIGS. 12 and 13.

As explained above, the transmission device 300 according to the third embodiment having the functions of pre-emphasis and de-emphasis according to PCI Express can also suppress the variations in the output amplitudes caused by the variations in the power-supply voltage VDDa, the temperature, and the manufacturing process. That is, the transmission device 300 according to the third embodiment has similar advantages to the transmission devices 100 and 100a according to the first and second embodiments.

Figure 19:
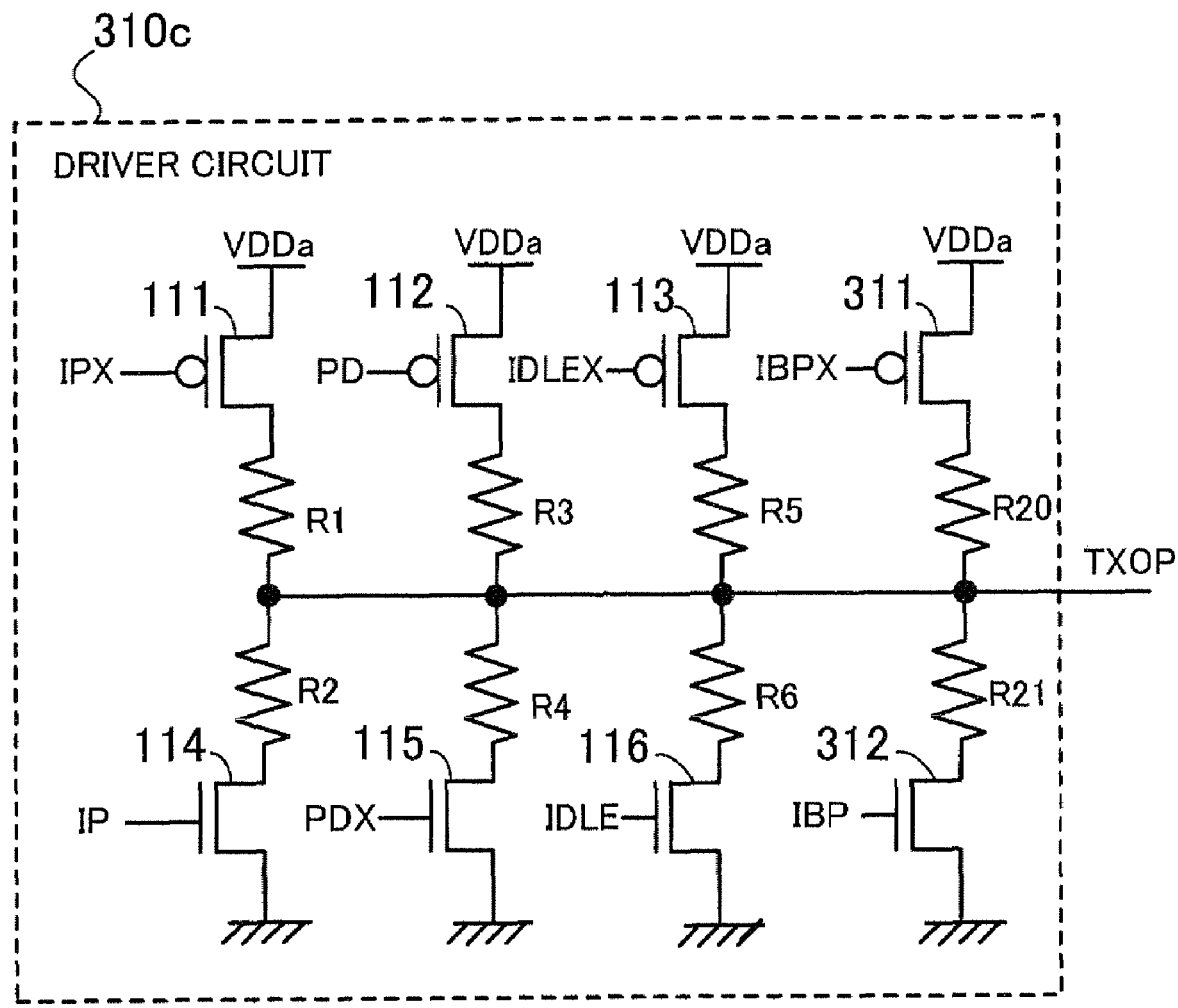
FIG. 19 is a diagram illustrating a circuit construction of a first alternative example of a driver circuit in the transmission device according to the third embodiment.
Figure 20:
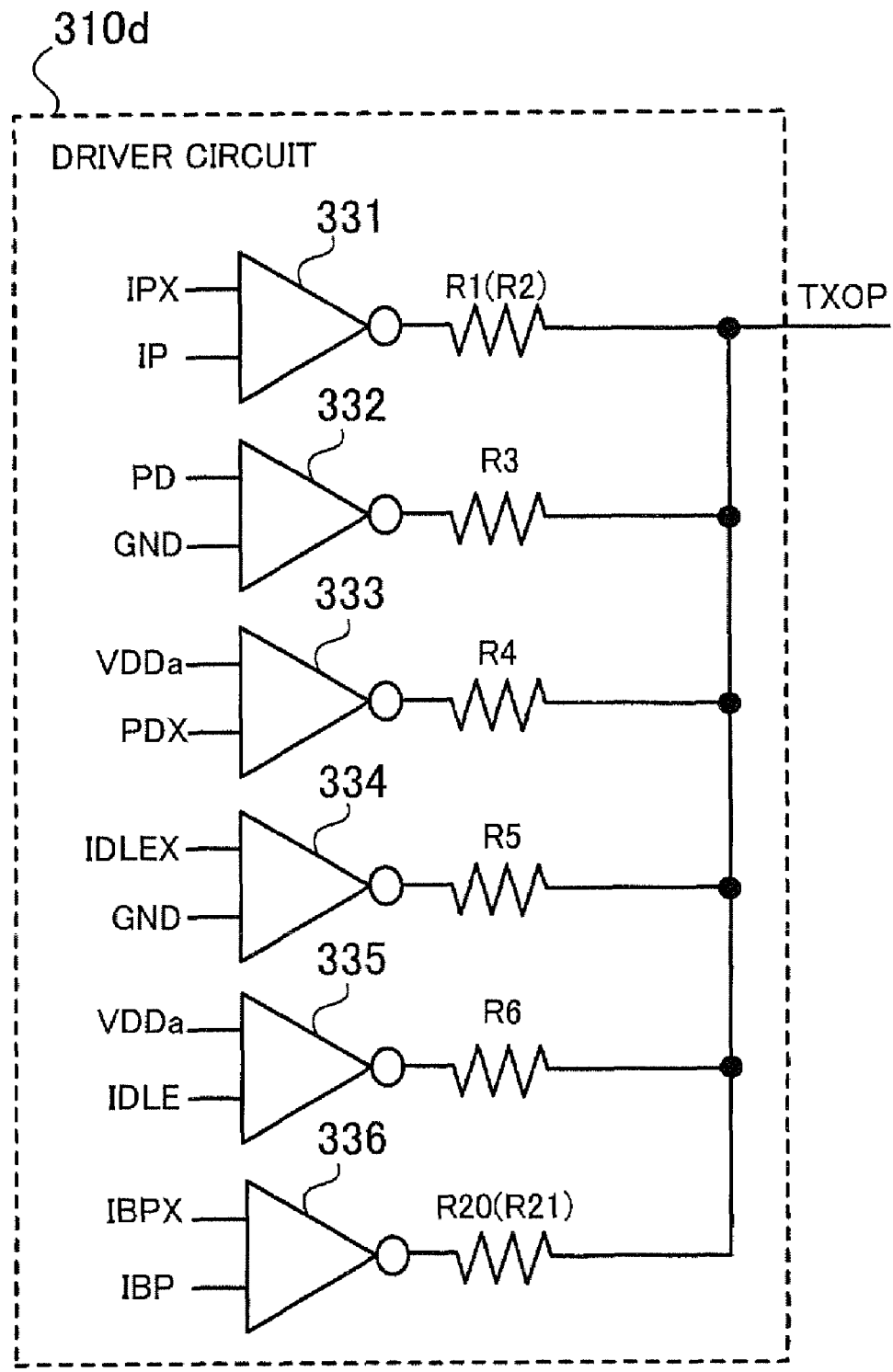
FIG. 20 is a diagram illustrating a circuit construction of a second alternative example of a driver circuit in the transmission device according to the third embodiment.

The circuit constructions of the driver circuits 310a and 310b may not be necessarily as illustrated in FIG. 17, and may have the circuit constructions as illustrated in FIGS. 19 and 20, which show circuit constructions of first and second alternatives of the driver circuit 310a in the transmission devices 300 according to the third embodiment. The circuit constructions illustrated in FIGS. 19 and 20 are equivalent circuits to the driver circuit 310a illustrated in FIG. 17.

The driver circuit 310c illustrated in FIG. 19 is different from the driver circuit 110a illustrated in FIG. 1 in that the positions of the resistors R1, R3, R5, and R20 and the pMOSs 111, 112, 113, and 311 are exchanged, and the positions of the resistors R2, R4, R6, and R21 and the nMOSs 114, 115, 116, and 312 are exchanged.

On the other hand, the driver circuit 310d illustrated in FIG. 20 comprises inverter circuits 331, 332, 333, 334, 335, and 336, and the resistors R1 (or R2), R3, R4, R5, R6, and R20 (or R21). The input signals IPX and IP are applied to the input terminals of the inverter circuit 331. The input signal PD is applied to an input terminal of the inverter circuit 332, and the ground GND is connected to the other input terminal of the inverter circuit 332. An input terminal of the inverter circuit 333 is connected to a VDDa terminal, and the input signal PDX is applied to the other input terminal of the inverter circuit 333. The input signal IDLEX is applied to an input terminal of the inverter circuit 334, and the ground GND is connected to the other input terminal of the inverter circuit 334. An input terminal of the inverter circuit 335 is connected to a VDDa terminal, and the input signal IDLE is applied to the other input terminal of the inverter circuit 335. The input signals IBPX and IBP are applied to the input terminals of the inverter circuit 336. Although not shown in FIG. 20, each of the inverter circuits 331, 332, 333, 334, 335, and 336 is constituted by a series connection of a pMOS and an nMOS connected between a VDDa terminal and the ground GND, and the two inputs of each of the inverter circuits 331, 332, 333, 334, 335, and 336 are respectively applied to the gates of the pMOS and the nMOS The output terminals of the inverter circuits 331, 332, 333, 334, 335, and 336 are respectively connected to terminals of the resistors R1 (or R2), R3, R4, R5, R6, and R20 (or R21), and the other terminals of the resistors R1 (or R2), R3, R4, R5, R6, and R20 (or R21) are connected to a node, so that the output signal TXOP is obtained from the node.

When the driver circuit 310a in the constructions of FIG. 17 is replaced with the driver circuit 310c of FIG. 18 or the driver circuit 310d of FIG. 20, the driver circuit 310b in the constructions of FIG. 17 is also replaced with a driver circuit which has a similar circuit construction to the driver circuit 310c or 310d.

5. Fourth Embodiment

The fourth embodiment is explained in detail below.

Figure 21:
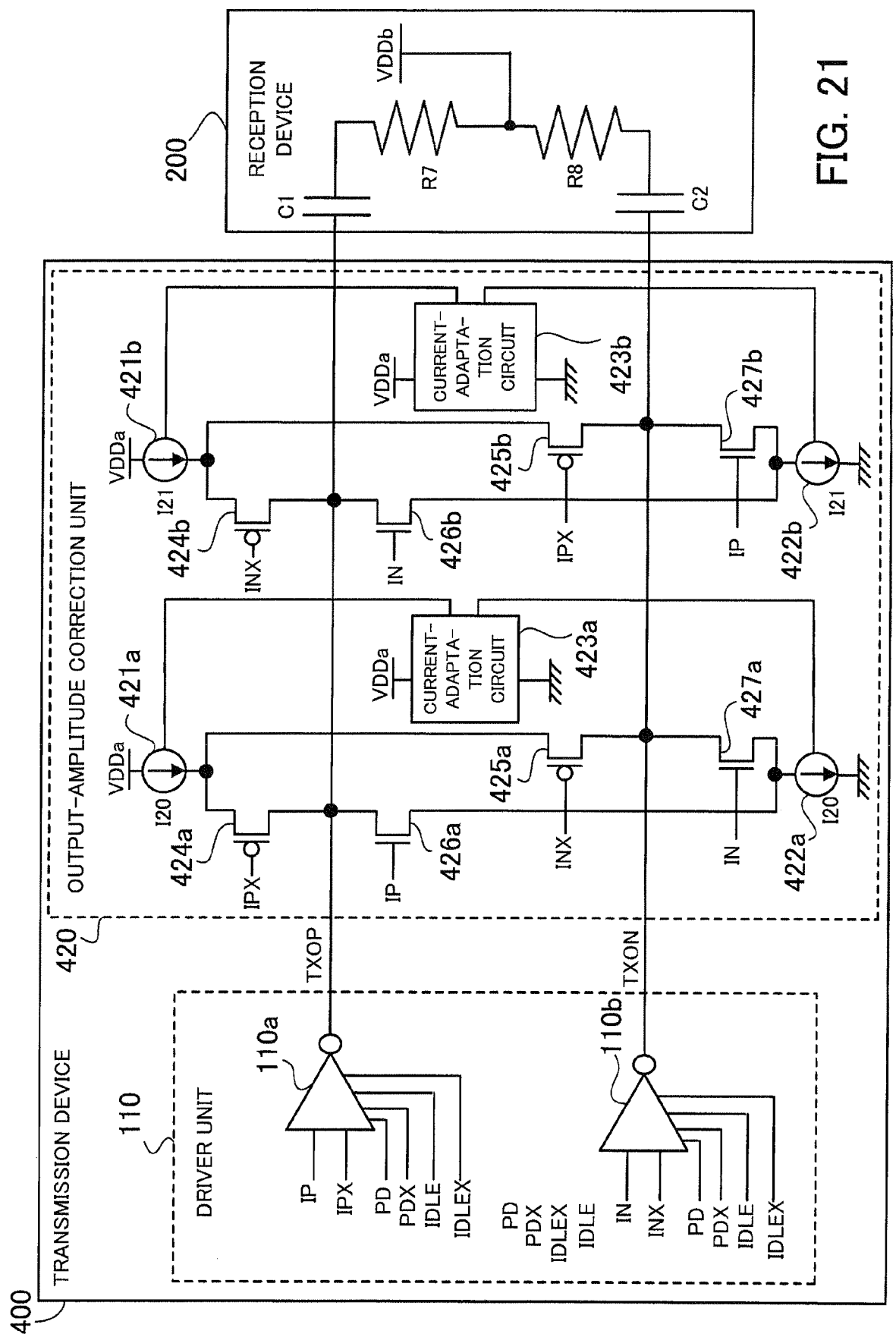
FIG. 21 is a diagram illustrating circuit constructions of a transmission device and a reception device according to a fourth embodiment.

FIG. 21 is a diagram illustrating a circuit construction of a transmission device according to the fourth embodiment. In FIG. 21, the same elements as the elements in FIG. 1 respectively bear the same reference numbers.

The transmission device 400 illustrated in FIG. 21 comprises the driver unit 110 and an output-amplitude correction unit 420, and the output-amplitude correction unit 420 has a circuit construction in which the output-amplitude correction unit 120 (in the transmission device 100 according to the first embodiment) and the output-amplitude correction unit 120a (in the transmission device 100a according to the second embodiment) are combined. Specifically, in the output-amplitude correction unit 420, a first circuit corresponding to the output-amplitude correction unit 120 is constituted by current sources 421a and 422a, a current-adaptation circuit 423a, pMOSs 424a and 425a, and nMOSs 426a and 427a, and a second circuit corresponding to the output-amplitude correction unit 120a is constituted by current sources 421b and 422b, a current-adaptation circuit 423b, pMOSs 424b and 425b, and nMOSs 426b and 427b.

In the output-amplitude correction unit 420 in the transmission device 400 according to the fourth embodiment, in order to correct the output amplitudes, the correction current I20 is generated by the current sources 421a and 422a under control of the current-adaptation circuit 423a, and the correction current I21 is generated by the current sources 421b and 422b under control of the current-adaptation circuit 423b.

Figure 22:
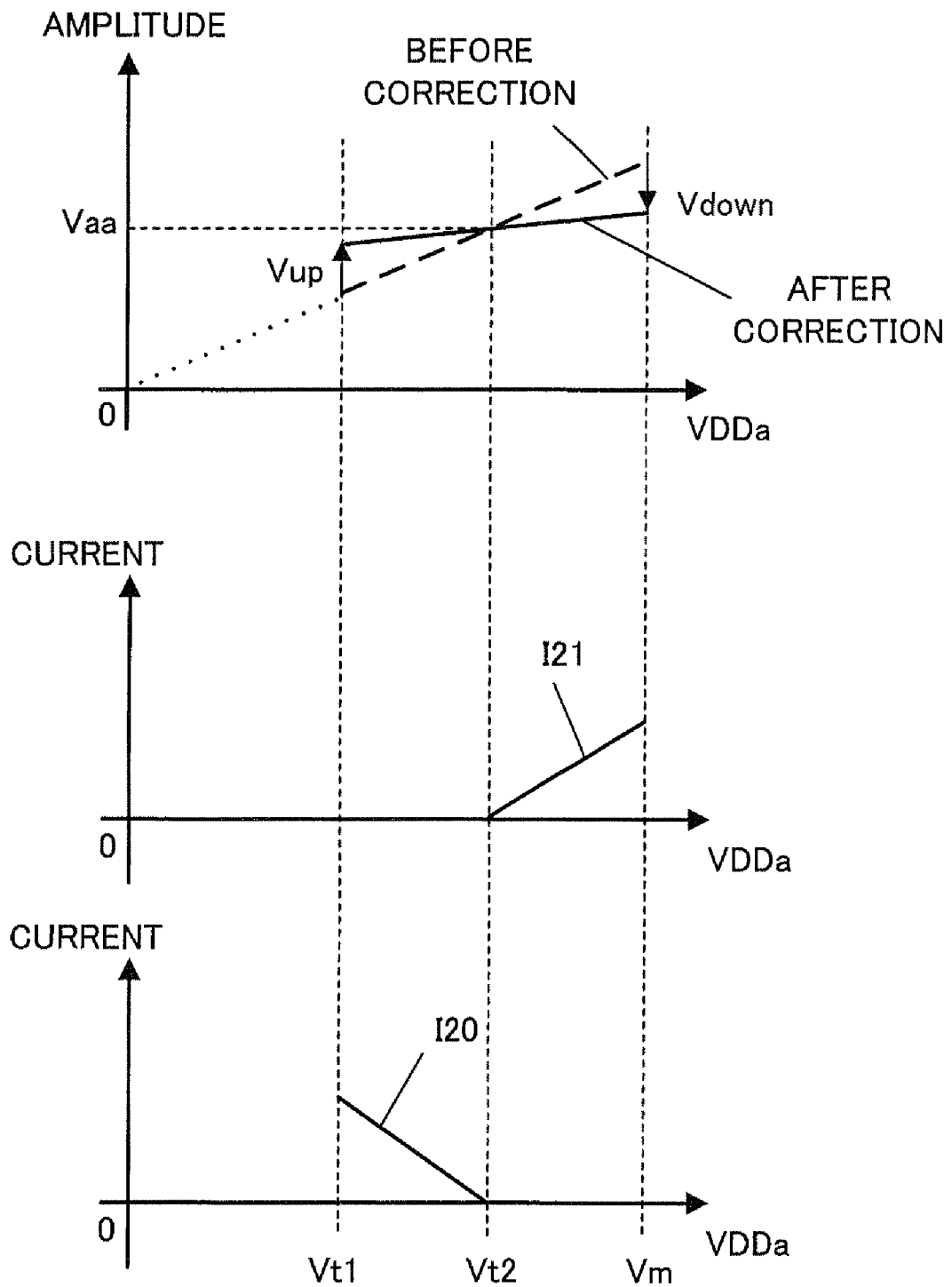
FIG. 22 is a diagram indicating an example of a characteristic, with respect to the power-supply voltage, of correction current generated by current-adaptation circuits and current sources in the fourth embodiment, and an example of an output amplitude of the transmission device before and after correction.

FIG. 22 is a diagram indicating an example of a characteristic, with respect to the power-supply voltage, of the correction current I20 and the correction current I21 generated by the current-adaptation circuits 423a and 423b and the current sources 421a, 422a, 421b, and 422b in the transmission device 400 according to the fourth embodiment, and an example of an amplitude of an output signal (representing each of the output signals TXOP and TXON) of the transmission device before and after correction. The abscissas in the upper, middle, and lower parts of FIG. 22 correspond to the power-supply voltage VDDa, and the ordinates in the upper, middle, and lower parts of FIG. 22 respectively correspond to the amplitude of the output signal, the magnitude of the correction current I21, and the magnitude of the correction current I20.

The range of the power-supply voltage VDDa from Vt1 to Vm is centered at the value Vt2 at which the voltage level of the amplitude of the output signal equals the target voltage level Vaa. A relationship between the correction current I20 and the power-supply voltage VDDa in the range from Vt1 to Vt2 is indicated in the lower part of FIG. 22, and a relationship between the correction current I21 and the power-supply voltage VDDa in the range from Vt2 to Vm is indicated in the middle part of FIG. 22. In the upper part of FIG. 22, the amplitude of the output signal in the range of the power-supply voltage VDDa from Vt to Vm before the correction (i.e., before the output signal in the range of the power-supply voltage VDDa from Vt to Vm is inputted into the output-amplitude correction unit 420) is indicated by the dashed line, and the amplitude of the output signal in the range of the power-supply voltage VDDa from Vt to Vm after the correction (i.e., after the output signal is outputted from the output-amplitude correction unit 420) is indicated by the solid line.

In the range of the power-supply voltage VDDa from Vt1 to Vt2, the output-amplitude correction unit 420 in the transmission device 400 generates the correction current I20 which linearly decreases with increase in the power-supply voltage VDDa under the control of the current-adaptation circuit 423a, and the output amplitude is corrected (increased) by using the correction current I20. As explained before with reference to FIG. 3, when the output amplitude is corrected by using the correction current which linearly decreases with increase in the power-supply voltage VDDa, the output amplitude is increased by Vup in the correction at the power-supply voltage VDDa=Vt1, is then increased in the correction by an amount which decreases with increase in the power-supply voltage VDDa beyond Vt1, and reaches the target voltage level Vaa at the power-supply voltage VDDa=Vt2. The current-adaptation circuit 423a can be realized by one of the circuit constructions illustrated in FIGS. 4 and 14.

In the range of the power-supply voltage VDDa from Vt2 to Vm, the output-amplitude correction unit 420 in the transmission device 400 generates the correction current I21 which linearly increases with increase in the power-supply voltage VDDa under the control of the current-adaptation circuit 423b, and the output amplitude is corrected by using the correction current I21. As explained before with reference to FIG. 9, when the output amplitude is corrected (reduced) by using the correction current which linearly increases with increase in the power-supply voltage VDDa, the output amplitude is decreased by an amount which increases with increase in the power-supply voltage VDDa beyond Vt2, and decreased by Vdown in the correction at the power-supply voltage VDDa=Vm. The current-adaptation circuit 423b can be realized by one of the circuit constructions illustrated in FIGS. 12 and 13.

Further, it is possible to equalize the values Vup and Vdown by equalizing the absolute values of the gradients of the correction current I20 and the correction current I21.

Since the transmission device 400 is constructed as above, it is possible to suppress the variations in the output amplitudes caused by the variations in the power-supply voltage VDDa, and make the output amplitudes vary within the range which is centered at the target amplitude Vaa and satisfies various standards.

In addition, since each of the correction current I20 and the correction current I21 is generated in response to variations of the power-supply voltage VDDa in the first or second half of the range from Vt1 to Vm by the current sources 421a and 422a or by the current sources 421b and 422b. Therefore, the maximum magnitude of each of the correction current I20 and the correction current I21 is half of the maximum magnitude of the correction current I1 in the first to third embodiments which is generated in response to variations of the power-supply voltage VDDa in the full range from Vt to Vm. Thus, according to the fourth embodiment, the load imposed on the current sources 421a, 422a, 421b, and 422b can be reduced, so that the dimensions of the current sources 421a, 422a, 421b, and 422b can also be reduced.

Further, it is possible to finely adjust the amplitudes of the output signals TXOP and TXON in the case where the transmission device 400 generates the correction current I20 and the correction current I21 in the following manner under control of the current-adaptation circuits 423a and 423b.

Figure 23:
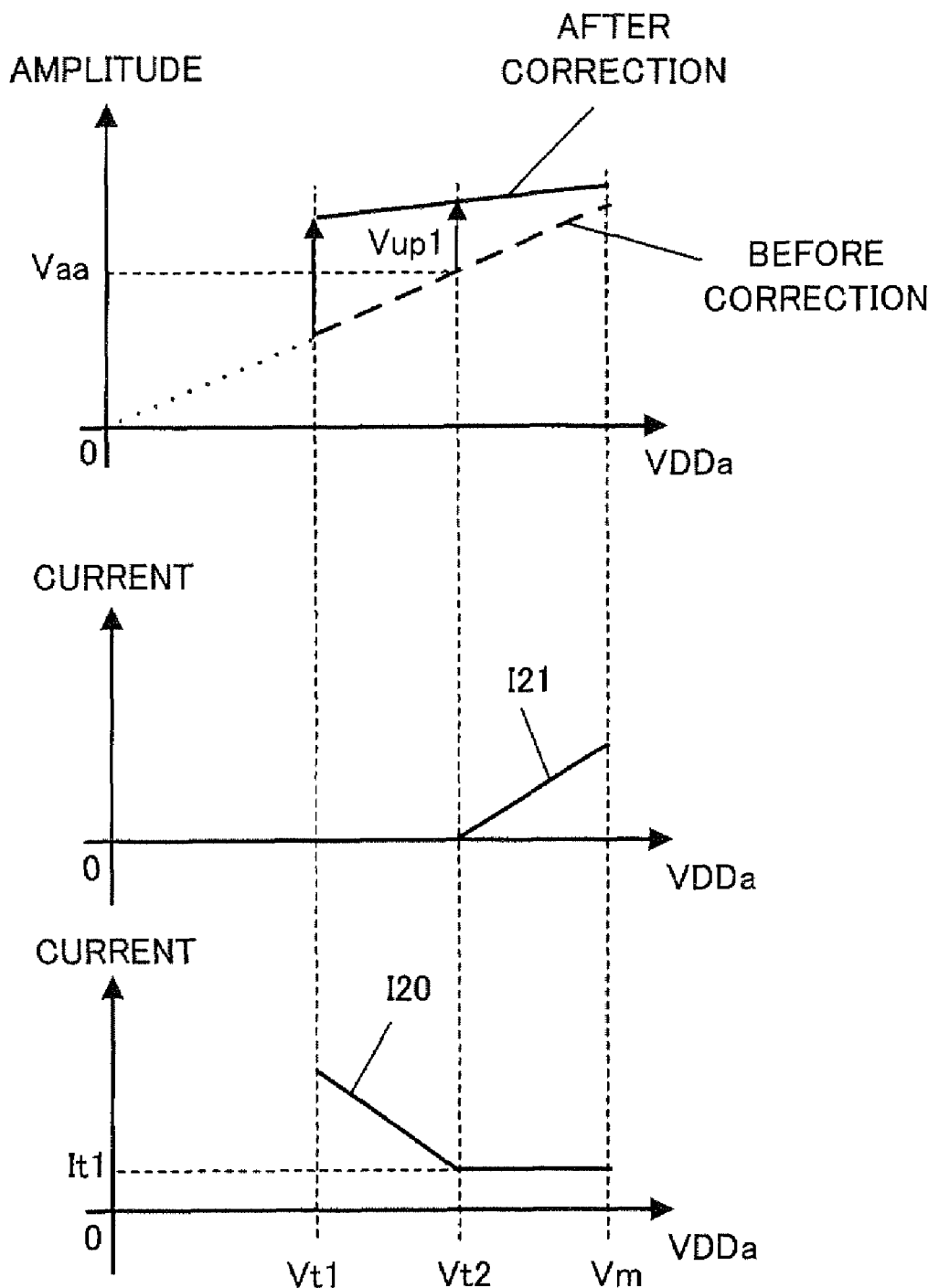
FIG. 23 is a diagram indicating an example of a characteristic, with respect to the power-supply voltage, of correction current generated by the current-adaptation circuits and the current sources in the fourth embodiment for increasing output amplitudes beyond a target amplitude, and an example of an output amplitude of the transmission device before and after correction.

FIG. 23 is a diagram indicating an example of characteristics, with respect to the power-supply voltage, of the correction current I20 and the correction current I21 generated by the current-adaptation circuits 423a and 423b and the current sources 421a, 422a, 421b, and 422b in the transmission device 400 according to the fourth embodiment for finely adjusting output amplitudes and suppressing variations in the output amplitudes caused by variations in the power-supply voltage, and an example of the amplitude of an output signal (representing each of the output signals TXOP and TXON) of the transmission device before and after correction. The abscissas in the upper, middle, and lower parts of FIG. 23 correspond to the power-supply voltage VDDa, and the ordinates in the upper, middle, and lower parts of FIG. 23 respectively correspond to the amplitude of the output signal, the magnitude of the correction current I21, and the magnitude of the correction current I20.

In the range of the power-supply voltage VDDa from Vt1 to Vm, as indicated in the lower part of FIG. 23, the magnitude of the correction current I20 in the example of FIG. 23 is uniformly greater than the correction current I20 in the example of FIG. 22 by the constant offset current It1. In the range of the power-supply voltage VDDa from Vt2 to Vm, the correction current I21 in the example of FIG. 23 (as indicated in the middle part of FIG. 23) is identical to the correction current I21 in the example of FIG. 22. Therefore, in the case where the correction current I20 and the correction current I21 have the characteristics as indicated in the lower and middle parts of FIG. 23, the output amplitude has the characteristic as indicated in the upper part of FIG. 23, so that it is possible to suppress the variations in the output amplitudes caused by the variations in the power-supply voltage VDDa. In addition, it is also possible to finely adjust the output amplitude on the upper side of the target voltage level Vaa.

Figure 24:
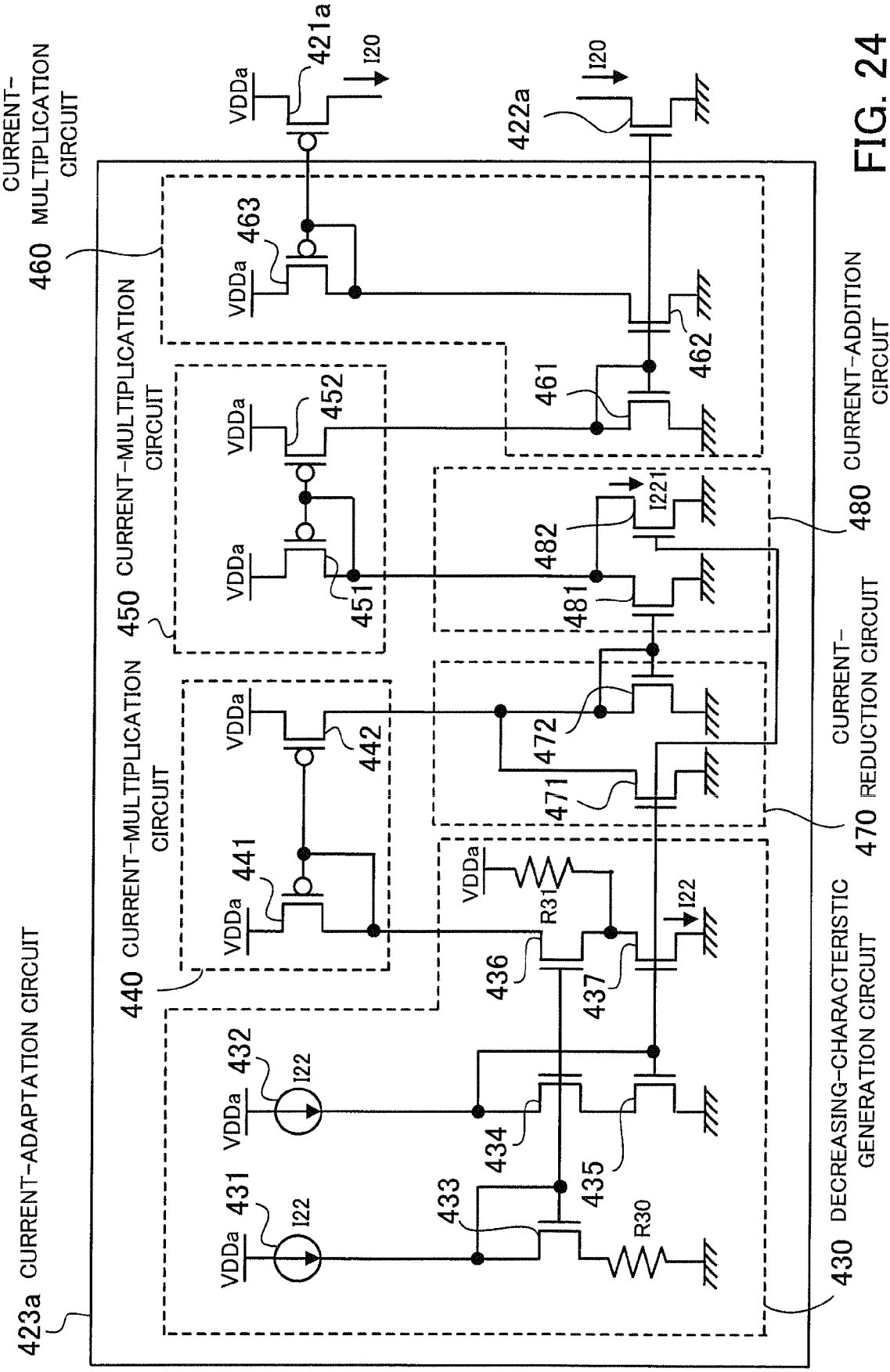
FIG. 24 is a diagram illustrating circuit constructions of a first example of one of the current-adaptation circuits and a pair of current sources in the transmission device according to the fourth embodiment, which reduce the magnitude of the correction current as the power-supply voltage increases.

The current-adaptation circuit 423a which generates the correction current I20 increased by the constant offset current It1 as above can be realized by, for example, the circuit construction illustrated in FIG. 24.

FIG. 24 is a diagram illustrating circuit constructions of a first example 423a of the current-adaptation circuit and the current sources 421a and 422a in the transmission device 400 according to the fourth embodiment, which reduce the magnitude of the correction current I20 as the power-supply voltage VDDa increases.

The current-adaptation circuit 423a illustrated in FIG. 24 comprises a decreasing-characteristic generation circuit 430, current-multiplication circuits 440, 450, and 460, a current-reduction circuit 470, and a current-addition circuit 480. In the example of FIG. 24, the current sources 421a and 422a are respectively realized by a pMOS and an nMOS.

The decreasing-characteristic generation circuit 430 is constituted by the current sources 431 and 432, the nMOSs 433, 434, 435, 436, and 437, and the resistors R30 and R31, which are connected in the same manner as the corresponding elements in the decreasing-characteristic generation circuit 130 illustrated in FIG. 4.

The current-multiplication circuit 440 is a current-mirror circuit which makes an adjustment of the current outputted from the series connection of the nMOSs 436 and 437 in the decreasing-characteristic generation circuit 430 according to the mirror ratio of the current-mirror circuit 440. The current-mirror circuit 440 is constituted by one or more pMOSs arranged on each of the input and output sides (in a similar manner to the current-mirror circuit constituted by the pMOSs 141-1 to 141-m and the pMOSs 142-1 to 142-M in FIG. 4), although only the pMOSs 441 and 442 are representatively indicated on the input and output sides in the current-multiplication circuit 440 in FIG. 24 for simple illustration.

The current-multiplication circuit 450 is a current-mirror circuit which makes an adjustment of the current outputted from the current-addition circuit 480 according to the mirror ratio of the current-mirror circuit 450. The current-mirror circuit 450 is constituted by one or more pMOSs arranged on each of the input and output sides in a similar manner to the current-mirror circuit 440, although only the pMOSs 451 and 452 are representatively indicated on the input and output sides in the current-multiplication circuit 450 in FIG. 24 for simple illustration.

The current-multiplication circuit 460 contains nMOSs being representatively indicated by nMOSs 461 and 462 and constituting a first current-mirror circuit, and one or more pMOSs being representatively indicated by a pMOS 463 and constituting a second current-mirror circuit. The first current-mirror circuit is constituted by one or more nMOSs (representatively indicated by the nMOS 461) arranged on the input side, and one or more nMOSs (representatively indicated by the nMOS 462) and the current source 422a, which are arranged on the output side. The second current-mirror circuit is constituted by one or more pMOSs (representatively indicated by the pMOS 463) arranged on the input side and the current source 421a, which is arranged on the output side. The drains of the one or more nMOSs (representatively indicated by the nMOS 461) arranged on the input side in the current-multiplication circuit 460 are connected to the drains of the one or more pMOSs (representatively indicated by the pMOS 452) arranged on the output side in the current-multiplication circuit 450. Thus, the current-multiplication circuit 460 makes an adjustment of the current outputted from the current-addition circuit 450 according to the mirror ratios of the first and second current-mirror circuits in the current-multiplication circuit 460, and controls the current sources 421a and 422a so as to generate the current I20.

The current-reduction circuit 470 comprises nMOSs 471 and 472, and the current-addition circuit 480 comprises nMOSs 481 and 482.

The gate of the nMOS 471 is connected to the gates of the nMOSs 435 and 437 in the decreasing-characteristic generation circuit 430, and the nMOS 471 and the nMOS 435 constitute a first current-mirror circuit. The gate of the nMOS 472 is connected to the gate of the nMOS 481 and the drain of the nMOS 472, and the nMOS 472 and the nMOS 481 constitute a second current-mirror circuit. The drains of the nMOSs 471 and 472 are connected to the drains of the one or more pMOSs (representatively indicated by the pMOS 442) arranged on the output side in the current-multiplication circuit 440. Therefore, in the current-reduction circuit 470, the constant current flowing through the nMOS 471 is drawn out of the current outputted from the current-multiplication circuit 440, and the reduced current is transferred to the current-addition circuit 480 through the second current-mirror circuit constituted by the nMOSs 472 and 481.

In addition, the gate of the nMOS 482 is connected to the gates of the nMOSs 435 and 437 in the decreasing-characteristic generation circuit 430 and the nMOS 471 in the current-reduction circuit 470, and the drains of the nMOSs 481 and 482 are connected to the drains of the one or more pMOSs (representatively indicated by the pMOS 451) arranged on the input side in the current-multiplication circuit 450. Therefore, constant current I221 (corresponding to the current It1 indicated in FIG. 23) flows through the nMOS 482, and the sum of the current flowing through the nMOSs 481 and the current I221 flowing through the nMOS 482 is outputted to the current-multiplication circuit 450 (i.e., drawn from the drains of the one or more pMOSs representatively indicated by the pMOS 451 and arranged on the input side in the current-multiplication circuit 450).

Since the current-addition circuit 480 adds the constant offset current I221 to the output of the current-addition circuit 470 in the current-adaptation circuit 423a, the current-adaptation circuit 423a and the current sources 421a and 422a can generate the correction current I20 having the characteristic as indicated in the lower part of FIG. 23.

Figure 25:
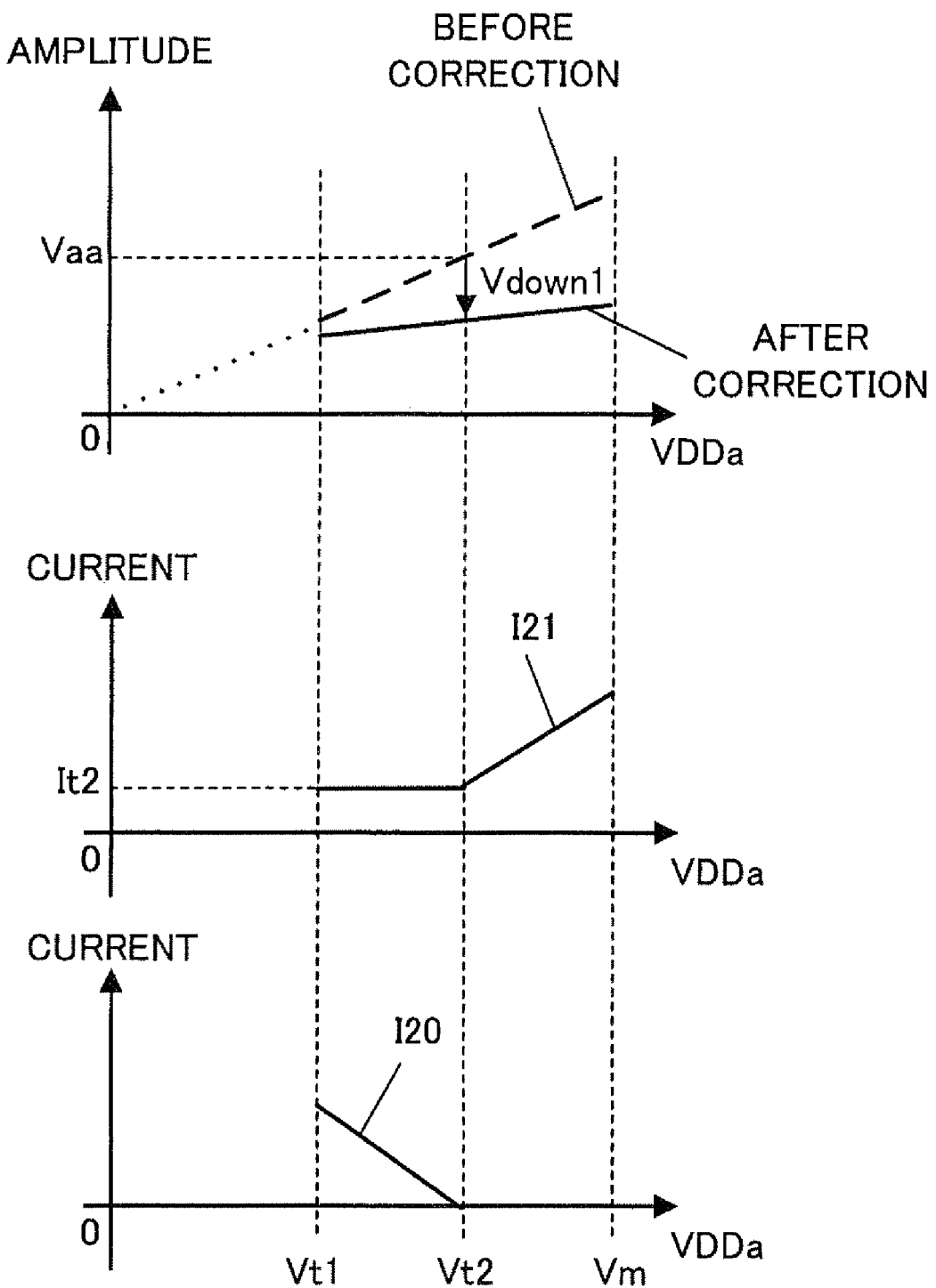
FIG. 25 is a diagram indicating an example of a characteristic, with respect to the power-supply voltage, of correction current generated by the current-adaptation circuit and the current sources in the fourth embodiment for decreasing the output amplitudes below the target amplitude, and an example of an output amplitude of the transmission device before and after correction.

FIG. 25 is a diagram indicating an example of a characteristic, with respect to the power-supply voltage, of the correction current I20 and the current I21 generated by the current-adaptation circuits 423a and 423b and the current sources 421a, 422a, 421b, and 422b in the transmission device 400 according to the fourth embodiment for decreasing the output amplitudes below the target amplitude, and an example of the amplitude of an output signal (representing each of the output signals TXOP and TXON) of the transmission device before and after correction. The abscissas in the upper, middle, and lower parts of FIG. 25 correspond to the power-supply voltage VDDa, and the ordinates in the upper, middle, and lower parts of FIG. 25 respectively correspond to the amplitude of the output signal, the magnitude of the correction current I21, and the magnitude of the correction current I20.

In the range of the power-supply voltage VDDa from Vt1 to Vm, as indicated in the middle part of FIG. 25, the magnitude of the correction current I21 in the example of FIG. 25 is uniformly greater than the correction current I21 in the example of FIG. 22 by the constant offset current It2. In the range of the power-supply voltage VDDa from Vt1 to Vt2, the correction current I20 in the example of FIG. 25 (as indicated in the lower part of FIG. 25) is identical to the correction current I20 in the example of FIG. 22. Therefore, in the case where the correction current I20 and the correction current I21 have the characteristics as indicated in the lower and middle parts of FIG. 25, the output amplitude has the characteristic as indicated in the upper part of FIG. 25, so that it is possible to suppress the variations in the output amplitudes caused by the variations in the power-supply voltage VDDa. In addition, it is also possible to finely adjust the output amplitude on the lower side of the target voltage level Vaa.

Figure 26:
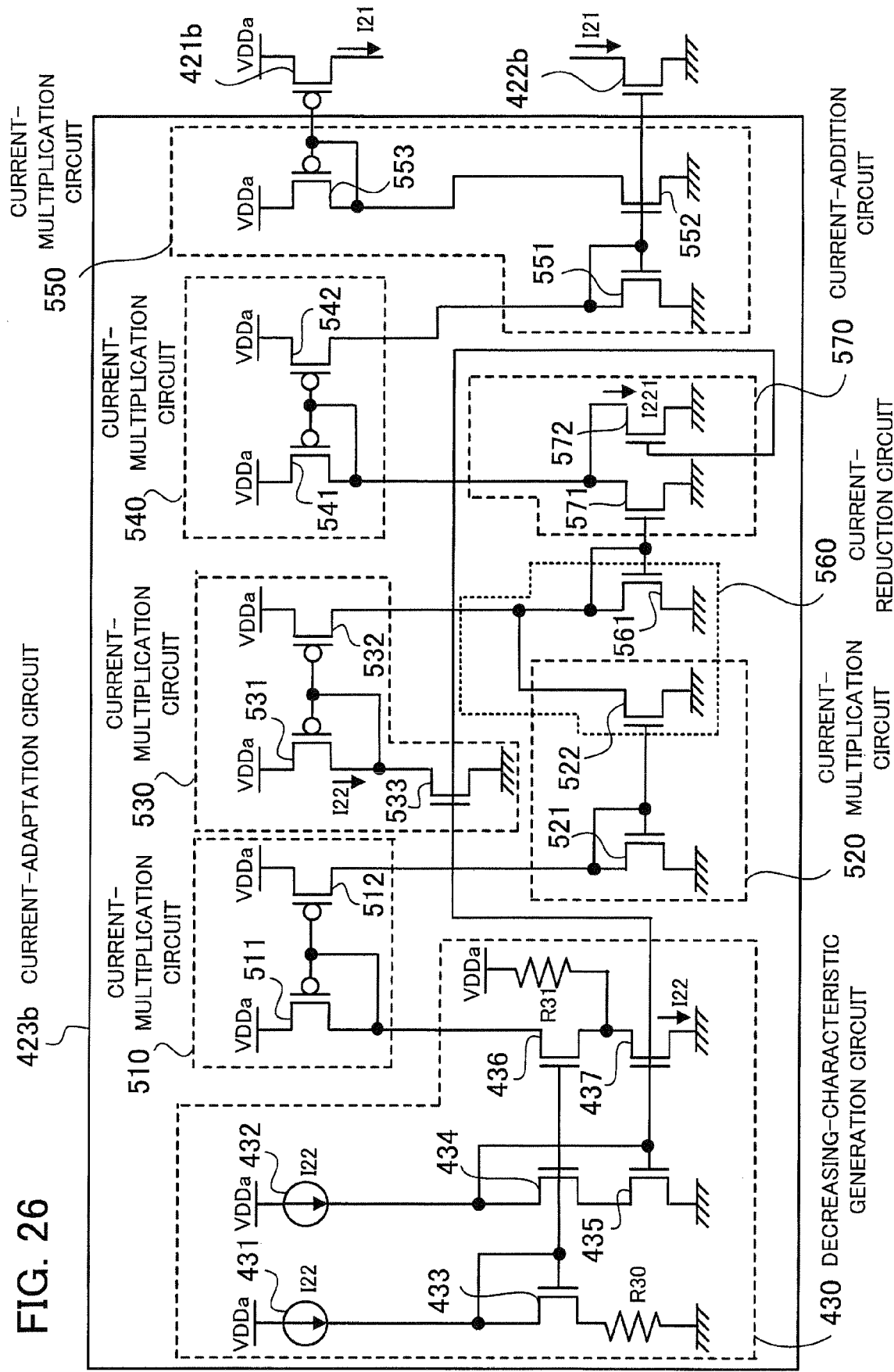
FIG. 26 is a diagram illustrating circuit constructions of a second example of one of the current-adaptation circuits and a pair of current sources in the transmission device according to the fourth embodiment, which increase the magnitude of the correction current as the power-supply voltage increases.
Figure 27:
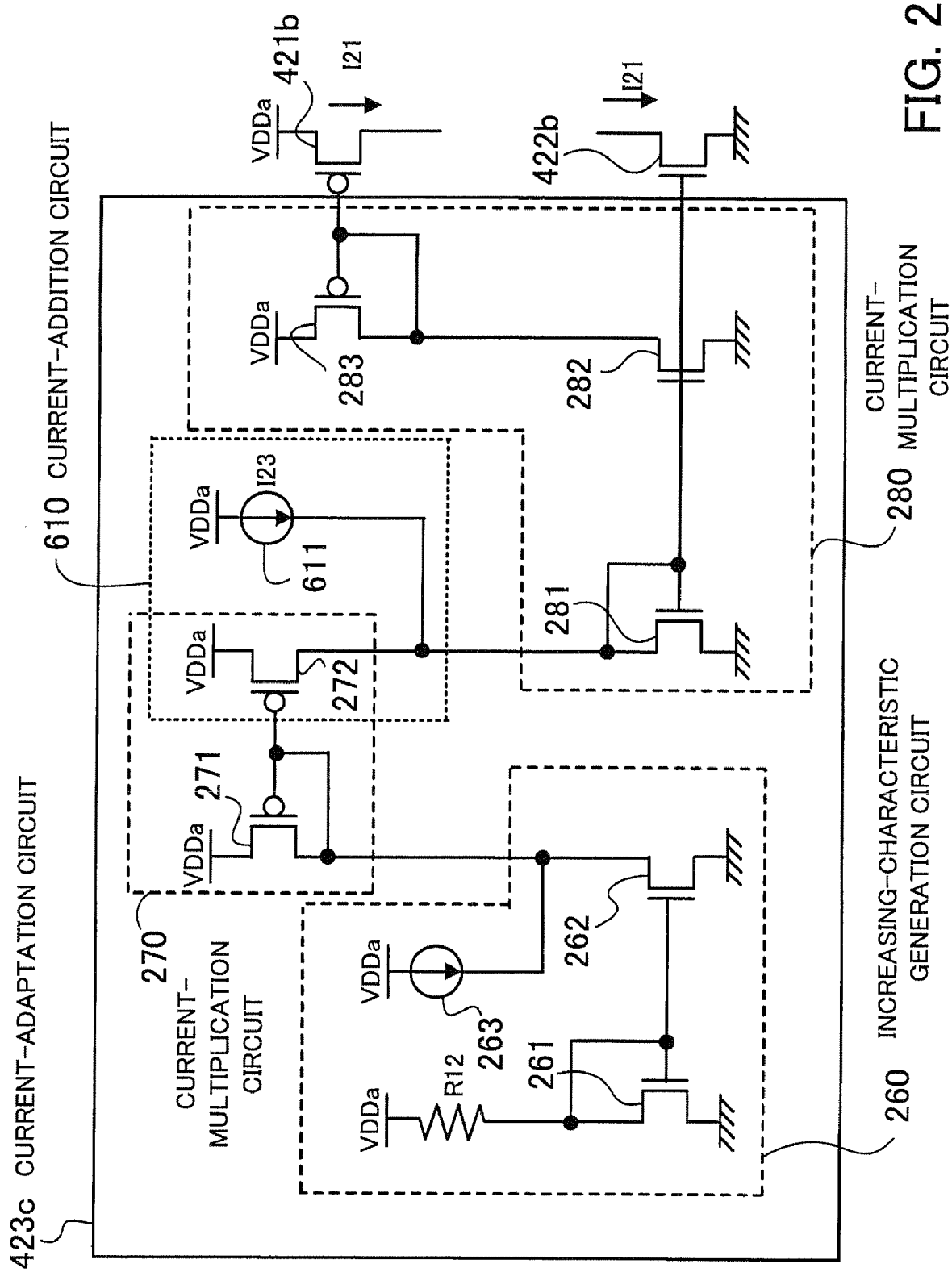
FIG. 27 is a diagram illustrating circuit constructions of a third example of one of the current-adaptation circuits and a pair of current sources in the transmission device according to the fourth embodiment, which increase the magnitude of the correction current as the power-supply voltage increases.

The current-adaptation circuit 423b which makes the current sources 421b and 422b generate the correction current I21 increased by the constant offset current It2 as above can be realized by, for example, the circuit construction illustrated in FIG. 26 or 27.

FIG. 26 is a diagram illustrating circuit constructions of a second example 423b of the current-adaptation circuit and the current sources 421b and 422b in the transmission device 400 according to the fourth embodiment, which increase the magnitude of the correction current I21 as the power-supply voltage VDDa increases. In FIG. 26, the same elements as the elements in FIG. 24 respectively bear the same reference numbers.

The current-adaptation circuit 423b illustrated in FIG. 26 comprises a decreasing-characteristic generation circuit 430, current-multiplication circuits 510, 520, 530, 540, and 550, a current-reduction circuit 560, and a current-addition circuit 570. In the example of FIG. 26, the current sources 421b and 422b are respectively realized by a pMOS and an nMOS.

The decreasing-characteristic generation circuit 430 has the same construction as the decreasing-characteristic generation circuit 430 illustrated in FIG. 24.

The current-multiplication circuit 510 is a current-mirror circuit which makes an adjustment of the current outputted from the series connection of the nMOSs 436 and 437 in the constant-current generation circuit 430 according to the mirror ratio of the current-mirror circuit 510. The current-mirror circuit 510 is constituted by one or more pMOSs arranged on each of the input and output sides (in a similar manner to the current-mirror circuit constituted by the pMOSs 141-1 to 141-m and the pMOSs 142-1 to 142-M in FIG. 4), although only the pMOSs 511 and 512 are representatively indicated on the input and output sides in the current-multiplication circuit 510 in FIG. 26 for simple illustration.

The current-multiplication circuit 520 is a current-mirror circuit which makes an adjustment of the current outputted from the current-multiplication circuit 510 according to the mirror ratio of the current-mirror circuit 520. The current-mirror circuit 520 is constituted by one or more nMOSs arranged on each of the input and output sides in a similar manner to the current-mirror circuit 510, although only the nMOSs 521 and 522 are representatively indicated on the input and output sides in the current-multiplication circuit 520 in FIG. 26 for simple illustration.

The current-multiplication circuit 530 contains a first current-mirror circuit constituted by one or more pMOSs arranged on the input side and representatively indicated by the pMOS 531 and one or more pMOSs arranged on the output side and representatively indicated by the pMOS 532. The current-multiplication circuit 530 also contains an nMOS 533. The gates of the nMOS 435 in the decreasing-characteristic generation circuit 430 and the nMOS 533 in the current-multiplication circuit 530 are connected, and the nMOSs 435 and 533 constitute a second current-mirror circuit. The drain of the nMOS 533 is connected to the drains of the one or more pMOSs on the input side and representatively indicated by the pMOS 531. Thus, the current-multiplication circuit 530 makes an adjustment of the current outputted from the decreasing-characteristic generation circuit 430 through the above second current-mirror circuit, according to the mirror ratio of the first current-mirror circuit in the current-multiplication circuit 530.

The current-multiplication circuit 540 is a current-mirror circuit which makes an adjustment of the current outputted from the current-addition circuit 570 according to the mirror ratio of the current-mirror circuit 540. The current-mirror circuit 540 is constituted by one or more pMOSs arranged on each of the input and output sides in a similar manner to the current-mirror circuit 510, although only the pMOSs 541 and 542 are representatively indicated on the input and output sides in the current-multiplication circuit 540 in FIG. 26 for simple illustration.

The current-multiplication circuit 550 contains nMOSs being representatively indicated by nMOSs 551 and 552 and constituting a first current-mirror circuit, and one or more pMOSs being representatively indicated by a pMOS 553 and constituting a second current-mirror circuit. The first current-mirror circuit is constituted by one or more nMOSs (representatively indicated by the nMOS 551) arranged on the input side, and one or more nMOSs (representatively indicated by the nMOS 552) and the current source 422b, which are arranged on the output side. The second current-mirror circuit is constituted by one or more pMOSs (representatively indicated by the pMOS 553) arranged on the input side and the current source 421b, which is arranged on the output side. The drains of the one or more nMOSs (representatively indicated by the nMOS 551) arranged on the input side in the current-multiplication circuit 550 are connected to the drains of the one or more pMOSs (representatively indicated by the pMOS 542) arranged on the output side in the current-multiplication circuit 540. Thus, the current-multiplication circuit 550 makes an adjustment of the current outputted from the current-addition circuit 540 according to the mirror ratios of the first and second current-mirror circuits in the current-multiplication circuit 550, and controls the current sources 421*b* and 422*b* so as to generate the current I21.

The current-reduction circuit 560 is realized by the nMOS 522 and an nMOS 561, and the current-addition circuit 570 is realized by nMOSs 571 and 572.

The drain of the nMOS 522 in the current-multiplication circuit 520 and the drain of the nMOS 561 in the current-reduction circuit 560 are connected to the drains of the one or more pMOSs arranged on the output side and representatively indicated by the pMOS 532 in the current-multiplication circuit 530, so that the current flowing through the nMOS 522 is drawn out of the current outputted from the current-multiplication circuit 530, and the reduced current flows through the nMOS 561. The gates of the nMOS 561 and the nMOS 571 in the current-addition circuit 570 are connected, and the nMOSs 561 and 571 constitute a current-mirror circuit, so that the reduced current flowing through the nMOS 561 is transferred to the nMOS 571.

In the current-addition circuit 570, the gate of the nMOS 572 is connected to the gates of the nMOSs 435 and 437 in the decreasing-characteristic generation circuit 430 and the nMOS 533 in the current-multiplication circuit 530, and the drains of the nMOSs 571 and 572 are connected to the drains of the one or more pMOSs (representatively indicated by the nMOS 541) arranged on the input side in the current-multiplication circuit 540. Therefore, the constant current I221 (corresponding to the current It2 indicated in FIG. 25) flows through the nMOS 572, and the sum of the current flowing through the nMOSs 571 and the current I221 flowing through the nMOS 572 is outputted to the current-multiplication circuit 540 (i.e., drawn from the drains of the one or more pMOSs representatively indicated by the nMOS 541 and arranged on the input side in the current-multiplication circuit 540).

Since the current-addition circuit 570 adds the constant offset current I221 to the output of the current-addition circuit 560 in the current-adaptation circuit 423*b*, the current-adaptation circuit 423*b* can generate the correction current I21 having the characteristic as indicated in the middle part of FIG. 25.

Alternatively, the current-adaptation circuit 423*b* may be realized by the circuit construction illustrated in FIG. 27, which is a diagram illustrating circuit constructions of a third example 423*c* of the current-adaptation circuit and the current sources 421*b* and 422*b* in the transmission device 400 according to the fourth embodiment, which increase the magnitude of the correction current I21 as the power-supply voltage increases. In FIG. 27, the same elements as the elements in FIG. 13 respectively bear the same reference numbers, and the explanations on the same elements are not repeated.

The current-adaptation circuit 423*c* illustrated in FIG. 27 comprises an increasing-characteristic generation circuit 260, current-multiplication circuits 270 and 280, and a current-addition circuit 610.

The current-addition circuit 610 is realized by the pMOS 272 in the current-multiplication circuit 270 and a current source 611, and adds the current I23 generated by the current source 611 to the current flowing from the drain of the pMOS 272 to the drain of the nMOS 281 in the current-multiplication circuit 280. That is, the current I23 generated in the current-addition circuit 610 is added by the current-addition circuit 610 to the current outputted from the current-multiplication circuit 270 to the current-multiplication circuit 280.

Thus, the current-adaptation circuit 423*c* and the current sources 421*b* and 422*b* can generate the correction current I21 having the characteristic as indicated in the middle part of FIG. 25.

6. Fifth Embodiment

The fifth embodiment is explained in detail below.

Figure 28:
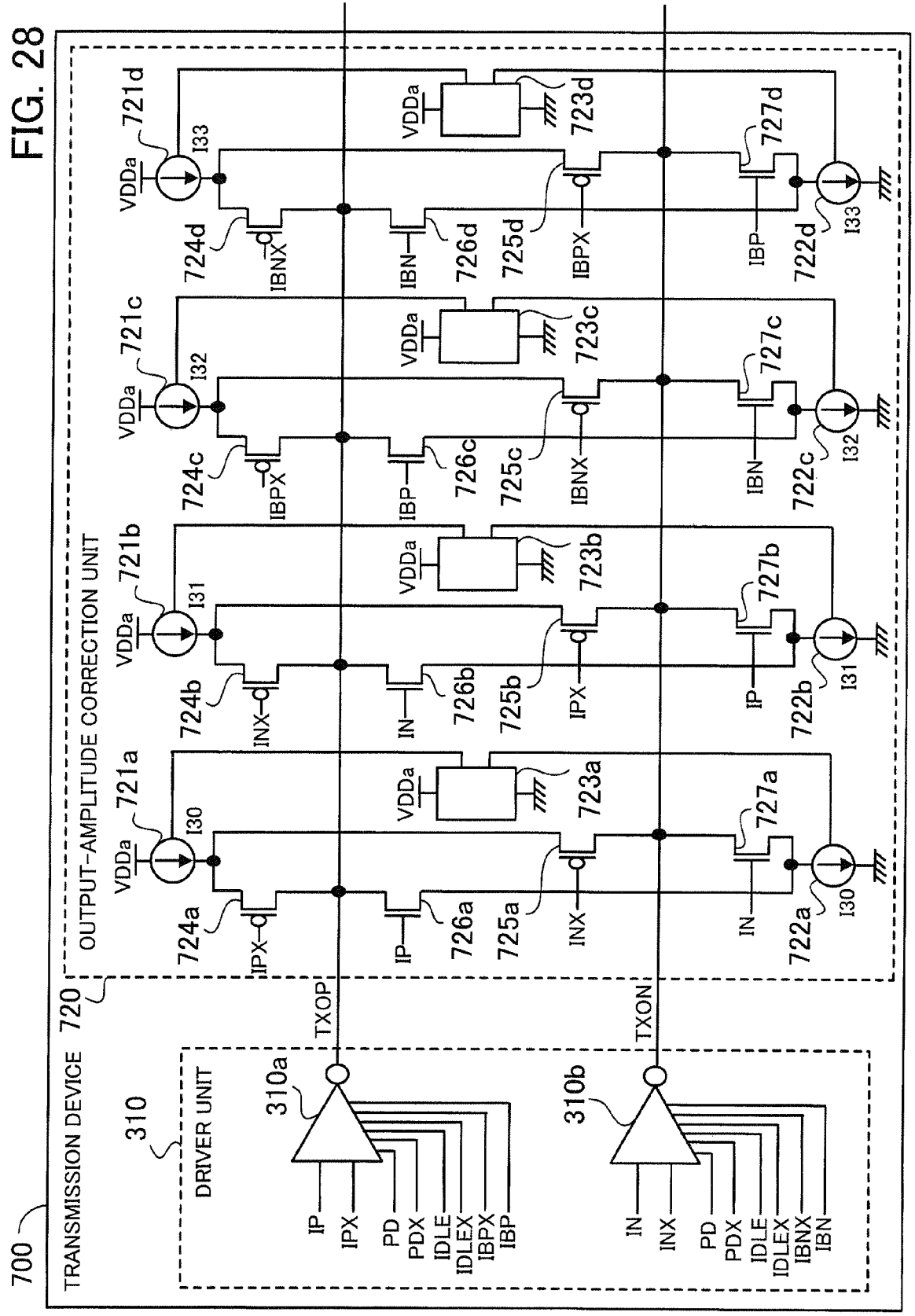
FIG. 28 is a diagram illustrating a circuit construction of a transmission device according to a fifth embodiment.
Figure 29:
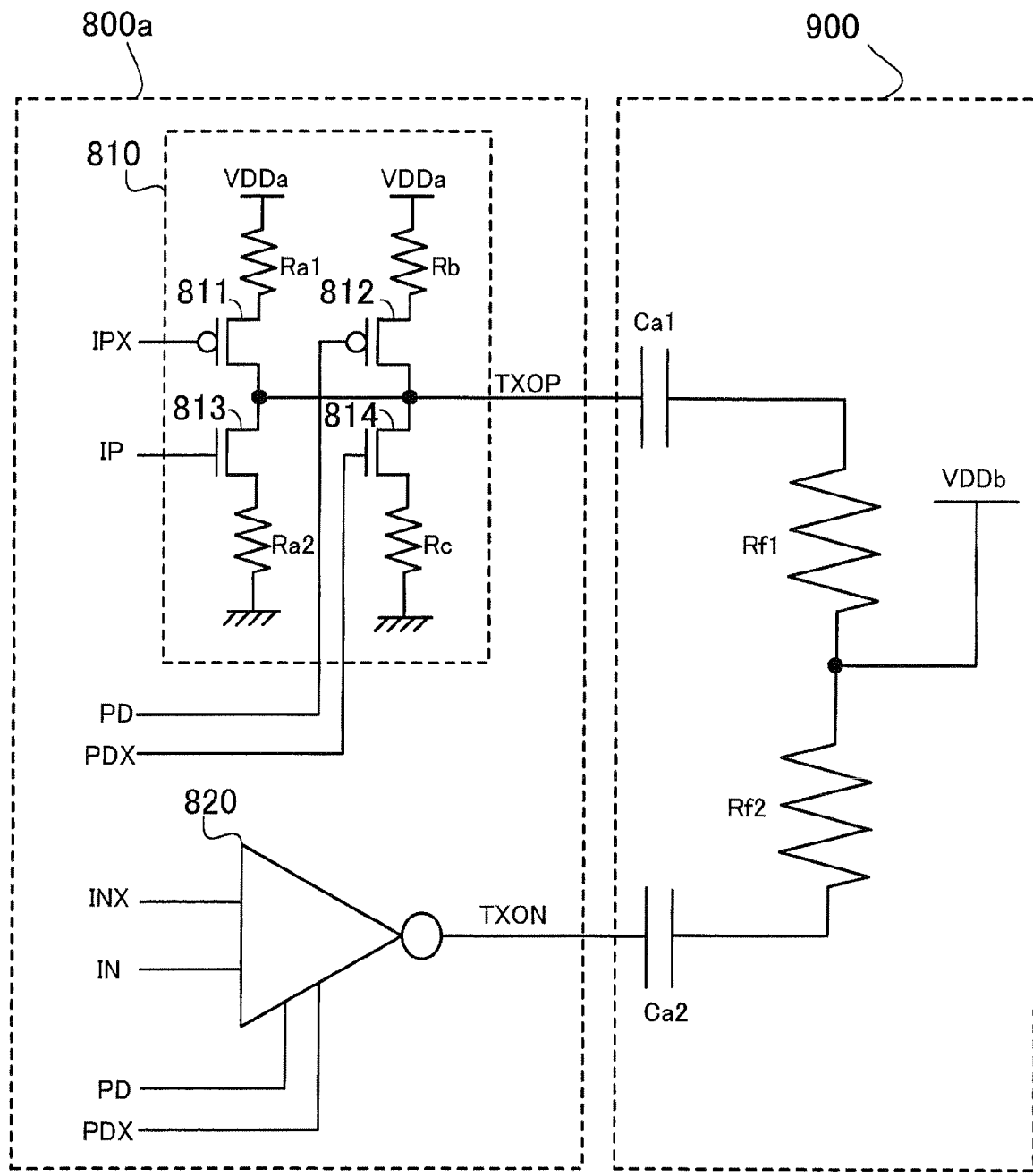
FIG. 29 is a diagram illustrating circuit constructions of a conventional transmission device and a conventional reception device.
Figure 30:
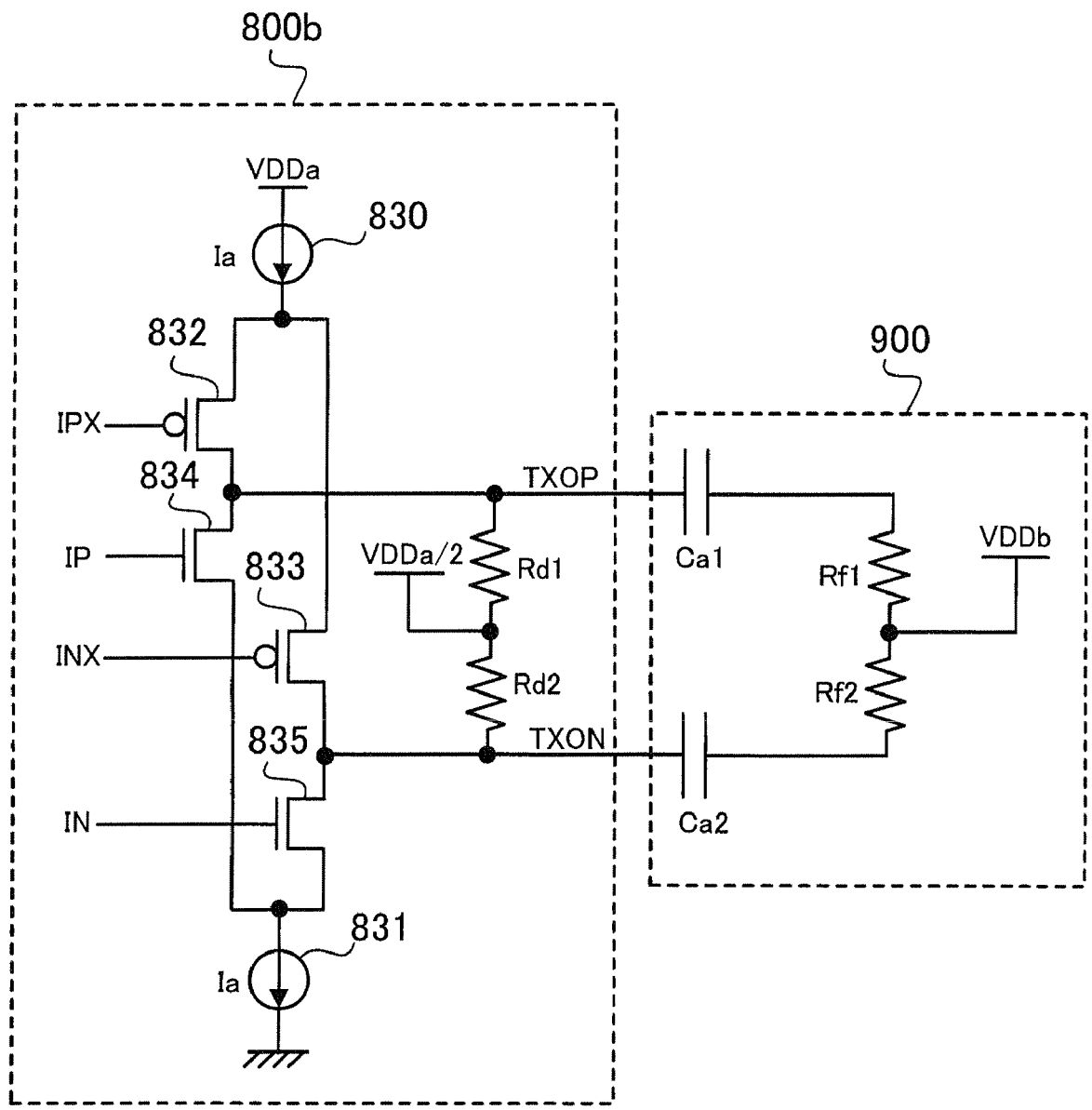
FIG. 30 is a diagram illustrating a circuit construction of another conventional transmission device together with the conventional reception device.
Figure 31:
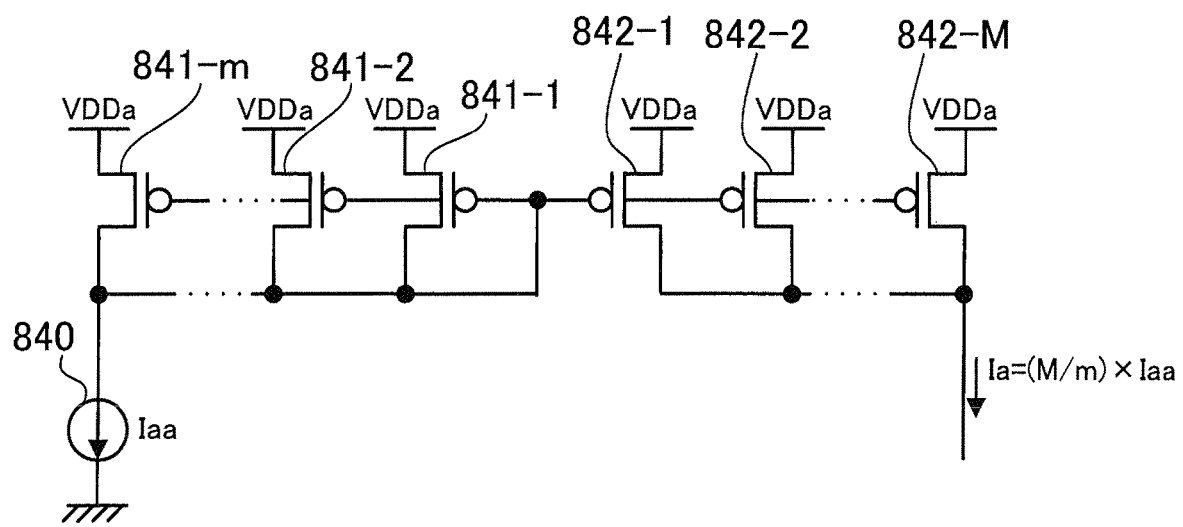
FIG. 31 is a diagram illustrating an example of a current mirror circuit used in a current source.

FIG. 28 is a diagram illustrating a circuit construction of a transmission device according to the fifth embodiment. In FIG. 28, the same elements as the elements in FIGS. 17 and 21 respectively bear the same reference numbers, and the explanations on the same elements are not repeated.

In the transmission device 700 according to the fifth embodiment, the features of the third and fourth embodiments are combined. Specifically, the transmission device 700 comprises the driver unit 310 and an output-amplitude correction unit 720. The output-amplitude correction unit 720 comprises first to fourth circuits. The first circuit is constituted by current sources 721*a* and 722*a*, a current-adaptation circuit 723*a*, pMOSs 724*a* and 725*a*, and nMOSs 726*a* and 727*a*, inputs the input signals IP, IPX, IN, and INX, and increases the output amplitudes by an amount which increases with decrease in the power-supply voltage VDDa. The second circuit is constituted by current sources 721*b* and 722*b*, a current-adaptation circuit 723*b*, pMOSs 724*b* and 725*b*, and nMOSs 726*b* and 727*b*, inputs the input signals IP, IPX, IN, and INX, and decreases the output amplitudes by an amount which increases with increase in the power-supply voltage VDDa. The third circuit is constituted by current sources 721*c* and 722*c*, a current-adaptation circuit 723*c*, pMOSs 724*c* and 725*c*, and nMOSs 726*c* and 727*c*, inputs the input signals IBP, IBPX, IBN, and IBNX, and increases the amplitudes of pre-emphasis signals or de-emphasis signals by an amount which increases with decrease in the power-supply voltage VDDa. The fourth circuit is constituted by current sources 721*d* and 722*d*, a current-adaptation circuit 723*d*, pMOSs 724*d* and 725*d*, and nMOSs 726*d* and 727*d*, inputs the input signals IBP, IBPX, IBN, and IBNX, and decreases the amplitudes of the pre-emphasis signals or the de-emphasis signals by an amount which increases with increase in the power-supply voltage VDDa.

The current-adaptation circuits 723*a* and 723*c* can be realized by the circuit as illustrated in FIG. 4 or 14. Further, when the current-adaptation circuits 723*a* and 723*c* are realized by the circuit illustrated in FIG. 24, it is possible to add offset current and therefore finely adjust the output amplitudes.

The current-adaptation circuits 723*b* and 723*d* can be realized by the circuit as illustrated in FIG. 12 or 13. Further, when the current-adaptation circuits 723*b* and 723*d* are realized by the circuit illustrated in FIG. 26 or 27, it is possible to add offset current and therefore finely adjust the output amplitudes.

Since the transmission device 700 according to the fifth embodiment is constructed as above, the transmission device 700 have similar advantages to the transmission device 400 according to the fourth embodiment, and can cope with the functions of pre-emphasis and de-emphasis according to PCI Express.

7. Advantages

As explained above, the transmission devices according to at least one of aforementioned embodiments generate output signals in the driver circuits by resistance division of the power-supply voltage, and correct the amplitudes of the output signals by using current generated according to variations in the power-supply voltage. Therefore, the transmission devices according to at least one of aforementioned embodiments can suppress the variations in the output amplitudes which are caused by the variations in the power-supply voltage when the output signals are generated by resistance division of the power-supply voltage.

8. Variations and Modifications

The foregoing is considered as illustrative only of the principle of aforementioned embodiments. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

Numbers applying embodiments (first, second or third etc.) do not show priorities of the embodiments.

For example, the current-adaptation circuits may be modified as follows.

(i) The decreasing-characteristic generation circuits 130, 130a, and 430 may be constructed so that the gradient in the characteristic curve is inverted by using a current-multiplication circuit (current amplifier) and a current-reduction circuit.

(ii) The decreasing-characteristic generation circuits 130, 130a, and 430 may be constructed by using a differential amplifier.

(iii) The current-adaptation circuits may be constructed so that the power-supply voltage is digitized by an analog-to-digital converter, processed by a digital signal processor, and converted into an analog voltage (or current). In this case, the current-adaptation circuits can realize any current characteristics with respect to the power-supply voltage.

What is claimed is:

1. A transmission device comprising:
a driver unit which generates an output signal having a first amplitude by a resistance division of a power-supply voltage; and
an output-amplitude correction unit which generates first current according to variation in the power-supply voltage, and corrects the first amplitude by using the first current.

2. The transmission device according to claim 1, wherein the output-amplitude correction unit generates the first current which linearly decreases upon increase of the power-supply voltage.

3. The transmission device according to claim 2, wherein the first amplitude increases based on the first current upon decrease of the power-supply voltage.

4. The transmission device according to claim 1, wherein the output-amplitude correction unit generates the first current which linearly increases upon increase of the power-supply voltage.

5. The transmission device according to claim 4, wherein the first amplitude increases upon the increase of the power-supply voltage.

6. The transmission device according to claim 1, wherein the output-amplitude correction unit generates the first current which linearly decreases upon increase of the power-supply voltage when the power-supply voltage is lower than a predetermined voltage, and generates the first current which linearly increases upon the increase of the power-supply voltage when the power-supply voltage is higher than the predetermined voltage.

7. The transmission device according to claim 6, wherein the first amplitude increases upon decrease of the power-supply voltage when the power-supply voltage is lower than the predetermined voltage, and the first amplitude increases upon the decrease of the power-supply voltage when the power-supply voltage is higher than the predetermined voltage.

8. The transmission device according to claim 1, wherein the output signal includes one of a pre-emphasis signal having a second amplitude and a de-emphasis signal having a third amplitude, and the output-amplitude correction unit corrects the second amplitude and the third amplitude with using the first current.

9. The transmission device according to claim 1, wherein the output-amplitude correction unit further generates offset current which is constant and independent from the power-supply voltage.

10. The transmission device according to claim 1, wherein the output-amplitude correction unit comprises,
a first current source which generates the first current,
a first current-adaptation circuit which adapts the first current to variation in the power-supply voltage, and
a first switch circuit which electrically connects or disconnects the first current source and a signal line through which the output signal is transmitted, according to a first input signal which is inputted into the output-amplitude correction unit.

11. The transmission device according to claim 10, wherein the first input signal is a main input signal, the first current source, the first current-adaptation circuit, and the first switch circuit are used for correcting the output signal in correspondence with the main input signal, the output-amplitude correction unit further comprises a second current source, a second current-adaptation circuit, and a second switch circuit for correcting a second amplitude which a pre-emphasis signal has and a third amplitude which a de-emphasis signal has, the second current source generates second current, the second current-adaptation circuit adapts the second current to variation in the power-supply voltage, and the second switch circuit electrically connects or disconnects the second current source and the signal line according to a second input signal which is inputted into the output-amplitude correction unit.

12. The transmission device according to claim 10, wherein the current-adaptation circuit comprises,
a decreasing-characteristic generation circuit which generates second current decreasing with increase in the power-supply voltage, and
a current-multiplication circuit which makes an adjustment of the second current,
wherein the current-adaptation circuit makes the first current source generate the first current so that the first current linearly decreases with increase in the power-supply voltage.

13. The transmission device according to claim 10, wherein the current-adaptation circuit comprises,
a decreasing-characteristic generation circuit which generates second current decreasing with increase in the power-supply voltage, and
a current-multiplication circuit which makes an adjustment of the second current, wherein the current-adaptation circuit makes the first current source generate the first current so that the first current linearly increases with increase in the power-supply voltage.

14. The transmission device according to claim 10, wherein the current-adaptation circuit comprises an increasing-characteristic generation circuit which generates second current increasing with increase in the power-supply voltage, and the current-adaptation circuit makes the first current source generate the first current so that the first current linearly increases with increase in the power-supply voltage.

15. The transmission device according to claim 10, wherein the current-adaptation circuit comprises a current-addition circuit which adds constant current to the first current.

16. The transmission device according to claim 10, wherein the current-adaptation circuit comprises a current-multiplication circuit including a plurality of MOSFETs forming a current-mirror circuit, has a mirror ratio, and makes an adjustment of current according to the mirror ratio.

* * * * *